(12) United States Patent
Takayama

(10) Patent No.: US 11,967,518 B2
(45) Date of Patent: Apr. 23, 2024

(54) SUBSTRATE TREATING APPARATUS AND SUBSTRATE REVERSING METHOD

(71) Applicant: SCREEN Holdings Co., Ltd., Kyoto (JP)

(72) Inventor: Yuichi Takayama, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 17/912,579

(22) PCT Filed: Feb. 8, 2021

(86) PCT No.: PCT/JP2021/004587
§ 371 (c)(1),
(2) Date: Sep. 19, 2022

(87) PCT Pub. No.: WO2021/192662
PCT Pub. Date: Sep. 30, 2021

(65) Prior Publication Data
US 2023/0139557 A1 May 4, 2023

(30) Foreign Application Priority Data
Mar. 26, 2020 (JP) ................................ 2020-056266

(51) Int. Cl.
*H01L 21/683* (2006.01)
*B25J 15/06* (2006.01)

(52) U.S. Cl.
CPC ...... *H01L 21/6838* (2013.01); *B25J 15/0616* (2013.01)

(58) Field of Classification Search
CPC .......................... H01L 21/6838; B25J 15/0616
(Continued)

(56) References Cited

U.S. PATENT DOCUMENTS

2003/0029479 A1 2/2003 Asano ............................. 134/18
2008/0267741 A1 10/2008 Nagasaka et al. ............ 414/217
(Continued)

FOREIGN PATENT DOCUMENTS

JP 2003-59885 A 2/2003
JP 2008-270626 A 11/2008
(Continued)

OTHER PUBLICATIONS

International Search Report dated May 18, 2021 in corresponding PCT International Application No. PCT/JP2021/004587.
(Continued)

*Primary Examiner* — Gerald McClain
(74) *Attorney, Agent, or Firm* — OSTROLENK FABER LLP

(57) ABSTRACT

Disclosed are a substrate treating apparatus and a substrate reversing method. The substrate treating apparatus includes a supporting portion, a transport mechanism, and a reversing mechanism. The transport mechanism includes a first suction portion and a hand driving unit. The reversing mechanism includes a second suction portion and a rotation driving unit. When the transport mechanism transports a substrate to the supporting portion, the first suction portion is located above the substrate and sucks the substrate upward while causing gas to flow along a top face of the substrate, and the hand driving unit moves the first suction portion to the supporting portion. When the reversing mechanism receives the substrate from the supporting portion, the second suction portion is located above the substrate supported by the supporting portion and sucks the substrate upward while causing gas to flow along the top face of the substrate.

9 Claims, 21 Drawing Sheets

(58) Field of Classification Search
USPC .................................................. 414/758–773
See application file for complete search history.

(56) References Cited

U.S. PATENT DOCUMENTS

| | | | | |
|---|---|---|---|---|
| 2009/0070946 A1* | 3/2009 | Tamada | ............ | H01L 21/67051 |
| | | | | 134/1 |
| 2013/0292062 A1* | 11/2013 | Iwashita | ........... | H01L 21/67092 |
| | | | | 414/758 |
| 2016/0279678 A1* | 9/2016 | Yoshitomi | ......... | H01L 21/67051 |
| 2019/0393070 A1* | 12/2019 | Bosboom | .......... | H01L 21/67265 |

FOREIGN PATENT DOCUMENTS

| | | | |
|---|---|---|---|
| JP | 2009-071235 | A | 4/2009 |
| JP | 2009-088304 | A | 4/2009 |
| JP | 2016-186987 | A | 10/2016 |
| JP | 2017-092228 | A | 5/2017 |
| JP | 2018-111146 | A | 7/2018 |
| JP | 2019-129246 | A | 8/2019 |

OTHER PUBLICATIONS

Written Opinion dated May 18, 2021 in corresponding PCT International Application No. PCT/JP2021/004587.

* cited by examiner

FIG. 11(a)
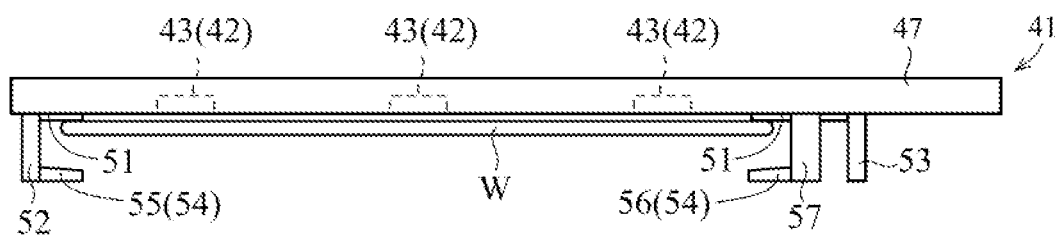
FIG. 11(b)
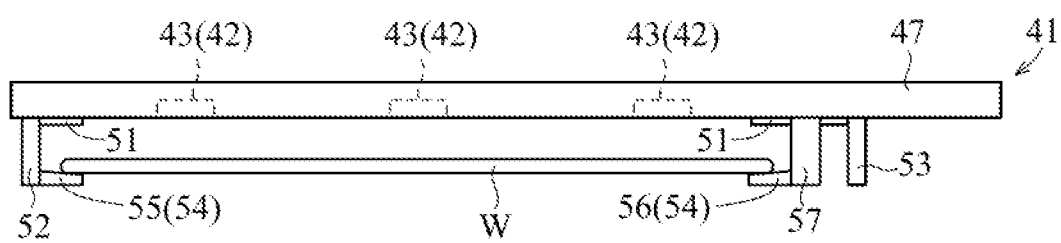
FIG. 11(c)
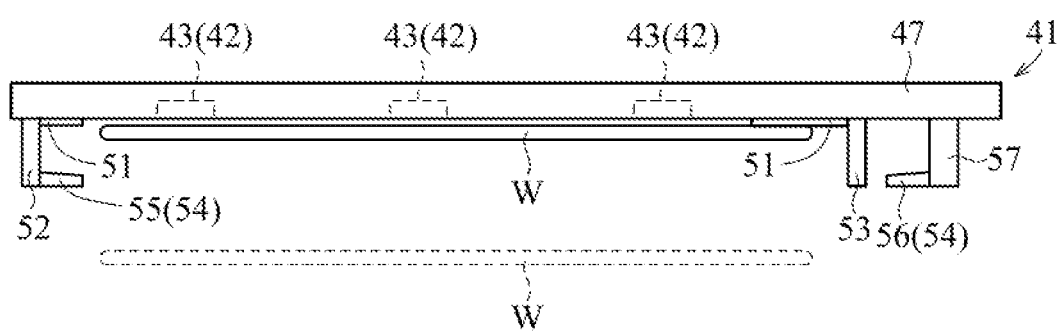
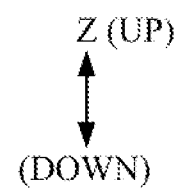

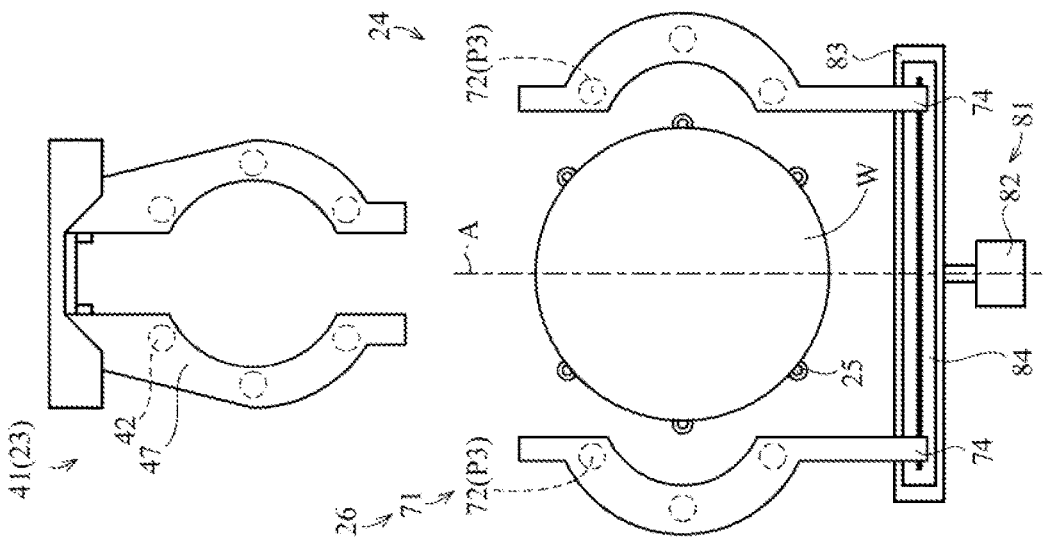
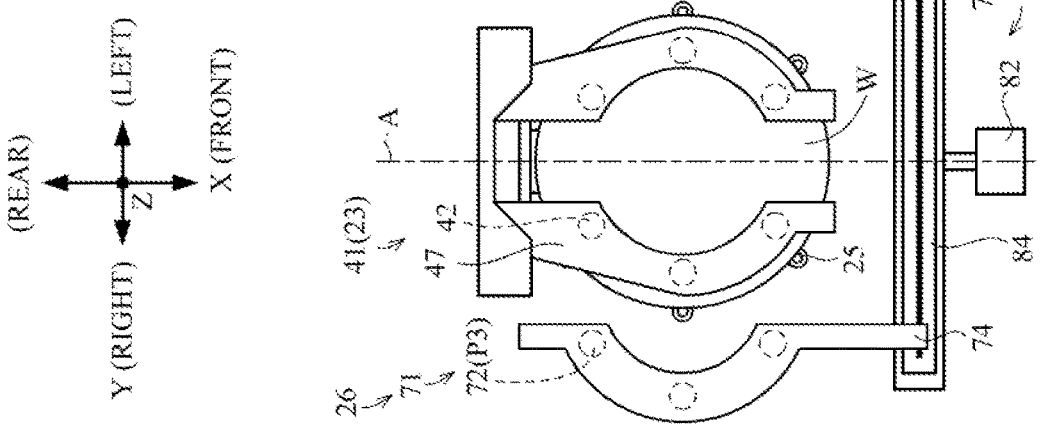
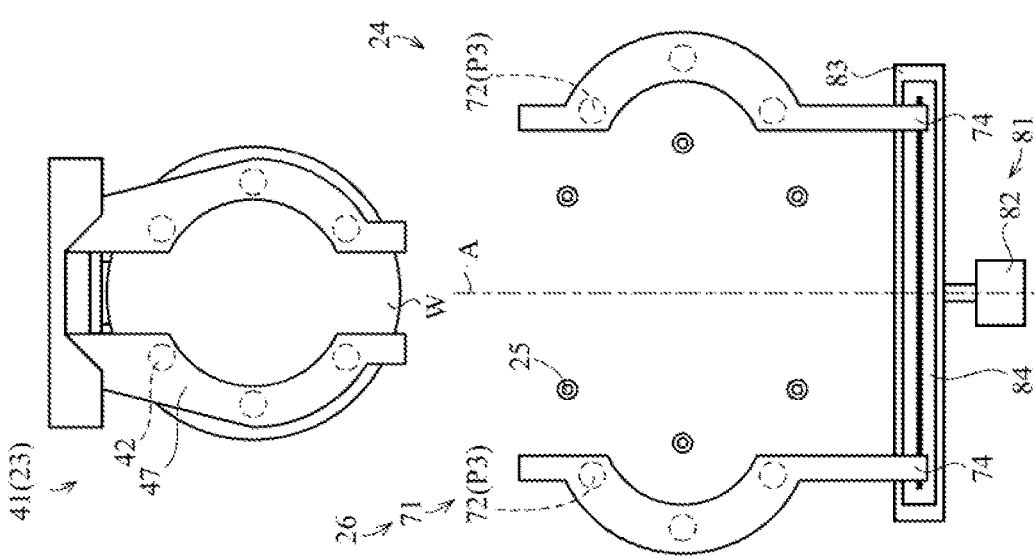

SUBSTRATE TREATING APPARATUS AND SUBSTRATE REVERSING METHOD

CROSS-REFERENCE TO RELATED APPLICATIONS

The present application is a 35 U.S.C. §§ 371 national phase conversion of International Application No. PCT/JP2021/004587, filed Feb. 8, 2021, which claims priority to Japanese Patent Application No. 2020-056266, filed Mar. 26, 2020, the contents of both of which are incorporated herein by reference. The PCT International Application was published in the Japanese language.

TECHNICAL FIELD

The present invention relates to a substrate treating apparatus for treating substrates and a substrate reversing method. Examples of the substrates include a semiconductor wafer, a substrate for liquid crystal display, a substrate for organic electroluminescence (EL), a substrate for flat panel display (FPD), a substrate for optical display, a magnetic disk substrate, an optical disk substrate, a magneto-optical disk substrate, a substrate for photomask, and a solar cell substrate.

DESCRIPTION OF THE RELATED ART

Patent Literature 1 discloses a substrate cleaning apparatus. Hereinunder, numerals in the Patent Literature 1 are expressed in parentheses. The substrate cleaning apparatus includes a reversing unit (18). The reversing unit (18) rotates a substrate (W) around a horizontal axis. The reversing unit (18) reverses the substrate (W).

The reversing unit (18) includes a plurality of support pins (72), a pair of chucks (73), and one rotator (74). The support pins (72) support the substrate (W). The paired chucks (73) contact the substrate (W). The paired chucks (73) grasp an edge of the substrate (W). The rotator (74) supports the paired chucks (73). The rotator (74) rotates the paired chucks (73) around a horizontal rotation axis.

The substrate cleaning apparatus includes a transportation unit (12). The transportation unit (12) transports a substrate (W) to the reversing unit (18). The transportation unit (12) includes a substrate holder (51). The substrate holder (51) contacts the substrate (W). The substrate holder (51) holds the substrate (W).

The reversing unit (18) and the transportation unit (12) operate as under. The substrate holder (51) delivers a substrate (W) to the support pins (72). The paired chucks (73) receive the substrate (W) from the support pins (72). The rotator (74) rotates the paired chucks (73). This causes the substrate (W) to be reversed. The paired chucks (73) deliver the substrate (W) to the support pins (72). The substrate holder (51) receives the substrate (W) from the support pins (72).

PRIOR ART DOCUMENT

Patent Literature

[Patent Literature 1]
Japanese Unexamined Patent Publication No. 2003-59885A

SUMMARY OF THE INVENTION

Technical Problem

In recent years, substrates have become thinner and larger in diameter. A bending amount of a substrate becomes remarkably large as the substrate has a small thickness and a large diameter. Consequently, the currently-used apparatus may have difficulty in reversing a substrate suitably. For example, a substrate may be damaged or broken while the substrate is reversed.

The present invention has been made regarding the state of the art noted above, and its object is to provide a substrate treating apparatus and a substrate reversing method that enable suitable inverse of a substrate.

Solution to Problem

The present invention is constituted as stated below to achieve the above object. One aspect of the present invention provides a substrate treating apparatus, including a supporting portion configured to contact a substrate to support the substrate in a horizontal posture, a transport mechanism configured to transport the substrate to the supporting portion, and a reversing mechanism configured to receive the substrate from the supporting portion, to reverse the substrate, and to deliver the substrate to the supporting portion. The transport mechanism includes a first suction portion configured to suck the substrate without contacting the substrate, and a transport driving unit configured to move the first suction portion, and the reversing mechanism includes a second suction portion configured to suck the substrate without contacting the substrate, and a rotation driving unit configured to rotate the second suction portion around a horizontal rotation axis. When the transport mechanism transports a substrate to the supporting portion, the first suction portion is located above the substrate and sucks the substrate upward while causing gas to flow along a top face of the substrate and the transport driving unit moves the first suction portion to the supporting portion, and when the reversing mechanism receives the substrate from the supporting portion, the second suction portion is located above the substrate supported by the supporting portion and sucks the substrate upward while causing gas to flow along a top face of the substrate.

The first suction portion sucks the substrate without contacting the substrate. Consequently, the transport mechanism can suitably support the substrate. The transport mechanism includes the transport driving unit. Accordingly, the transport mechanism can suitably transport the substrate sucked by the first suction portion.

The second suction portion sucks the substrate without contacting the substrate. Consequently, the reversing mechanism can suitably support the substrate. The reversing mechanism includes the rotation driving unit. Accordingly, the reversing mechanism can suitably reverse the substrate sucked by the second suction portion.

The transport mechanism transports the substrate to the supporting portion, and the reversing mechanism receives the substrate from the supporting portion. In this manner, the reversing mechanism indirectly receives the substrate from the transport mechanism via the supporting portion. The reversing mechanism does not receive the substrate directly from the transport mechanism. Accordingly, the second suction portion can suck the substrate suitably.

The supporting portion supports a substrate in a horizontal posture.

Accordingly, the second suction portion can suck the substrate more suitably.

When the transport mechanism transports a substrate to the supporting portion, the first suction portion is positioned above the substrate. Accordingly, the transport mechanism can deliver the substrate to the supporting portion suitably.

When the reversing mechanism receives the substrate from the supporting portion, the second suction portion is positioned above the substrate supported by the supporting portion. Accordingly, the reversing mechanism can suitably receive the substrate from the supporting portion.

As described above, the substrate treating apparatus according to the aspect of the present invention can reverse the substrate suitably.

It is preferred in the substrate treating apparatus described above that the supporting portion includes a position adjusting unit configured to adjust a position of the substrate in a horizontal direction. The substrate supported by the supporting portion is located at a suitable position. Accordingly, the second suction portion can suitably suck the substrate supported by the supporting portion. The reversing mechanism can suitably receive the substrate from the supporting portion.

It is preferred that in the substrate treating apparatus described above that the position adjusting unit has a slope face that is inclined downward and radially inward of the substrate supported by the supporting portion and contacts the edge of the substrate. The slope face is inclined downward and radially inward of the substrate supported by the supporting portion. The slope face contacts the edge of the substrate. Accordingly, the position adjusting unit can suitably guide the substrate to a suitable position.

It is preferred in the substrate treating apparatus described above that the second suction portion is moved from a position above the substrate to a position below the substrate when the reversing mechanism reverses the substrate, the second suction portion is positioned below the substrate and does not suck the substrate when the reversing mechanism delivers the substrate to the supporting portion, and the second suction portion is at rest from when the reversing mechanism delivers the substrate to the supporting portion until when the supporting portion delivers the substrate to the transport mechanism. When the reversing mechanism reverses the substrate, the second suction portion sucks the substrate and the rotation driving unit rotates the second suction portion around the rotation axis. Accordingly, when the reversing mechanism reverses the substrate, the second suction portion is moved from a position above the substrate to a position below the substrate. Consequently, the reversing mechanism can suitably reverse the substrate. When the reversing mechanism delivers the substrate to the supporting portion, the second suction portion is positioned below the substrate and does not suck the substrate. Accordingly, the reversing mechanism can deliver the substrate to the supporting portion appropriately. The second suction portion does not move from when the reversing mechanism delivers the substrate to the supporting portion until when the supporting portion delivers the substrate to the transport mechanism. Accordingly, the supporting portion can deliver the substrate to the transport mechanism rapidly after the reversing mechanism delivers the substrate to the supporting portion.

It is preferred in the substrate treating apparatus described above that the rotation driving unit moves the second suction portion between a first position where the second suction portion blows gas downward and a second position where the second suction portion blows gas upward by rotating the second suction portion around the rotation axis, the rotation axis is located at a position lower than the second suction portion at the first position, and the second suction portion at the first position is located higher than the second suction portion at the second position. The rotation driving unit moves the second suction portion to the first position by rotating the second suction portion around the rotation axis. When the second suction portion is located at the first position, the second suction portion blows gas downward. Accordingly, when the second suction portion is located at the first position, the second suction portion can suitably suck the substrate located below the second suction portion. The rotation driving unit moves the second suction portion to the second position by rotating the second suction portion around the rotation axis. When the second suction portion is located at the second position, the second suction portion blows gas upward. Accordingly, when the second suction portion is located at the second position, the second suction portion can suitably suck the substrate located above the second suction portion. The rotation axis is located at a position lower than the second suction portion at the first position. Accordingly, the second suction portion at the first position is located at a position higher than the second suction portion at the second position. Consequently, when the second suction portion is located at the first position, the second suction portion can be located above the substrate easily. Accordingly, when the second suction portion is located at the first position, the reversing mechanism can suitably receive the substrate from the supporting portion. On the other hand, the second suction portion at the second position is located at a position lower than the second suction portion at the first position. Consequently, when the second suction portion is located at the second position, the second suction portion can be located below the substrate easily. Accordingly, when the second suction portion is located at the second position, the reversing mechanism can suitably deliver the substrate to the supporting portion.

It is preferred in the substrate treating apparatus described above that the second suction portion is located at the second position and does not suck the substrate when the reversing mechanism delivers the substrate to the supporting portion, and the second suction portion is kept at the second position from when the reversing mechanism delivers the substrate to the supporting portion until when the supporting portion delivers the substrate to the transport mechanism. When the reversing mechanism delivers the substrate to the supporting portion, the second suction portion is located at the second position and does not suck the substrate. Accordingly, the reversing mechanism can deliver the substrate to the supporting portion appropriately. The second suction portion is kept at the second position from when the reversing mechanism delivers the substrate to the supporting portion until when the supporting portion delivers the substrate to the transport mechanism. Accordingly, the supporting portion can deliver the substrate to the transport mechanism rapidly after the reversing mechanism delivers the substrate to the supporting portion.

It is preferred in the substrate treating apparatus described above that the second suction portion is located more radially inward of the substrate, supported by the supporting portion, than the supporting portion in plan view when the second suction portion is located at the second position. When the second suction portion is located at the second position, the second suction portion can suck the substrate more suitably. On the other hand, there needs a relatively long time to retreat the second suction portion from the second position. As described above, however, the second suction portion is kept at the second position from when the reversing mechanism delivers the substrate to the supporting portion until when the supporting portion delivers the substrate to the transport mechanism. Accordingly, this can appropriately suppress delay in timing at which the supporting portion delivers the substrate to the transport mechanism.

It is preferred that the substrate treating apparatus described above further includes a lifting drive unit configured to move the supporting portion between a first support position and a second support position lower than the first support position, and that the second suction portion is located at a position higher than the substrate supported by the supporting portion at the first support position when the second suction portion is located at the first position, and a height position of the substrate sucked by the second suction portion at the second position is lower than a height position of the substrate supported by the supporting portion at the first support position and is higher than a height position of the substrate supported by the supporting portion at the second support position. When the second suction portion is located at the first position, the second suction portion is located higher than the substrate supported by the supporting portion at the first support position. Accordingly, when the second suction portion is located at the first position, the second suction portion can be easily positioned above the substrate supported by the supporting portion at the first support position. Consequently, when the second suction portion is located at the first position, the reversing mechanism can receive the substrate from the supporting portion easily. The height position of the substrate sucked by the second suction portion at the second position is lower than the height position of the substrate supported by the supporting portion at the first support position and higher than the height position of the substrate supported by the supporting portion at the second support position. Accordingly, when the second suction portion is located at the second position, the supporting portion can suitably receive the substrate from the reversing mechanism by moving from the second support position to the first support position. That is, when the second suction portion is located at the second position, the reversing mechanism can suitably deliver the substrate to the supporting portion.

It is preferred in the substrate treating apparatus described above that the supporting portion is located at the first support position when the transport mechanism delivers the substrate to the supporting portion, the supporting portion is located at the first support position when the reversing mechanism receives the substrate from the supporting portion, the supporting portion is located at the second support position when the reversing mechanism reverses the substrate, and the supporting portion is moved from the second support position to the first support position when the reversing mechanism delivers the substrate to the supporting portion. The supporting portion is only located at two positions (specifically, first support position and second support position). This achieves a simplified configuration of the lifting drive unit.

It is preferred in the substrate treating apparatus described above that the reversing mechanism further includes a movement driving unit configured to move the second suction portion from the first position to a third position where no interference is made with the transport mechanism, and that the second suction portion is located at the third position when the transport mechanism delivers the substrate to the supporting portion. This can appropriately prevent interference of the second suction portion with the transport mechanism when the transport mechanism delivers the substrate to the supporting portion.

It is preferred in the substrate treating apparatus described above that the second suction portion is positioned more radially outward of the substrate, supported by the supporting portion, than the supporting portion in plan view when the second suction portion is located at the third position. This can ensure that interference of the second suction portion with the transport mechanism is prevented when the second suction portion is located at the third position.

It is preferred in the substrate treating apparatus described above that the reversing mechanism includes a first branch connected to the movement driving unit and a second branch connected to the movement driving unit, the second suction portion includes a third suction portion held by the first branch and a fourth suction portion held by the second branch, that the movement driving unit widens and narrows a gap between the first branch and the second branch, and the movement driving unit moves the second suction portion from the first position to the third position by widening the gap between the first branch and the second branch. This can appropriately suppress a moving amount of the second suction portion when the second suction portion is moved from the first position to the third position. Accordingly, the movement driving unit can move the second suction portion from the first position to the third position easily.

It is preferred in the substrate treating apparatus described above that the rotation axis is located so as to pass between the first branch and the second branch in plan view when the second suction portion is located at the first position, the first branch and the second branch are each moved away from the rotation axis in plan view when the second suction portion is moved from the first position to the third position, and the first branch and the second branch each approach the rotation axis in plan view when the second suction portion is moved from the third position to the first position. This can suppress a moving amount of the second suction portion more appropriately when the second suction portion is moved between the first position and the third position. Accordingly, the movement driving unit can move the second suction portion between the first position and the third position more easily.

Another aspect of the present invention discloses a substrate reversing method for reversing a substrate, including a transporting step of causing a transport mechanism with a first suction portion to transport the substrate to a supporting portion, a first supporting step of causing the supporting portion to receive the substrate from the transport mechanism and to support the substrate in a horizontal posture, a first taking step of causing a reversing mechanism with a second suction portion to take the substrate from the supporting portion, a reversing step of causing the reversing mechanism to reverse the substrate, and a second supporting step of causing the supporting portion to receive the substrate from the reversing mechanism and to support the substrate in a horizontal posture. In the transporting step, the first suction portion is located above the substrate, and the first suction portion sucks the substrate upward by causing gas to flow over a top face of the substrate and is moved to the supporting portion. In the first taking step, the second suction portion is located at a first position as a position above the substrate supported by the supporting portion, and sucks the substrate upward by causing gas to flow over the top face of the substrate. In the reversing step, the second suction portion is half-rotated around a horizontal rotation axis to be moved from the first position to a second position while the second suction portion sucks the substrate.

In the transporting step, the transport mechanism transports the substrate to the supporting portion. The transport mechanism includes the first suction portion. In the transporting step, the first suction portion is located above the substrate, and sucks the substrate upward while causing gas to flow over the top face of the substrate. Consequently, the transport mechanism can support the substrate appropriately in the transporting step.

In the transporting step, the first suction portion is moved to the supporting portion while sucking the substrate. Accordingly, the transport mechanism can transport the substrate, sucked by the first suction portion, to the supporting portion appropriately in the transporting step.

In the first supporting step, the supporting portion receives the substrate from the transport mechanism. The supporting portion supports the substrate in a horizontal posture. As described above, in the transporting step, the first suction portion is located above the substrate. Accordingly, in the first supporting step, the supporting portion can receive the substrate from the transport mechanism appropriately.

In the first taking step, the reversing mechanism takes the substrate from the supporting portion. The reversing mechanism includes the second suction portion. In the first taking step, the second suction portion is located at the first position. Here, the first position is a position above the substrate supported by the supporting portion. In the first taking step, the second suction portion sucks the substrate upward while causing gas to flow over the top face of the substrate. Accordingly, in the first taking step, the reversing mechanism can take the substrate from the supporting portion suitably.

As described above, in the first supporting step, the supporting portion supports the substrate in a horizontal posture. Accordingly, in the first taking step, the second suction portion can suck the substrate suitably.

As described above, the substrate reversing method includes the first supporting step. Accordingly, the transport mechanism transports the substrate to the supporting portion. The reversing mechanism takes the substrate from the supporting portion. In this manner, the reversing mechanism indirectly receives the substrate from the transport mechanism via the supporting portion. The reversing mechanism does not receive the substrate directly from the transport mechanism. Accordingly, the second suction portion can suck the substrate more suitably. Consequently, in the first taking step, the reversing mechanism can take the substrate from the supporting portion more suitably.

In the reversing step, the reversing mechanism reverses the substrate. Specifically, the second suction portion is half-rotated around the horizontal rotation axis to be moved from the first position to the second position while sucking the substrate. Accordingly, the reversing mechanism can reverse the substrate, sucked by the second suction portion, appropriately in the reversing step.

In the second supporting step, the supporting portion receives the substrate from the reversing mechanism. The supporting portion supports a substrate in a horizontal posture. Here, in the second supporting step, the second suction portion is located at the second position. As described above, the second position is a position where the second suction portion is half-rotated around the horizontal rotation axis from the first position. Accordingly, when the second suction portion is located at the second position, the second suction portion is located below the substrate. Consequently, in the second supporting step, the supporting portion can receive the substrate from the reversing mechanism appropriately.

As described above, the substrate reversing method according to the aspect of the present invention can reverse the substrate suitably.

It is preferred in the substrate reversing method described above that a position of the substrate in a horizontal direction is adjusted in the first supporting step. In the first supporting step, the substrate supported by the supporting portion is located at a suitable position. Accordingly, the second suction portion can suitably suck the substrate supported by the supporting portion in the first taking step.

It is preferred in the substrate reversing method described above that the supporting portion is at rest at a first support position in the first supporting step, the supporting portion is at rest at the first support position in the first taking step, the supporting portion is moved from the first support position to a second support position lower than the first support position in the reversing step, and the supporting portion is moved from the second support position to the first support position in the second supporting step. The supporting portion is at rest at only two positions (specifically, first support position and second support position). This achieves simplified operation of the supporting portion.

It is preferred in the substrate reversing method described above that the second suction portion is located at a position higher than the substrate supported by the supporting portion at the first support position when the second suction portion is located at the first position, a height position of the rotation axis is lower than a height position of the second suction portion at the first position, a height position of the second suction portion at the second position is lower than the height position of the second suction portion at the first position, the height position of the substrate sucked by the second suction portion at the second position is lower than a height position of a substrate supported by the supporting portion at the first support position, and the height position of the substrate sucked by the second suction portion at the second position is higher than a height position of the substrate supported by the supporting portion at the second support position.

When the second suction portion is located at the first position, the second suction portion is located higher than the substrate supported by the supporting portion at the first support position. Accordingly, the second suction portion can suitably suck the substrate supported by the supporting portion at the first support position in the first taking step.

The height position of the rotation axis is lower than the height position of the second suction portion at the first position. Accordingly, the height position of the second suction portion at the second position is lower than the height position of the second suction portion at the first position. That is, the height position of the second suction portion is lowered as the second suction portion is moved from the first position to the second position. Here, the height position of the substrate sucked by the second suction portion at the second position is lower than the height position of the substrate supported by the supporting portion at the first support position and higher than the height position of the substrate supported by the supporting portion at the second support position. Accordingly, the reversing mechanism can deliver the substrate to the supporting portion appropriately in the second supporting step. In the second supporting step, the supporting portion is moved from the second support position to the first support position, thereby achieving appropriate receipt of the substrate from the reversing mechanism.

It is preferred that the substrate reversing method described above further includes a second taking step of causing the transport mechanism to take a substrate from the supporting portion, and the second suction portion is at rest at the second position from the second supporting step to the second taking step. The second taking step can start immediately after the second supporting step.

It is preferred that the substrate reversing method described above further includes a retreating step of causing the second suction portion to move from the second position to a third position where no interference is made with the transport mechanism after the second taking step, and the second suction portion is located at the third position in the first supporting step. The second taking step is performed before the retreating step. Accordingly, the second taking step can be performed at an early timing. In the first supporting step, the second suction portion is located at the third position. This can appropriately prevent interference of the second suction portion with the transport mechanism in the first supporting step.

It is preferred in the substrate reversing method described above that the retreating step further includes a lowering step of causing the supporting portion to move from the first support position to the second support position, a first moving step of causing the second suction portion to rotate around the rotation axis to move from the second position to the first position after the lowering step, a second moving step of causing the second suction portion to move from the first position to the third position after the first moving step, and a raising step of causing the supporting portion to move from the second support position to the first support position after the first moving step. In the retreating step, the second suction portion can move from the second position to the third position appropriately.

Effect of the Invention

The present invention can cause a substrate to be reversed suitably.

BRIEF DESCRIPTION OF THE DRAWINGS

FIGS. 11(a), 11(b), and 11(c) are each a side view of the hand of the transport mechanism.

FIGS. 17(a), 17(b), and 17(c) are each a plan view schematically illustrating an exemplary operation of a transporting step and a first supporting step.

DESCRIPTION OF EMBODIMENTS

The following describes a substrate treating apparatus of the present invention with reference to the drawings.

Figure 1:
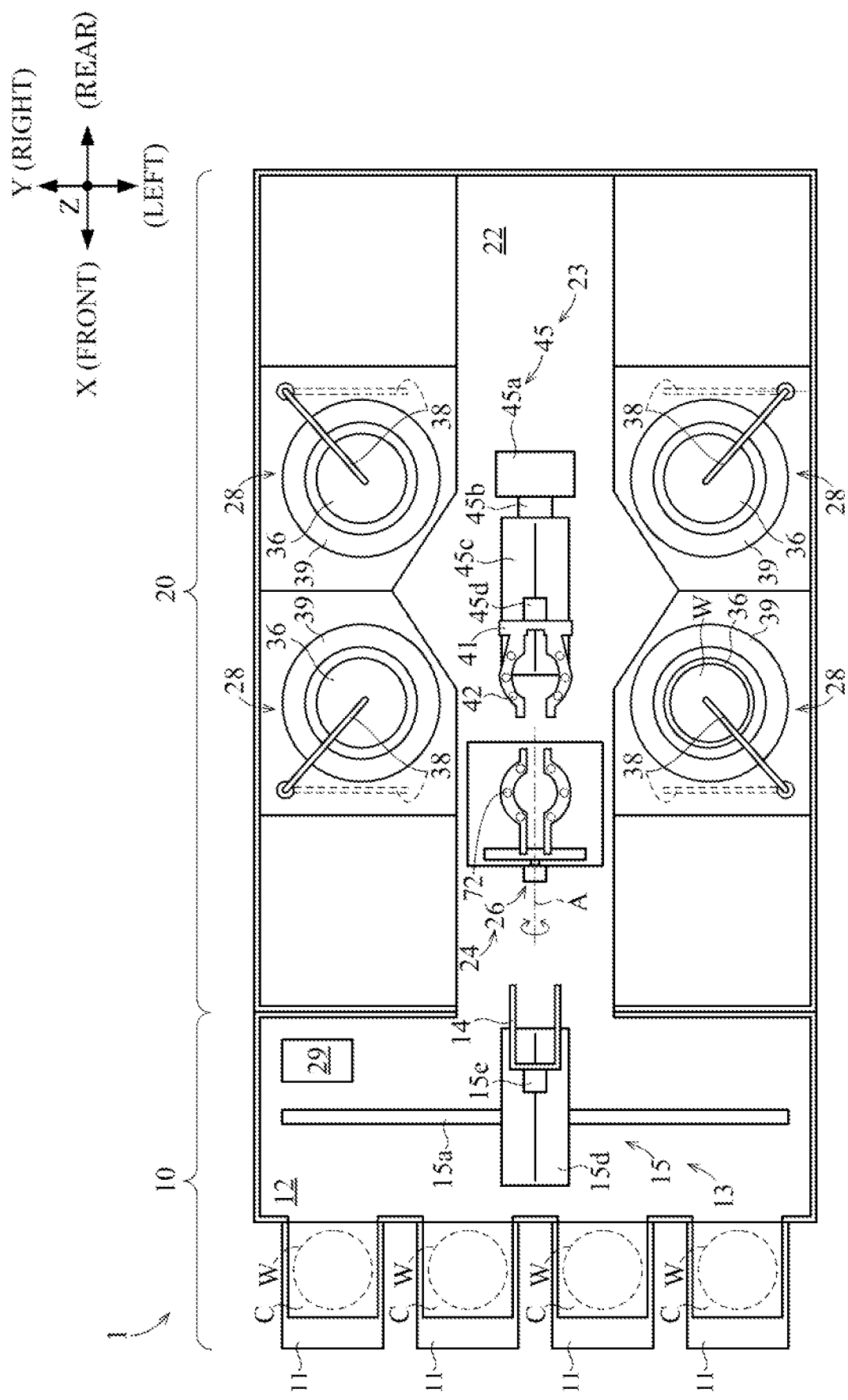
FIG. 1 is a plan view of an interior of a substrate treating apparatus according to one embodiment.

FIG. 1 is a plan view of the substrate treating apparatus according to one embodiment. A substrate treating apparatus 1 performs treatment on a substrate W.

Substrate W

Figure 2A:
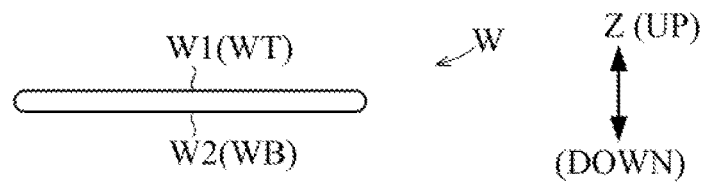
FIG. 2(a) is a side view of a substrate.
Figure 2B:
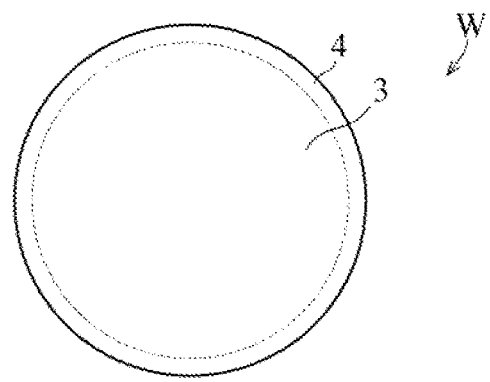
FIG. 2(b) is a plan view of the substrate.

The following firstly describes a substrate W treated by a substrate treating apparatus 1. FIG. 2(a) is a side view of the substrate W. FIG. 2(b) is a plan view of the substrate W. Examples of the substrate W include a semiconductor wafer, a substrate for liquid crystal display, a substrate for organic electroluminescence (EL), a substrate for flat panel display (FPD), a substrate for optical display, a magnetic disk substrate, an optical disk substrate, a magneto-optical disk substrate, a substrate for photomask, and a solar cell substrate.

The following describes a basic shape of the substrate W. The substrate W has a thin flat shape. The substrate W may have a relatively small thickness. The thickness is, for example, 10 μm or more and 200 μm or less. However, the thickness is not limited to 10 μm or more and 200 μm or less. The thickness of the substrate W may be less than 10 μm. The thickness of the substrate W may be more than 200 μm.

The substrate W has a substantially circular shape in plan view. The substrate W may have a relatively large diameter. The diameter is, for example, 300 mm. However, the diameter of the substrate W is not limited to 300 mm. The diameter of the substrate W may be less than 300 mm or more than 300 mm, for example.

The substrates W has a first face W1 and a second face W2. When the substrate W is in a horizontal posture, one of the first face W1 and the second face W2 is directed upward whereas the other of the first face W1 and the second face W2 is directed downward. Here, a face of the substrate W directed upward is referred to as a "top face WT" whereas a face of the substrate W directed downward is referred to as a "back face WB". For example, when the first face W1 corresponds to the top face WT, the second face W2 corresponds to the back face WB. For example, when the substrate W is reversed, the first face W1 changes from the top face WT to the back face WB whereas the second face W2 changes from the back face WB to the top face WT.

The substrate W has a first area 3 where a semiconductor device is formed and a second area 4 where no semiconductor device is formed. The second area 4 is positioned at a periphery edge of the substrate W in plan view. The first area 3 is positioned inside of the second area 4 in plan view. Here, the first area 3 is referred to as a "main part 3". The second area 4 is referred to as a "peripheral part 4".

The following exemplarily describes a detailed shape of the substrate W.

Figure 3A:
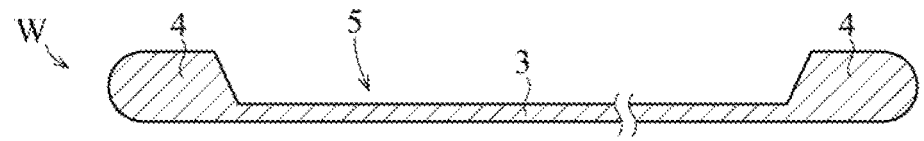
FIGS. 3(a) and 3(b) are each one example illustrating a sectional view of a shape of a substrate W.

As illustrated in FIG. 3(a), the substrate W may a recess 5. FIG. 3(a) is one example illustrating a sectional view of a shape of the substrate W. The recess 5 is formed, for example, by a grinding process. The recess 5 is formed, for example, by making the main part 3 recessed than the peripheral part 4. When a semiconductor device is formed on the main part 3 of the first face W1 and a semiconductor device is not formed on the main part 3 of the second face W2, for example, the recess 5 is formed not on the first face W1 but on the second face W2.

Figure 3B:
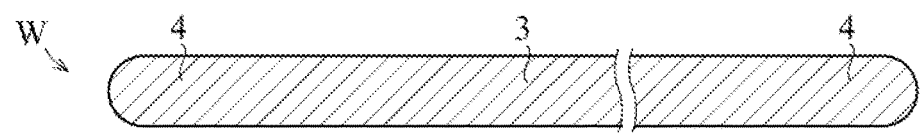

Alternatively, as illustrated in FIG. 3(b), the substrate W does not necessarily have a recess 5. FIG. 3(b) is another example illustrating a sectional view of a shape of the substrate W. The first face W1 and the second face W2 may each be planar over the main part 3 and the peripheral part 4.

The following exemplarily describes a configuration of the substrate W.

Figure 4A:
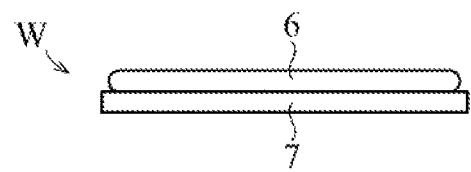
FIGS. 4(a) and 4(b) are each one example illustrating a side view of a configuration of the substrate W.

As illustrated in FIG. 4(a), the substrate W may have a substrate body 6 and a protecting member 7. FIG. 4(a) is one example illustrating a side view of a configuration of the substrate W. A semiconductor device is formed on the substrate body 6. The substrate body 6 is, for example, a silicon wafer. The substrate body 6 may have the recess 5 described above. Alternatively, the substrate body 6 does not necessarily have the recess 5. The protecting member 7 supports and protects the substrate W, for example. A semiconductor device is not formed on the protecting member 7. The protecting member 7 is at least one selected from a plate, a coating, a tape, a sheet, and a film. The material of the protecting member 7 is, for example, glass or resin. The resin is, for example, synthetic resin. The protecting member 7 bonds to the substrate body 6. For example, the protecting member 7 bonds to the substrate body 6 via an adhesive, not shown.

Figure 4B:
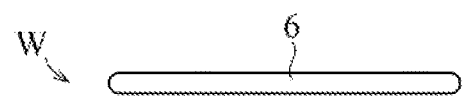

As illustrated in FIG. 4(b), the substrate W may have a substrate body 6 and may not have a protecting member 7. FIG. 4(b) is another example illustrating a side view of a configuration of the substrate W. The substrate W may be a substrate body 6 obtained by separating the protecting member 7 bonded to the substrate body 6, for example. The adhesive used for boding of the substrate body 6 to the protecting member 7 may be attached to the substrate W, for example.

The substrate treating apparatus 1 performs a cleaning treatment to the substrate W described above, for example. The substrate treating apparatus 1 performs a removal treatment of removing the adhesive attached to the substrate W, for example.

Outline of Substrate Treating Apparatus

Reference is made to FIG. 1. An outline of the substrate treating apparatus 1 will now be described.

The substrate treating apparatus 1 includes an indexer 10, and a treating block 20. The treating block 20 is connected to the indexer 10. The indexer 10 and the treating block 20 line up in a horizontal direction. The indexer 10 supplies a substrate W to the treating block 20. The treating block 20 performs a treatment to the substrate W. The indexer 10 collects the substrate W from the treating block 20.

In this specification, the horizontal direction in which the indexer 10 and the treating block 20 are arranged is referred to as a "front-back direction X" for convenience. One direction of the front-back direction X from the treating block 20 to the indexer 10 is referred to as a "forward direction". The direction opposite to the forward direction is referred to as a "rearward direction". A horizontal direction orthogonal to the front-back direction X is referred to as a "traverse direction Y". Moreover, one direction of the transverse direction Y is referred to as a "rightward direction" appropriately. The direction opposite to rightward is referred to as "leftward". A direction perpendicular relative to the horizontal direction is referred to as a "vertical direction Z". When no distinction is particularly made among "forward", "rearward", "rightward", and "leftward", a simple term "lateral" is to be described. For reference, the drawings show front, rear, right, left, up, and down, as appropriate.

The indexer 10 includes a plurality of (e.g., four) carrier platforms 11. The carrier platforms 11 line up in a transverse direction Y. The carrier platforms 11 each include one carrier C placed thereon. The carrier C accommodates a plurality of substrates W. When a substrate W is accommodated in the carrier C, the substrate W is in a horizontal posture. The carrier C is, for example, a front opening unified pod (FOUP).

The indexer 10 includes a transportation space 12. The transportation space 12 is located behind the carrier platforms 11. The transportation space 12 extends in the transverse direction Y.

The indexer 10 includes a transport mechanism 13. The transport mechanism 13 is located in the transportation space 12. The transport mechanism 13 is located behind the carrier platforms 11. The transport mechanism 13 transports a substrate W. When a substrate W is supported by the transport mechanism 13, the substrate W is in a horizontal posture. The transport mechanism 13 is accessible to the carriers C, each placed on the carrier platforms 11.

The treating block 20 includes a transportation space 22. The transportation space 22 extends in the front-back direction X. A front part of the transportation space 22 is in connection with the transportation space 12 of the indexer 10. The transportation space 22 extends rearward from the transportation space 12. The transportation space 22 is located at a central portion of the treating block 20 in the transverse direction Y.

Figure 5:
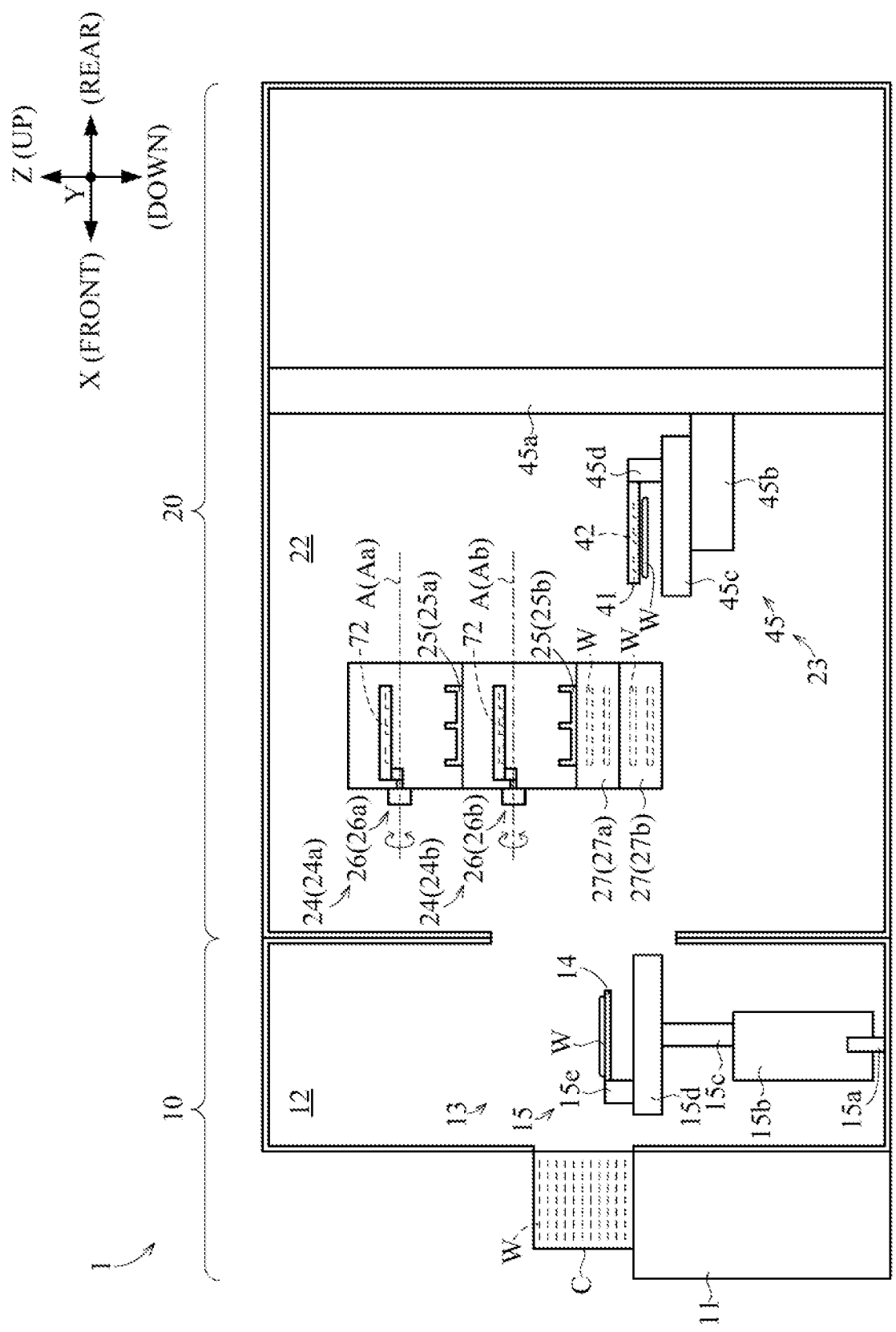
FIG. 5 is a left side view of a central portion of the substrate treating apparatus in a transverse direction.

Reference is made to FIGS. 1 and 5. FIG. 5 is a left side view of a middle portion of the substrate treating apparatus 1 in the transverse direction Y. The treating block 20 includes a transport mechanism 23. The transport mechanism 23 is located in the transportation space 22. The transport mechanism 23 transports a substrate W. When a substrate W is supported by the transport mechanism 23, the substrate W is in a horizontal posture.

The treating block 20 includes a plurality of (e.g., two) inversion units 24. The inversion units 24 are located in the transportation space 22. The inversion units 24 are arranged in a front portion of the transportation space 22. The inversion units 24 are arranged forward of the transport mechanism 23. The inversion units 24 each reverse a substrate W.

The inversion units 24 each have substantially the same configuration. Specifically, the inversion units 24 each include a supporting portion 25. The supporting portion 25 supports a substrate W. When a substrate W is supported by the supporting portion 25, the substrate W is in a horizontal posture.

The inversion unit 24 each include a reversing mechanism 26. The reversing mechanism 26 receives the substrate W from the supporting portion 25. The reversing mechanism 26 reverses the substrate W. The reversing mechanism 26 rotates the substrate W around a horizontal rotation axis A. The reversing mechanism 26 delivers the substrate W to the supporting portion 25.

When a distinction is made among the inversion units 24, they are referred to as inversion units 24a and 24b. The supporting portion 25, the reversing mechanism 26, and the rotation axis A of the inversion unit 24a are referred to as a supporting portion 25a, a reversing mechanism 26a, and a rotation axis Aa, respectively, as appropriate. The supporting portion 25, the reversing mechanism 26, and the rotation axis A of the inversion unit 24b are referred to as a supporting portion 25b, a reversing mechanism 26b, and a rotation axis Ab, respectively, as appropriate.

Reference is made to FIG. 5. The treating block 20 includes a plurality of (e.g., two) substrate platforms 27. The substrate platforms 27 are located in the transportation space 22. The substrate platforms 27 are arranged in the front portion of the transportation space 22. The substrate platforms 27 are located forward of the transport mechanism 23. The substrate platforms 27 are located below the inversion units 24. The substrate platforms 27 place one or more substrates W thereon. When a substrate W is placed on the substrate platform 27, the substrate W is in a horizontal posture.

When a distinction is made among the substrate platforms 27, they are referred to as substrate platforms 27a and 27b.

Figure 6A:
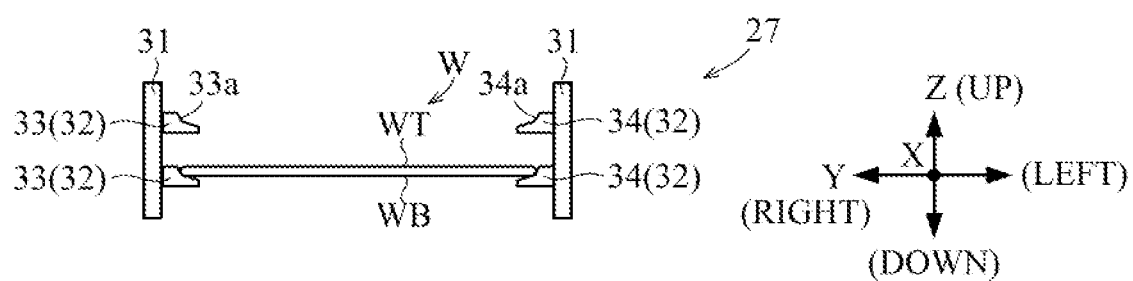
FIG. 6(a) is a front view of a substrate platform.
Figure 6B:
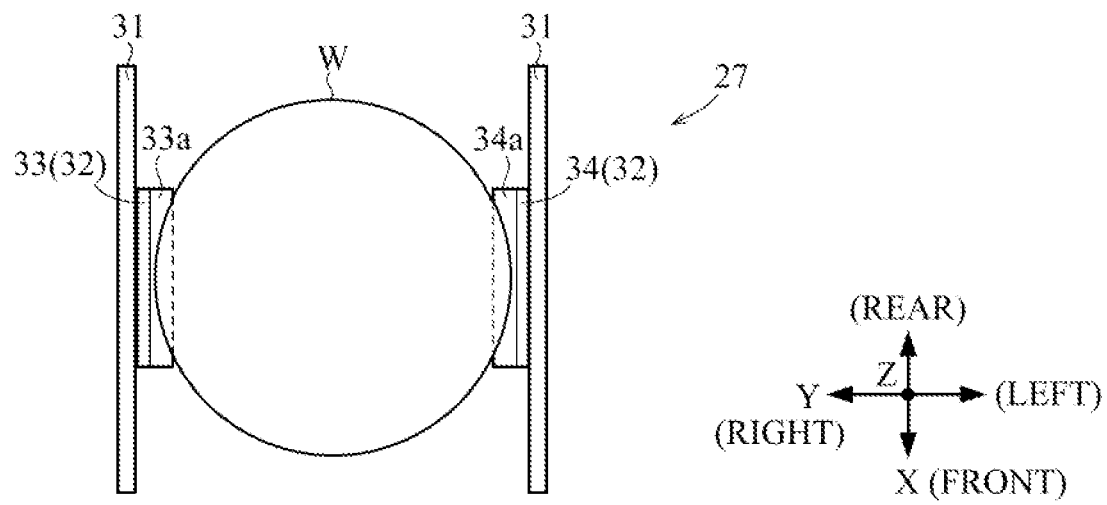
FIG. 6(b) is a plan view of the substrate platform.

FIG. 6(a) is a front view of the substrate platform 27. FIG. 6(b) is a plan view of the substrate platform 27. The substrate platform 27 includes a wall 31 and a plurality of (e.g., two) shelves 32. The shelves 32 are supported by the wall 31. The shelves 32 are arranged to line up in the vertical direction Z. The shelves 32 each support one substrate W in a horizontal posture.

The shelves 32 each includes a first shelf 33 and a second shelf 34. The first shelf 33 and the second shelf 34 are arranged at the same height position. The first shelf 33 and the second shelf 34 line up in the transverse direction Y. The first shelf 33 and the second shelf 34 each extend in horizontal direction (e.g., front-back direction X). The first shelf 33 contacts a first side portion of the substrate W. The second shelf 34 contacts a second side portion of the substrate W.

The shelf 32 also adjust a position of the substrate W in the horizontal direction. Specifically, the first shelf 33 includes a first slope face 33a. The second shelf 34 includes a second slope face 34a. The first slope face 33a and the second slope face 34a each contact an edge of the substrate W. For example, the first slope face 33a and the second slope face 34a are each inclined downward and radially inward of the substrate W supported by the shelf 32. For example, a distance between the first slope face 33a and the second slope face 34a in the horizontal direction decreases downward. The first slope face 33a and the second slope face 34a guide the substrate W to a given position.

Reference is made to FIG. 1. The treating block 20 includes a plurality of treating units 28. The treating units 28 are each adjacent to the transportation space 22. Some of the treating units 28 is located rightward of the transportation space 22. The other treating units 28 are located leftward of the transportation space 22.

Figure 7:
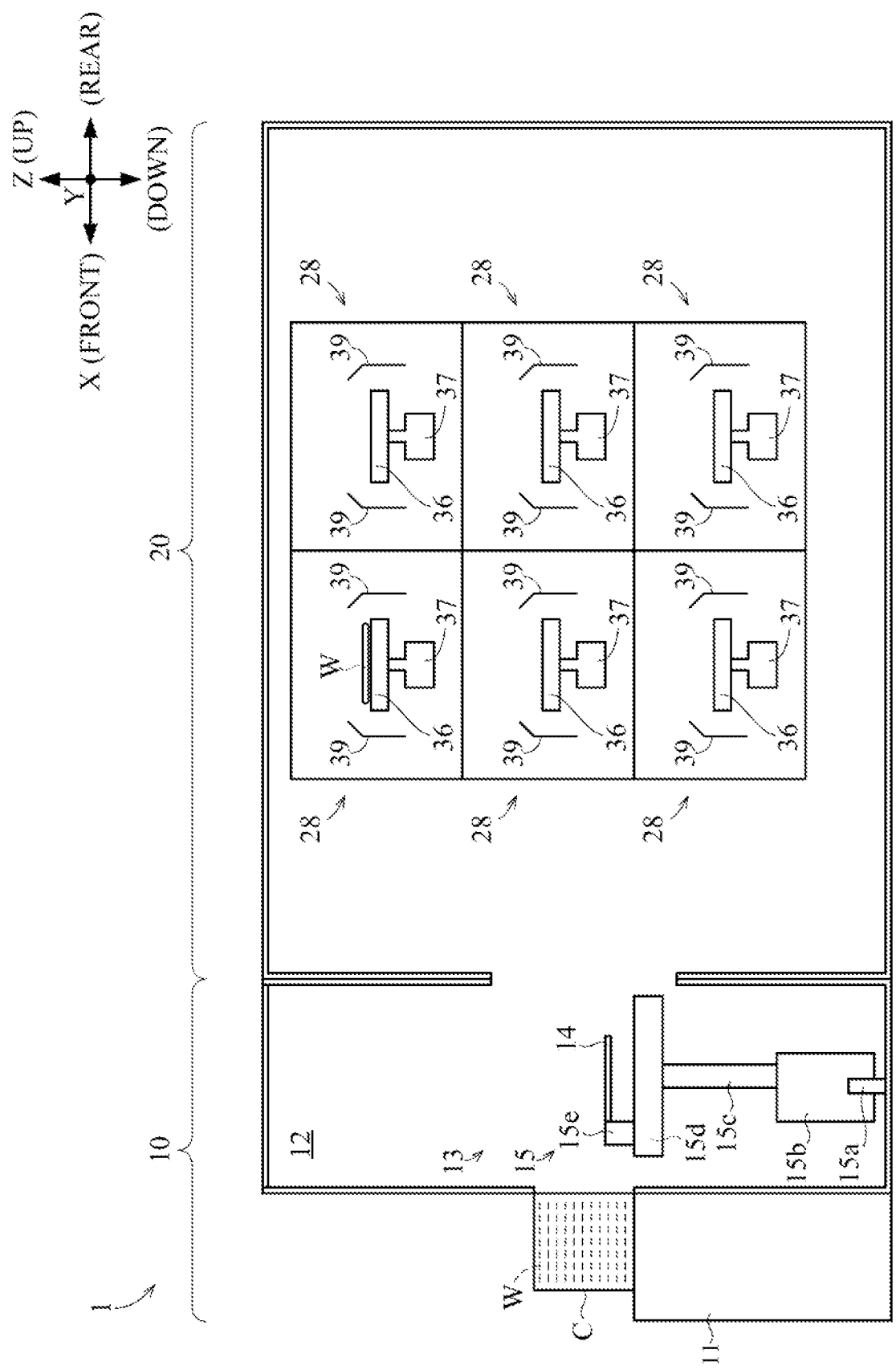
FIG. 7 is a left side view of a left part of the substrate treating apparatus.

FIG. 7 is a left side view of a left part of the substrate treating apparatus 1. FIG. 7 illustrates the treating units 28 located leftward of the transportation space 22. A plurality of treating units 28 line up in the front-back direction X and the vertical direction Z. For example, six treating units 28 are arranged in two rows in the front-back direction X and in three stages in the vertical direction Z. The treating units 28 located rightward of the transportation space 22 are arranged in the same manner that the treating units 28 located leftward of the transportation space 22 are arranged, which illustration is omitted.

The treating units 28 each perform a treatment on a substrate W individually. The treatment performed by the treating units 28 individually may be a cleaning treatment or an adhesive removal treatment, for example. The treating units 28 each perform a treatment to one substrate W at one time. The treating units 28 each treat a top face WT of the substrate W.

The treating unit 28 includes a substrate holder 36 and a rotation driving unit 37. The substrate holder 36 holds one substrate W. When the substrate holder 36 holds a substrate W, the substrate W is in a horizontal posture. The rotation driving unit 37 is connected to the substrate holder 36. The rotation driving unit 37 rotates the substrate holder 36. Thereby, the substrate W held by the substrate holder 36 rotates integrally with the substrate holder 36. The substrate W held by the substrate holder 36 rotates around a rotation axis parallel to the vertical direction Z.

Reference is made to FIG. 1. The treating unit 28 includes a nozzle 38. The nozzle 38 dispenses a treatment liquid to the substrate W. The nozzle 38 dispenses a treatment liquid to the top face WT. The nozzle 38 is provided so as to be movable between a treating position and a retreating position. FIG. 1 illustrates the nozzle 38 at the treating position by solid lines. FIG. 1 illustrates the nozzle 38 at the retreating position by dotted lines. FIG. 1 illustrates one substrate W held by one substrate holder 36. The treating position is a position above the substrate W held by the substrate holder 36. When the nozzle 38 is located at the treating position, the nozzle 38 overlaps the substrate W held by the substrate holder 36 in plan view. When the nozzle 38 is located at the retreating position, the nozzle 38 does not overlap the substrate W held by the substrate holder 36 in plan view.

The treating unit 28 includes a guard 39. The guard 39 is located so as to surround the substrate holder 36 laterally. The guard 39 receives the treatment liquid.

The transport mechanism 23 is accessible to the inversion units 24. The transport mechanism 23 is accessible to the supporting portion 25. The transport mechanism 23 is accessible to the substrate platform 27. The transport mechanism 23 is accessible to the shelf 32. The transport mechanism 23 is accessible to the treating unit 28. The transport mechanism 23 is accessible to the substrate holder 36.

The transport mechanism 13 of the indexer 10 is accessible to the substrate platform 27. On the other hand, the transport mechanism 13 does not access the inversion units 24.

The substrate treating apparatus 1 includes a controller 29. The controller 29 is located in the indexer 10, for example.

Figure 8:
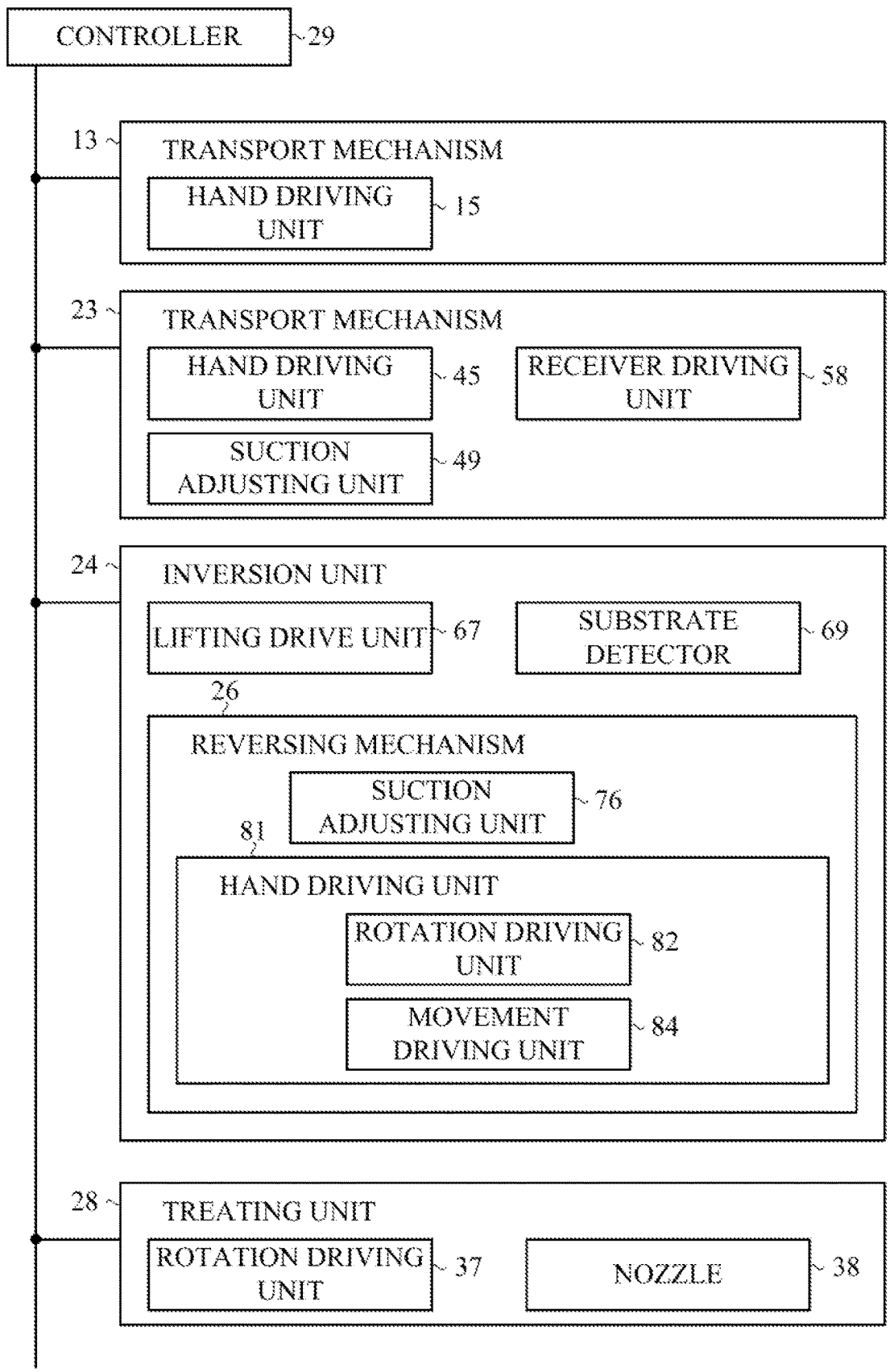
FIG. 8 is a control block diagram of the substrate treating apparatus.

FIG. 8 is a control block diagram of the substrate treating apparatus 1. The controller 29 controls the transport mechanisms 13 and 23, the inversion units 24, and the treating units 28. The controller 29 is communicably connected to the transport mechanisms 13 and 23, the inversion units 24, and the treating units 28.

The controller 29 is implemented by a central processing unit (CPU) that performs various processes, a random-access memory (RAM) as a workspace of arithmetic processing, and a storage medium such as a fixed disk. The storage medium stores various kinds of information in advance. The information stored in the storage medium is, for example, information about operating conditions of the transport mechanisms 13 and 23, the inversion units 24, and the treating units 28. The information stored in the storage medium is, for example, information to identify each of the substrates W.

Figure 9:
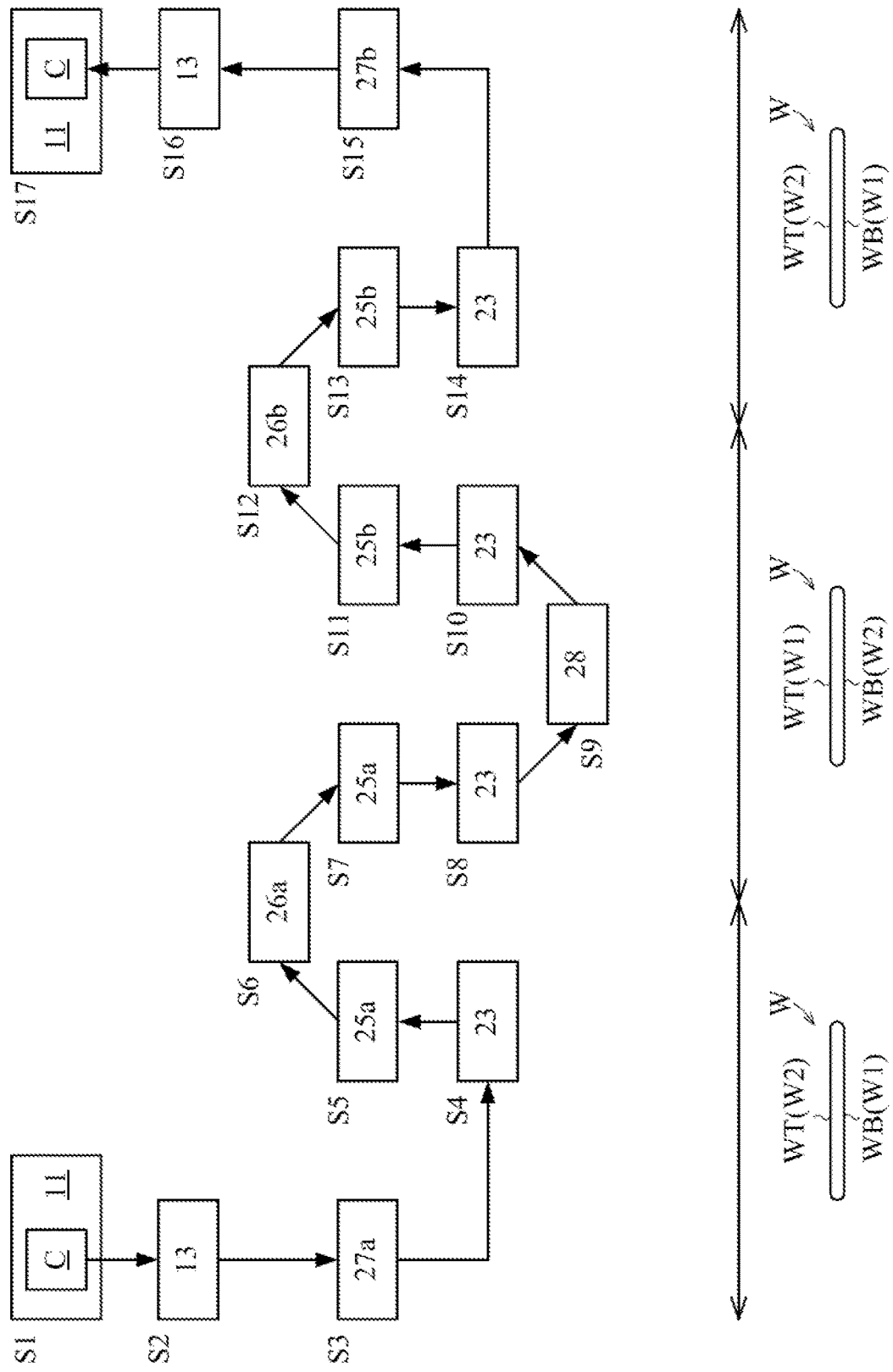
FIG. 9 schematically illustrates procedures of transporting one substrate.

The following describes one exemplary operation of the substrate treating apparatus 1 with reference to FIG. 9. FIG. 9 schematically illustrates procedures of transporting one substrate W. FIG. 9 schematically illustrates elements of the substrate treating apparatus 1 where the substrate passes.

It is assumed in the present exemplary operation that the elements of the substrate treating apparatus 1 each operate under control by the controller 29. It is assumed that the first face W1 corresponds to the back face WB in the carrier C on the carrier platform 11. Briefly on the present exemplary operation, the substrate treating apparatus 1 performs treatment on the first face W1. The following describes the present exemplary operation.

A carrier C where substrates W are accommodated is placed on the carrier platform 11 (Step S1). The transport mechanism 13 unloads a substrate W from the carrier C on the carrier platform 11 (Step S2). The transport mechanism 13 transports the substrate W to the substrate platform 27a (Step S3). The transport mechanism 13 places the substrate W on the shelf 32 of the substrate platform 27a. The shelf 32 of the substrate platform 27a adjusts a position of the substrate W in the horizontal direction. The transport mechanism 23 receives the substrate W from the substrate platform 27a (Step S4). The transport mechanism 23 takes the substrate W from the shelf 32 of the substrate platform 27a. The transport mechanism 23 transports the substrate W to the inversion unit 24a. The transport mechanism 23 transports the substrate W to the supporting portion 25a (Step S5). The transport mechanism 23 delivers the substrate W to the supporting portion 25a. The supporting portion 25a supports the substrate W. The reversing mechanism 26a receives the substrate W from the supporting portion 25a (Step S6). The first face W1 corresponds to the back face WB from when the carriers C is placed on the carrier platform 11 until when the reversing mechanism 26a receives the substrate W from the supporting portion 25a.

The reversing mechanism 26a reverses the substrate W around a rotation axis Aa. The first face W1 changes from the back face WB to the top face WT.

The reversing mechanism 26a delivers the substrate W to the supporting portion 25a (Step S7). The supporting portion 25a supports the substrate W. The transport mechanism 23 receives the substrate W from the supporting portion 25a (Step S8). The transport mechanism 23 unloads the substrate W from the inversion unit 24a. The transport mechanism 23 transports the substrate W to the treating unit 28 (Step S9). The transport mechanism 23 places the substrate W on the substrate holder 36. The treating unit 28 performs a treatment on the substrate W. Specifically, the treating unit 28 supplies a treatment liquid to the top face WT of the substrate W held by the substrate holder 36 while rotating the substrate W held by the substrate holder 36. The transport mechanism 23 takes the substrate W from the substrate holder 36 (Step S10). The transport mechanism 23 unloads the substrate W from the treating unit 28. The transport mechanism 23 transports the substrate W to the inversion unit 24b. The transport mechanism 23 transports the substrate W to the supporting portion 25b (Step S11). The transport mechanism 23 delivers the substrate W to the supporting portion 25b. The supporting portion 25b supports the substrate W. The reversing mechanism 26b receives the substrate W from the supporting portion 25b (Step S12). The first face W1 of the substrate W corresponds to the top face WT from when the reversing mechanism 26a delivers the substrate W to the supporting portion 25a until when the reversing mechanism 26b receives the substrate W from the supporting portion 25b.

The reversing mechanism 26b reverses the substrate W around a rotation axis Ab. The first face W1 of the substrate W changes from the top face WT to the back face WB.

The reversing mechanism 26b delivers the substrate W to the supporting portion 25b (Step S13). The supporting portion 25b supports the substrate W. The transport mechanism 23 receives the substrate W from the supporting portion 25b (Step S14). The transport mechanism 23 unloads the substrate W from the inversion unit 24b. The transport mechanism 23 delivers the substrate W to the substrate platform 27b (Step S15). The transport mechanism 23 places the substrate W on the shelf 32 of the substrate platform 27b. The shelf 32 of the substrate platform 27b adjusts a position of the substrate W in the horizontal direction. The transport mechanism 13 receives the substrate W from the substrate platform 27b (Step S16). The transport mechanism 13 takes the substrate W from the shelf 32 of the substrate platform 27b. The transport mechanism 13 loads the substrate W to the carrier C on the carrier platform 11 (Step S17). The first face W1 of the substrate W corresponds to the back face WB from when the reversing mechanism 26b delivers the substrate W to the supporting portion 25b until when the transport mechanism 13 loads the substrate W to the carrier C.

The following describes a configuration of the substrate treating apparatus 1 in more detail.

Indexer 10

The following describes a configuration of the transport mechanism 13.

Reference is made to FIG. 1. The transport mechanism 13 includes a hand 14. The hand 14 has a substantial U-shape in plan view, for example. The hand 14 supports one substrate W in a horizontal posture.

FIG. 5 illustrates a substrate W supported by the hand 14. The hand 14 is located below the substrate W. The hand 14 contacts the substrate W. The hand 14 does not suck the substrate W.

The transport mechanism 13 includes a hand driving unit 15. The hand driving unit 15 is connected to the hand 14. The hand driving unit 15 moves the hand 14. The hand driving unit 15 moves the hand 14 to the carrier C on the carrier platform 11. The hand driving unit 15 moves the hand 14 to the substrate platform 27.

The following describes a configuration of the hand driving unit 15. The hand driving unit 15 includes a rail 15a, a horizontally moving portion 15b, a vertically moving portion 15c, a rotator 15d, and an advancing/retreating portion 15e. The rail 15a is fixedly installed. The rail 15a is located at a bottom of the transportation space 12. The rail 15a extends in the transverse direction Y. The horizontally moving portion 15b is supported by the rail 15a. The horizontally moving portion 15b moves in the transverse direction Y with respect to the rail 15a. The vertically moving portion 15c is supported by the horizontally moving portion 15b. The vertically moving portion 15c moves in the vertical direction Z with respect to the horizontally moving portion 15b. The rotator 15d is supported by the vertically moving portion 15c. The rotator 15d rotates with respect to the vertically moving portion 15c. The rotator 15d rotates around a rotation axis that passes the rotator 15d and is parallel to the vertical direction Z. The advancing/retreating portion 15e moves in the horizontal direction with respect to the rotator 15d. The advancing/retreating portion 15e reciprocates in a horizontal direction defined by orientation of the rotator 15d. The advancing/retreating portion 15e supports the hand 14. The hand 14 is fixed to the advancing/retreating portion 15e.

The hand driving unit 15 with such a configuration described above can translate the hand 14 in the vertical direction Z. The hand 14 can translate in any horizontal direction. The hand 14 is rotatable in a horizontal plane.

Reference is made to FIG. 8. The controller 29 controls the hand driving unit 15 of the transport mechanism 13. The controller 29 is communicatively connected to the hand driving unit 15.

Treating Block 20

The following describes a configuration of the transport mechanism 23 and the inversion unit 24.

<Transport Mechanism 23>

Reference is made to FIGS. 1 and 5. The transport mechanism 23 includes a hand 41. The hand 41 holds one substrate W in a horizontal posture.

The hand 41 includes a first suction portion 42. The first suction portion 42 sucks a substrate W. The hand 41 is referred to as a Bernoulli chuck, or a Bernoulli gripper.

FIG. 5 illustrates a substrate W sucked by the first suction portion 42. The first suction portion 42 is located above the substrate W. The first suction portion 42 sucks the substrate W upward.

More specifically, when the first suction portion 42 sucks the substrate W, the first suction portion 42 blows gas to the substrate W from a position above the substrate W. The first suction portion 42 causes gas to flow over the top face WT. Gas flows over the top face WT, whereby the air pressure on the top face WT is less than the air pressure on the back face WB. That is, gas flows over the top face WT, whereby negative pressure is formed in the vicinity of the top face WT. In accordance with the Bernoulli's principle, an upward force acts on the substrate W. This causes the substrate W to be sucked upward. The substrate W is sucked toward the first suction portion 42. However, the first suction portion 42 does not contact the substrate W sucked by the first suction portion 42. The first suction portion 42 is spaced apart from the top face WT by a small gap. In such a manner as above, the first suction portion 42 sucks the substrate W without contacting the substrate W.

Reference is made to FIGS. 1 and 5. The transport mechanism 23 includes a hand driving unit 45. The hand driving unit 45 is connected to the hand 41. The hand driving unit 45 moves the hand 41. That is, the hand driving unit 45 moves the first suction portion 42. The hand driving unit 45 moves the hand 41 to the inversion unit 24, the substrate platform 27, and the treating unit 28.

The following describes a configuration of the hand driving unit 45. The hand driving unit 45 includes a strut 45a, a vertically moving portion 45b, a rotator 45c, and an advancing/retreating portion 45d. The strut 45a is fixedly located. The strut 45a extends in the vertical direction Z. The vertically moving portion 45b is supported by the strut 45a. The vertically moving portion 45b moves in the vertical direction Z with respect to the strut 45a. The rotator 45c is supported by the vertically moving portion 45b. The rotator 45c rotates with respect to the vertically moving portion 45b. The rotator 45c rotates around a rotation axis that passes the rotator 45c and is parallel to the vertical direction Z. The advancing/retreating portion 45d moves in the horizontal direction with respect to the rotator 45c. The advancing/retreating portion 45d reciprocates in a horizontal direction defined by orientation of the rotator 45c. The advancing/retreating portion 45d supports the hand 41.

The hand driving unit 45 with such a configuration described above can translate the hand 41 in the vertical direction Z. The hand 41 can translate in any horizontal direction. The hand 41 is rotatable in a horizontal plane.

The hand driving unit 45 is one example of the transport driving unit in the present invention. The transport mechanism 23 is one example of the transport mechanism in the present invention.

Figure 10:
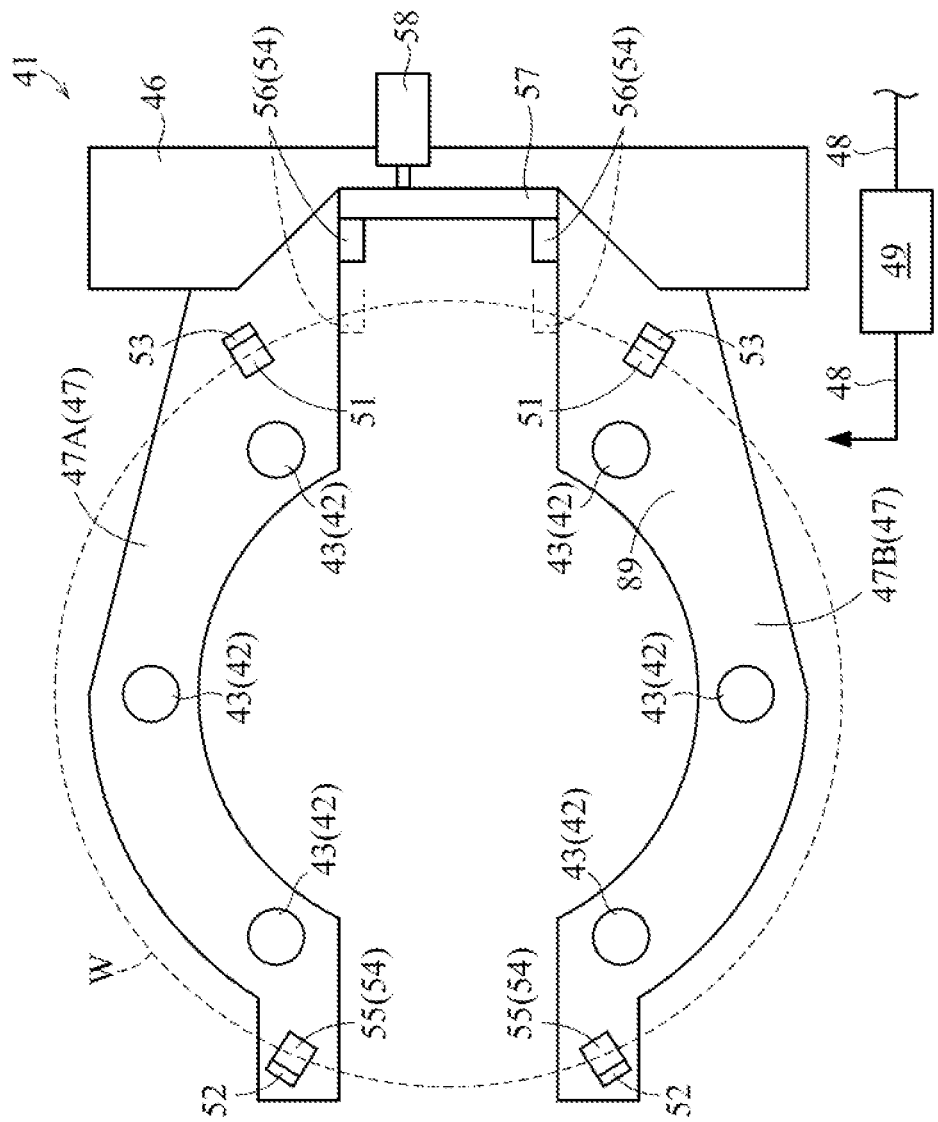
FIG. 10 is a bottom view of a hand of a transport mechanism.

FIG. 10 is a bottom view of the hand 41. FIGS. 11(a), 11(b), and 11(c) are each a side view of the hand 41. The following describes a configuration of the hand 41.

The hand 41 includes a connecting portion 46. The connecting portion 46 is fixed to the advancing/retreating portion 45d.

The hand 41 includes a suction holder 47. The suction holder 47 is fixed to the connecting portion 46. The suction holder 47 extends in the horizontal direction from the connecting portion 46. The suction holder 47 holds the first suction portion 42.

The suction holder 47 includes two branches 47A and 47B, for example. The branches 47A and 47B are arranged at substantially the same height position.

The first suction portion 42 includes a plurality of (e.g., six) suction pads 43. For example, three suction pads 43 are attached to the branch 47A. The other three suction pads 43 are attached to the branch 47B.

The suction pads 43 are each located to be dispersed over the substrate W sucked by the first suction portion 42 in plan view. FIG. 10 illustrates the substrate W sucked by the first suction portion 42 by dotted lines. FIG. 11(a) illustrates the substrate W sucked by the first suction portion 42 by solid lines.

The suction pads 43 each blow gas. Each of the suction pads 43 has a cylindrical shape with a central axis that is parallel to the vertical direction Z. The suction pad 43 has a lower portion that is open downward. The suction pad 43 blows gas downward from a lower portion thereof. The suction pad 43 may form a swirling flow when the suction pad 43 blows gas. The suction pad 43 may discharge a swirling flow downward. Here, the swirling flow is an air flow that swirls inside the suction pad 43 about the central axis of the suction pad 43, for example.

The transport mechanism 23 includes a gas feed channel 48. The gas feed channel 48 is connected in communication with the first suction portion 42. The gas feed channel 48 is connected in communication with each of the suction pads 43. The gas feed channel 48 supplies gas to the first suction portion 42. The first suction portion 42 blows gas supplied from the gas feed channel 48. The gas supplied to the first suction portion 42 is, for example, a nitrogen gas or air. The gas supplied to the first suction portion 42 is, for example, a high-pressure gas or a compressed gas.

The transport mechanism 23 includes a suction adjusting unit 49. The suction adjusting unit 49 is provided on the gas feed channel 48. The suction adjusting unit 49 opens and closes the gas feed channel 48. When the suction adjusting unit 49 opens the gas feed channel 48, the gas feed channel 48 supplies gas to the first suction portion 42. When the suction adjusting unit 49 closes the gas feed channel 48, the gas feed channel 48 does not supply gas to the first suction portion 42. Moreover, the suction adjusting unit 49 may change a flow rate of gas that the gas feed channel 48 supplies to the first suction portion 42. For example, the suction adjusting unit 49 may adjust a channel sectional area of the gas feed channel 48. The suction adjusting unit 49 includes one or more valves, for example. The suction adjusting unit 49 includes at least either an on-off valve or a flow rate regulating valve, for example.

The hand 41 includes a contact portion 51. The contact portion 51 is fixed to the suction holder 47. The contact portion 51 is located at a position overlapping the substrate W sucked by the first suction portion 42 in plan view. The contact portion 51 is positioned lower than the first suction portion 42. When the first suction portion 42 sucks the substrate W, the contact portion 51 contacts the top face WT of the substrate W. The contact portion 51 contacts the top face WT, thereby suppressing horizontal movement of the substrate W with respect to the first suction portion 42. That is, when the first suction portion 42 sucks the substrate W, the contact portion 51 keeps the substrate W at a suitable position with respect to the first suction portion 42.

The hand 41 includes walls 52 and 53. The walls 52 and 53 are fixed to the suction holder 47. The walls 52 and 53 are located radially outward of the substrate W sucked by the first suction portion 42 in plan view. The walls 52 and 53 are located at a height position substantially same as that of the substrate W sucked by the first suction portion 42. The walls 52 and 53 extend in the vertical direction Z. The walls 52 and 53 extend downward from the suction holder 47. When the substrate W is located at a suitable position with respect to the first suction portion 42, the walls 52 and 53 do not contact the substrate W. When the substrate W moves excessively in the horizontal direction with respect to the first suction portion 42, the walls 52 and 53 contact the edge of the substrate W. Thereby, the walls 52 and 53 controls excessive displacement of the substrate W in the horizontal direction with respect to the first suction portion 42.

The hand 41 includes a receiver 54. The receiver 54 is located at a position lower than the substrate W sucked by the first suction portion 42.

The receiver 54 is located at a drop-preventing position. FIGS. 11(a) and 11(b) each illustrate a receiver 54 at the drop-preventing position.

When the receiver 54 is located at the drop-preventing position, the receiver 54 overlaps the substrate W sucked by the first suction portion 42 in plan view. For example, when the receiver 54 is located at the drop-preventing position, the receiver 54 overlaps a peripheral edge of the substrate W sucked by the first suction portion 42 in plan view. When the receiver 54 is located at the drop-preventing position, the receiver 54 can receive the substrate W. When the receiver 54 is located at the drop-preventing position, the receiver 54 prevents the substrate W from falling off the hand 41.

FIG. 11(b) illustrates the substrate W received by the receiver 54. When the receiver 54 receives the substrate W, the substrate W is in a horizontal posture.

When the receiver 54 receives the substrate W, the receiver 54 contacts at least either the back face WB of the substrate W or the edge of the substrate W. When the receiver 54 receiving the substrate W, the receiver 54 allows the substrate W to move upward with respect to the receiver 54.

The receiver 54 is movable to the retreating position. FIG. 11(c) illustrates a receiver 54 at the retreating position.

When the receiver 54 is located at the retreating position, the substrate W can move through the receiver 54 in the vertical direction Z. Accordingly, the substrate W can easily move, below the first suction portion 42, between a position higher than the receiver 54 and a position lower than the receiver 54. FIG. 11(c) illustrates a substrate W that is located below the first suction portion 42 and at a position higher than the receiver 54 by solid lines. FIG. 11(c) illustrates a substrate W that is located below the first suction portion 42 and at a position lower than the receiver 54 by dotted lines. Accordingly, when the receiver 54 is located at the retreating position, the first suction portion 42 can approach or move away from the substrate W easily.

The following describes a structure of the receiver 54. The receiver 54 includes a first receiver 55 and a second receiver 56. The first receiver 55 and a second receiver 56 are each located at a position lower than the substrate W sucked by the first suction portion 42. The first receiver 55 is located at a height position substantially equal to that of the second receiver 56. The first receiver 55 and the second receiver 56 are spaced apart from each other in the horizontal direction. The first receiver 55 and the second receiver 56 can approach and move away from each other in the horizontal direction. When the receiver 54 moves from the retreating position to the drop-preventing position, the first receiver 55 and the second receiver 56 approach each other, and a distance between the first receiver 55 and the second receiver 56 in the horizontal direction becomes small. When the second receiver 56 moves from the drop-preventing position to the retreating position, the first receiver 55 and the second receiver 56 move far away from each other, and the distance between the first receiver 55 and the second receiver 56 in the horizontal direction becomes large.

In the embodiment described above, the first receiver 55 is fixed to the suction holder 47. Specifically, the first receiver 55 is fixed to a lower part of the wall 52. The first receiver 55 extends from the wall 52 radially inward of the substrate W sucked by the first suction portion 42. The second receiver 56 is movable in the horizontal direction with respect to the suction holder 47. FIG. 10 illustrates the second receiver 56 by solid lines when the receiver 54 is located at the retreating position. FIG. 10 illustrates the second receiver 56 by dotted lines when the receiver 54 is located at the drop-preventing position.

The hand 41 includes a stay 57 and a receiver driving unit 58. The stay 57 supports the second receiver 56. The second receiver 56 is fixed to the stay 57. The second receiver 56 extends from the stay 57 radially inward of the substrate W sucked by the first suction portion 42. The receiver driving unit 58 is connected to the stay 57. The receiver driving unit 58 is supported by the connecting portion 46 or the suction holder 47. The receiver driving unit 58 moves the stay 57 with respect to the suction holder 47. The receiver driving unit 58 moves the stay 57 in the horizontal direction. The second receiver 56 moves integrally with the stay 57. When the stay 57 moves with respect to the suction holder 47, the second receiver 56 moves with respect to the first receiver 55. In such a manner as above, the receiver driving unit 58 moves the second receiver 56 with respect to the first receiver 55. The receiver driving unit 58 moves the receiver 54 to the drop-preventing position and the retreating position. The receiver driving unit 58 is, for example, at least either an air cylinder or an electric motor, for example.

The stay 57 is located at substantially the same height position as those of the walls 52 and 53. That is, the stay 57 is located at a height position substantially same as that of the substrate W sucked by the first suction portion 42. The stay 57 extends in the vertical direction Z. The stay 57 has the same function as that of the walls 52 and 53. The stay 57 controls excessive displacement of the substrate W in the horizontal direction with respect to the first suction portion 42.

<Inversion Unit 24>

Figure 12:
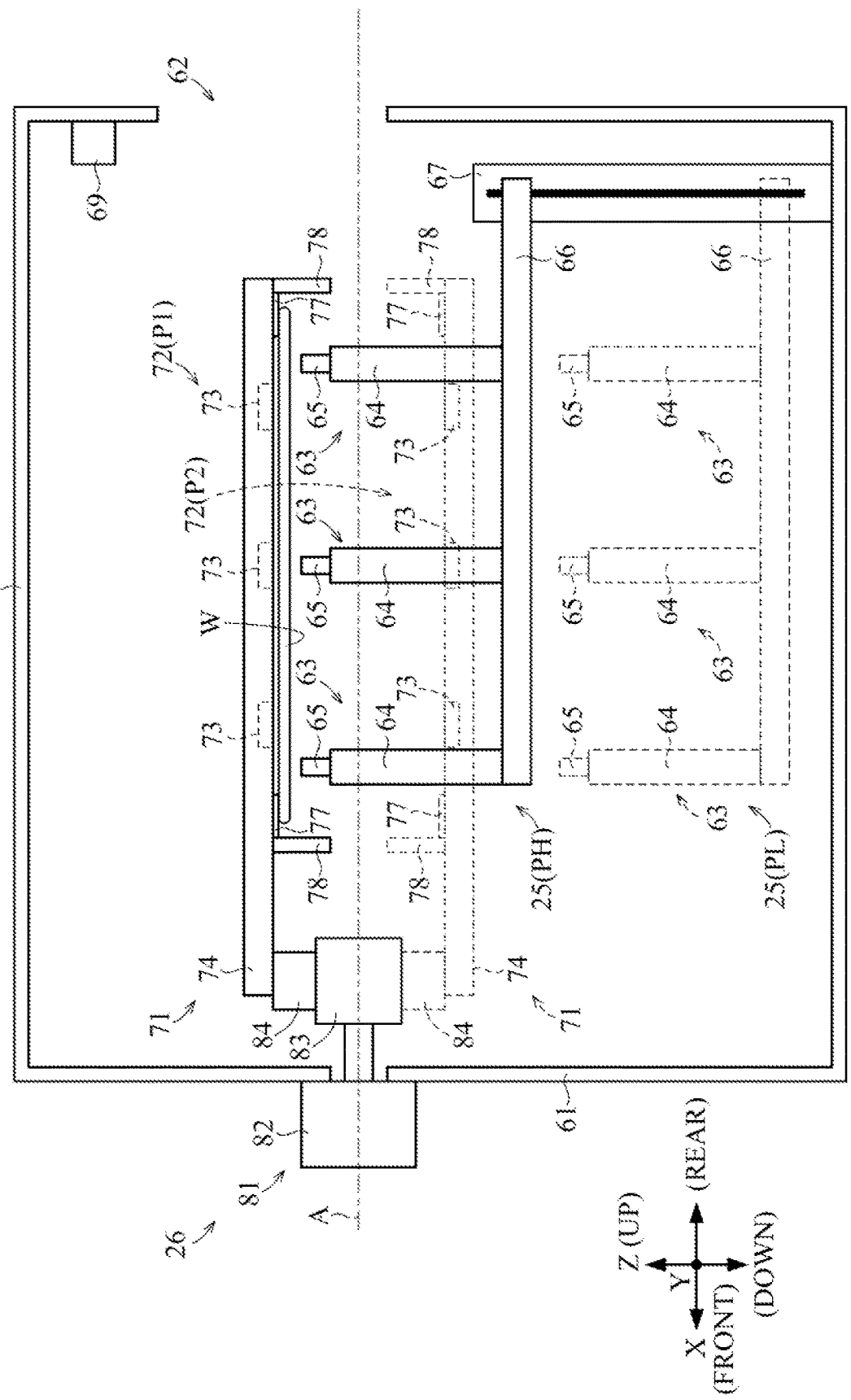
FIG. 12 is a side view of an inversion unit.

FIG. 12 is a side view of the inversion unit 24. The inversion unit 24 includes a housing 61. The housing 61 has a substantial box shape. The housing 61 has a substrate transportation port 62. The substrate transportation port 62 is formed in a rear wall of the housing 61. A substrate W can pass through the substrate transportation port 62. The substrate W can move between outside of the housing 61 and inside of the housing 61 via the substrate transportation port 62. The hand 41 of the transport mechanism 23 can also pass through the substrate transportation port 62. Here, the housing 61 has no substrate transportation port formed in a front wall thereof. Accordingly, the transport mechanism 13 is not accessible to the inversion units 24.

The supporting portion 25 of the inversion unit 24 is located inside of the housing 61. When the supporting portion 25 supports the substrate W, the supporting portion 25 contacts the substrate W.

The supporting portion 25 supports the substrate W from the below. When the supporting portion 25 supports the substrate W, the supporting portion 25 is located below the substrate W. The supporting portion 25 contacts at least either the back face WB of the substrate W or the edge of the substrate W. When the supporting portion 25 supports the substrate W, the supporting portion 25 allows the substrate W to move upward with respect to the supporting portion 25. The supporting portion 25 does not suck the substrate W.

Figure 13:
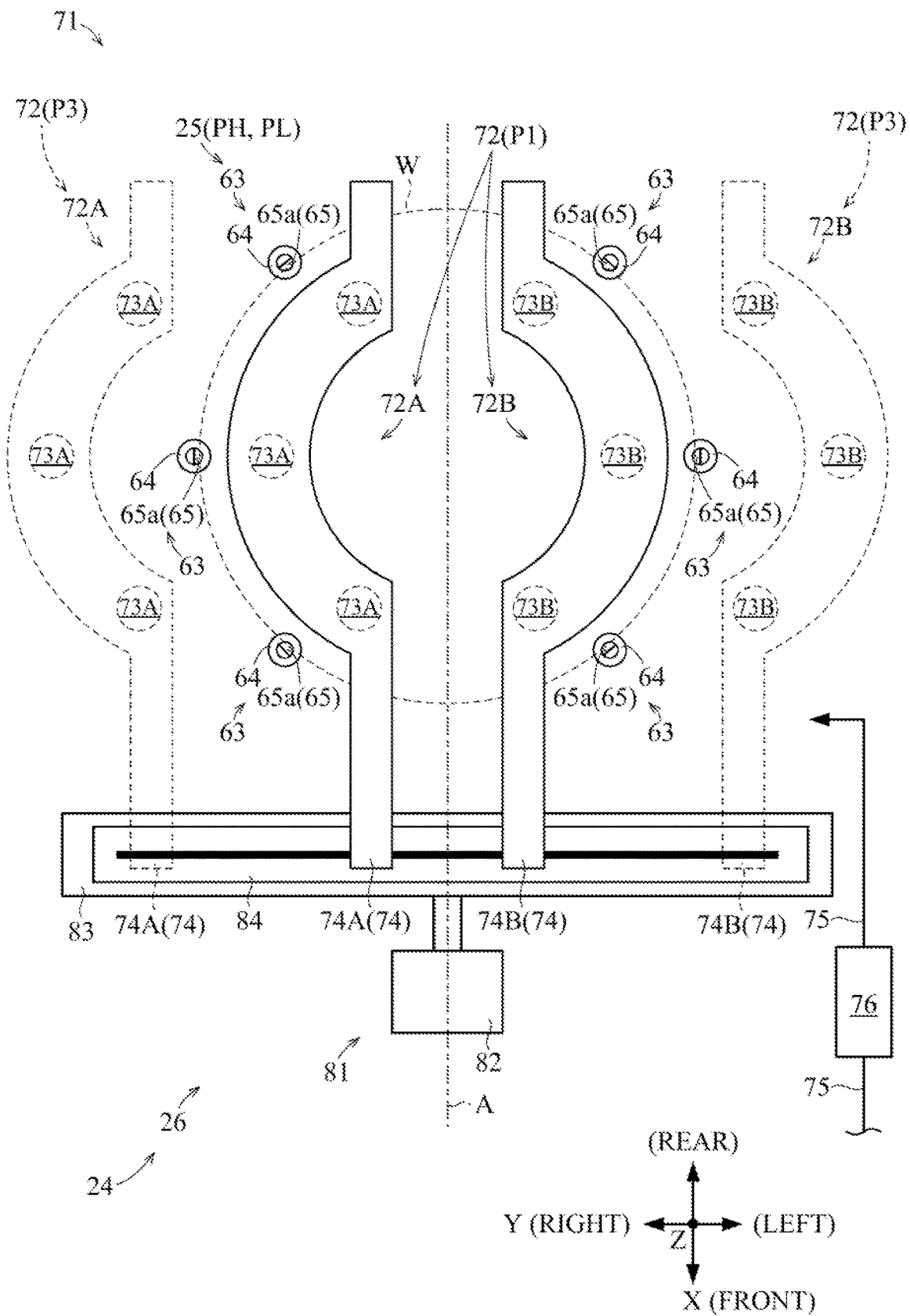
FIG. 13 is a partial plan view of the inversion unit.
Figure 14:
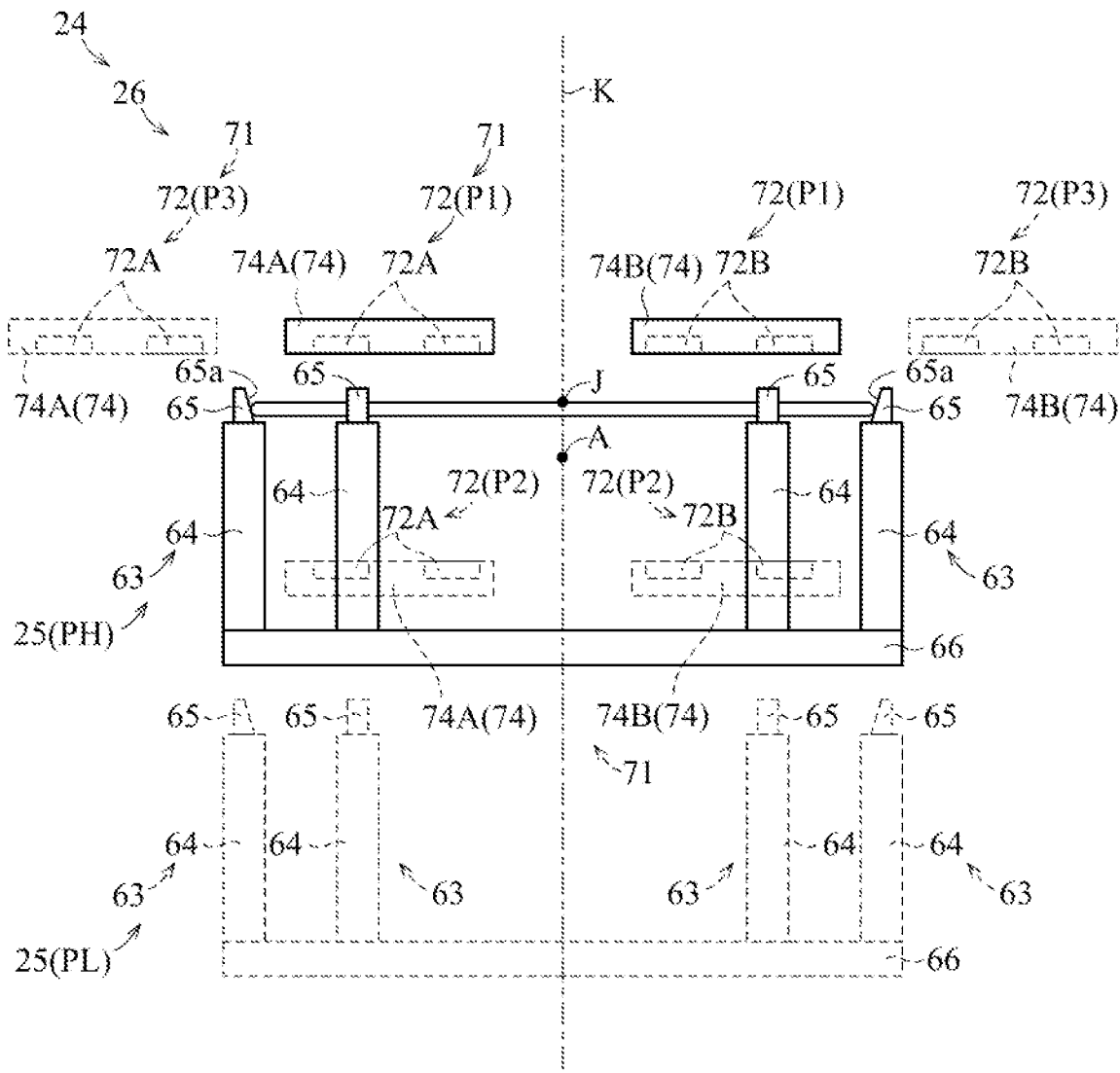
FIG. 14 is a partial front view of the inversion unit.

Reference is made to FIGS. 12, 13, and 14. FIG. 13 is a partial plan view of the inversion unit 24. FIG. 14 is a partial front view of the inversion unit 24. The supporting portion 25 includes a plurality of (e.g., six) support pins 63. The support pins 63 are each sufficiently smaller than the substrate W in plan view. The support pins 63 are located at the same height position. The support pins 63 are arranged on the edge of the substrate W supported by the supporting portion 25 in plan view. The support pins 63 each contact the substrate W.

More specifically, the support pins 63 each include a shaft 64 and a position adjusting unit 65. The shaft 64 has an elongated bar shape. The shaft 64 extends in the vertical direction Z. The position adjusting unit 65 is connected to an upper end of the shaft 64. The position adjusting unit 65 protrudes upward from the shaft 64. The position adjusting unit 65 contacts the substrate W.

Reference is made to FIG. 14. The position adjusting unit 65 also adjusts a position of the substrate W in the horizontal direction. Specifically, the position adjusting unit 65 include a slope face 65*a*. The slope face 65*a* contacts the edge of the substrate W. The slope face 65*a* is inclined downward and radially inward of the substrate W supported by the supporting portion 25. In other words, the slope face 65*a* is inclined upward and radially outward of the substrate W supported by the supporting portion 25. The slope face 65*a* guides the substrate W to a given position.

FIG. 14 shows the center J of the substrate W supported by the supporting portion 25. FIG. 14 further illustrates a central axis K. The central axis K is an imaginary line that passes through the center J and is parallel to the vertical direction Z. The radius direction corresponds to a direction orthogonal to the central axis K. The term radially inward is a direction approaching the central axis K in the radial direction. In other words, the term radially inward is a direction approaching the center J in the radial direction of the substrate W. The term radially outward is a direction moving away from the central axis K in the radial direction. In other words, the term radially outward is a direction moving far away from the center J in the radial direction of the substrate W.

Reference is made to FIG. 12. The inversion unit 24 includes a lifting base 66 and a lifting drive unit 67. The lifting base 66 is located below the supporting portion 25. The lifting base 66 supports the supporting portion 25. The lifting base 66 is connected to the lower part of the supporting portion 25. The lifting drive unit 67 is connected to the lifting base 66. The lifting drive unit 67 is supported by the housing 61. The lifting drive unit 67 moves the lifting base 66 with respect to the housing 61. The lifting drive unit 67 moves the lifting base 66 in the vertical direction Z. When the lifting base 66 moves, the supporting portion 25 moves integrally with the lifting base 66. Thereby, the supporting portion 25 moves with respect to the housing 61. The supporting portion 25 moves in the vertical direction Z. The lifting drive unit 67 includes, for example, an air cylinder.

The lifting drive unit 67 moves the supporting portion 25 to a first support position PH and a second support position PL. FIGS. 12 and 14 each illustrates the supporting portion 25 at the first support position PH by solid lines. FIGS. 12 and 14 each illustrates the supporting portion 25 at the second support position PL by dotted lines. The second support position PL is lower than the first support position PH. Specifically, the supporting portion 25 at the second support position PL is located at a position lower than the supporting portion 25 at the first support position PH.

Reference is made to FIG. 13. The second support position PL is at the same position as the first support position PH in plan view. Specifically, the supporting portion 25 at the second support position PL is located at the same position as the supporting portion 25 at the first support position PH in plan view. Here, in FIG. 13, illustration of the lifting base 66 is omitted.

The lifting drive unit 67 brings the supporting portion 25 into rest at the first support position PH and the second support position PL. The lifting drive unit 67 does not bring the supporting portion 25 into rest at a position except the first support position PH and the second support position PL. The lifting drive unit 67 does not move the supporting portion 25 to a position higher than the first support position PH. The lifting drive unit 67 does not move the supporting portion 25 to a position lower than the second support position PL.

Reference is made to FIG. 12. The inversion unit 24 includes a substrate detector 69. The substrate detector 69 is supported by the housing 61. The substrate detector 69 detects the substrate W. For example, the substrate detector 69 detects whether or not the substrate W is supported by the supporting portion 25. For example, the substrate detector 69 detects a position of the substrate W.

The reversing mechanism 26 of the inversion unit 24 includes a hand 71. The hand 71 holds one substrate W. The hand 71 is located inside of the housing 61.

The hand 71 includes a second suction portion 72. The second suction portion 72 has a configuration substantially equal to that of the first suction portion 42. The second suction portion 72 sucks a substrate W. The hand 71 is referred to as a Bernoulli chuck, or a Bernoulli gripper.

The second suction portion 72 sucks either a first face W1 or the second face W2 of the substrate W. For example, when the second suction portion 72 sucks the first face W1 of the substrate W, the second suction portion 72 is located at a position facing the first face W1 and blows gas to the first face W1. The second suction portion 72 causes gas to flow over the first face W1. Gas flows over the first face W1, whereby the air pressure on the first face W1 is smaller than the air pressure on the second face W2. That is, gas flows over the first face W1, whereby negative pressure is formed in the vicinity of the first face W1. In accordance with the Bernoulli's principle, force toward the second suction portion 72 acts on the substrate W. Thereby, the substrate W is sucked toward the second suction portion 72. However, the second suction portion 72 does not contact the substrate W sucked by the second suction portion 72. The second suction portion 72 is spaced apart from the substrate W by a small gap. In such a manner as above, the second suction portion 72 sucks the substrate W without contacting the substrate W.

The hand 71 includes a suction holder 74. The suction holder 74 holds the second suction portion 72.

Reference is made to FIG. 13. The suction holder 74 includes a first branch 74A and a second branch 74B. The first branch 74A and the second branch 74B are spaced apart from each other.

The second suction portion 72 includes a third suction portion 72A and a fourth suction portion 72B. The third suction portion 72A is held by the first branch 74A. The fourth suction portion 72B is held by the second branch 74B.

The third suction portion 72A includes a plurality of (e.g., three) suction pads 73A. The suction pads 73A are attached to the first branch 74A. The fourth suction portion 72B includes a plurality of (e.g., three) suction pads 73B. The suction pads 73B are attached to the second branch 74B. The suction pads 73A and 73B have substantially the same configuration as the suction pad 43. When no distinction is made between the suction pads 73A and 73B, they are referred to as a suction pad 73 as appropriate.

The reversing mechanism 26 includes a gas feed channel 75. The gas feed channel 75 has a function similar to that of the gas feed channel 48. The gas feed channel 75 is connected in communication with the second suction portion 72. The gas feed channel 75 is connected in communication with the third suction portion 72A and the fourth suction portion 72B. The gas feed channel 75 is connected in communication with each of the suction pads 73. The gas feed channel 75 supplies gas to the second suction portion 72. The second suction portion 72 blows gas supplied from the gas feed channel 75. The gas supplied to the second suction portion 72 is, for example, a nitrogen gas or air. The gas supplied to the second suction portion 72 is, for example, a high-pressure gas or a compressed gas.

The reversing mechanism 26 includes a suction adjusting unit 76. The suction adjusting unit 76 has a function similar to that of the suction adjusting unit 49. The suction adjusting unit 76 is provided on the gas feed channel 75. The suction adjusting unit 76 opens and closes the gas feed channel 75. When the suction adjusting unit 76 opens the gas feed channel 75, the gas feed channel 75 supplies gas to the second suction portion 72. When the suction adjusting unit 76 closes the gas feed channel 75, the gas feed channel 75 does not supply gas to the second suction portion 72. Moreover, the suction adjusting unit 76 may change a flow rate of gas that the gas feed channel 75 supplies to the second suction portion 72. For example, the suction adjusting unit 76 may adjust a channel sectional area of the gas feed channel 75. The suction adjusting unit 76 includes one or more valves, for example. The suction adjusting unit 76 includes at least either an on-off valve or a flow rate regulating valve, for example.

Reference is made to FIG. 12. The hand 71 includes a contact portion 77. The contact portion 77 has a function similar to that of the contact portion 51. The contact portion 77 is fixed to the suction holder 74. When the second suction portion 72 sucks the substrate W, the contact portion 77 contacts the substrate W. The contact portion 77 contacts the substrate W, thereby suppressing displacement of the substrate W with respect to the second suction portion 72. When the second suction portion 72 sucks the substrate W, the contact portion 77 keeps the substrate W at a suitable position with respect to the second suction portion 72.

The hand 41 includes a wall 78. The wall 78 has a function similar to those of the walls 52 and 53. The wall 78 is fixed to the suction holder 74. The wall 78 controls excessive displacement of the substrate W with respect to the second suction portion 72.

The reversing mechanism 26 includes a hand driving unit 81. The hand driving unit 81 is connected to the hand 71. The hand driving unit 81 moves the hand 71.

Specifically, the hand driving unit 81 rotates the hand 71 around the rotation axis A. The hand driving unit 81 widens and narrows a distance between the first branch 74A and the second branch 74B. Thereby, the hand driving unit 81 rotates the second suction portion 72 around the rotation axis A. The hand driving unit 81 widens and narrows a distance between the third suction portion 72A and the fourth suction portion 72B.

The following describes a configuration of the hand driving unit 81. The hand driving unit 81 includes a rotation driving unit 82, a rotation base 83, and a movement driving unit 84. The rotation driving unit 82 is supported by the housing 61. The rotation driving unit 82 is located on a front wall of the housing 61. The rotation driving unit 82 has a part located outside of the housing 61 and a part located inside of the housing 61. The rotation base 83 is connected to the rotation driving unit 82. The movement driving unit 84 is supported by the rotation base 83. The movement driving unit 84 is connected to the hand 71. The movement driving unit 84 connects the first branch 74A and the second branch 74B. The rotation base 83 and the movement driving unit 84 are located inside of the housing 61.

The rotation driving unit 82 rotates the rotation base 83 with respect to the housing 61. The rotation driving unit 82 rotates the rotation base 83 around a rotation axis A. When the rotation base 83 rotates, the movement driving unit 84 and the hand 71 rotate integrally with the rotation base 83. In such a manner as above, the rotation driving unit 82 rotates the second suction portion 72. The rotation driving unit 82 causes the second suction portion 72 to rotate with respect to the housing 61. The second suction portion 72 rotates around the rotation axis A.

The movement driving unit 84 moves the first branch 74A with respect to the rotation base 83. The movement driving unit 84 moves the second branch 74B with respect to the rotation base 83. Thereby, the movement driving unit 84 widens and narrows a gap between the first branch 74A and the second branch 74B.

The rotation driving unit 82 includes, for example, a rotary actuator. The movement driving unit 84 includes, for example, an air cylinder. For example, the movement driving unit 84 may include a first air cylinder corresponding to the first branch 74A and a second air cylinder corresponding to the second branch 74B. Alternatively, the movement driving unit 84 may include a common air cylinder corresponding to both the first branch 74A and the second branch 74B. Moreover, the movement driving unit 84 may include at least either a first link mechanism or a second link mechanism. The first link mechanism connects the air cylinder to the first branch 74A. The second link mechanism connects the air cylinder to the second branch 74B.

The hand driving unit 81 moves the second suction portion 72 to a first position P1, a second position P2, and a third position P3. FIG. 12 illustrates the second suction portion 72 at the first position P1 by solid lines. FIG. 12 illustrates the second suction portion 72 at the second position P2 by dotted lines. FIG. 13 illustrates the second suction portion 72 at the first position P1 by solid lines. FIG. 13 illustrates the second suction portion 72 at the third position P3 by dotted lines. FIG. 14 illustrates the second suction portion 72 at the first position P1 by solid lines. FIG. 14 illustrates the second suction portion 72 at the second position P2 and the third position P3 by dotted lines.

Reference is made to FIG. 12. The rotation driving unit 82 moves the second suction portion 72 to the first position P1 and the second position P2. Specifically, the rotation driving unit 82 rotates the second suction portion 72 around the rotation axis A, whereby the second suction portion 72 moves between the first position P1 and the second position P2. More specifically, the rotation driving unit 82 half-rotates the second suction portion 72. The rotation driving unit 82 rotates the second suction portion 72 by 180 degrees. When the second suction portion 72 moves between the first position P1 and the second position P2, the movement driving unit 84 does not change the distance between the first branch 74A and the second branch 74B.

Here, the position of the rotation axis A with respect to the housing 61 is stable. The rotation axis A is horizontal. The rotation axis A is parallel to the front-back direction X, for example.

Reference is made to FIG. 13. The movement driving unit 84 moves the second suction portion 72 to the first position P1 and the third position P3. Specifically, the movement driving unit 84 changes the distance between the first branch 74A and the second branch 74B, whereby the second suction portion 72 moves between the first position P1 and the third position P3. Specifically, the movement driving unit 84 increases the distance between the first branch 74A and the second branch 74B, whereby the second suction portion 72 moves from the first position P1 to the third position P3. The movement driving unit 84 decreases the distance between the first branch 74A and the second branch 74B, whereby the second suction portion 72 moves from the third position P3 to the first position P1. The distance between the first branch 74A and the second branch 74B when the second suction portion 72 is located at the third position P3 is larger than distance between the first branch 74A and the second branch 74B when the second suction portion 72 is located at the first position P1. When the second suction portion 72 moves between the first position P1 and the third position P3, the rotation driving unit 82 does not rotate the second suction portion 72 around the rotation axis A.

Here, the distance between the first branch 74A and the second branch 74B is constant when the second suction portion 72 rotates around the rotation axis A. The distance between the first branch 74A and the second branch 74B when the second suction portion 72 rotates around the rotation axis A is equal to the distance between the first branch 74A and the second branch 74B when the second suction portion 72 is located at the first position P1. The distance between the first branch 74A and the second branch 74B when the second suction portion 72 rotates around the rotation axis A is smaller than the distance between the first branch 74A and the second branch 74B when the second suction portion 72 is located at the third position P3.

The following describes a relationship between the rotation axis A and the first position P1, the second position P2, and the third position P3.

Reference is made to FIG. 12. The rotation axis A is lower than the first position P1. The rotation axis A is higher than the second position P2. The second position P2 is lower than the first position P1. Specifically, the rotation axis A is located at a position lower than the second suction portion 72 at the first position P1. The rotation axis A is located at a position higher than the second suction portion 72 at the second position P2. The second suction portion 72 at the second position P2 is located at a position lower than the second suction portion 72 at the first position P1.

Reference is made to FIG. 14. The third position P3 is higher than the rotation axis A. The third position P3 is substantially equal in level to the first position P1. The third position P3 is higher than the second position. Specifically, the second suction portion 72 at the third position P3 is located at a position higher than the rotation axis A. The second suction portion 72 at the third position P3 is located at a position substantially equal in level to the second suction portion 72 at the first position P1. The second suction portion 72 at the third position P3 is located at a position higher than the second suction portion 72 at the second position P2.

When the second suction portion 72 is located at the first position P1, the second suction portion 72 can blow gas downward. When the second suction portion 72 is located at the first position P1, the third suction portion 72A and the fourth suction portion 72B are arranged at the same height position. When the second suction portion 72 is located at the first position P1, the contact portion 77 is lower than the second suction portion 72 (see FIG. 12).

When the second suction portion 72 is located at the second position P2, the second suction portion 72 can blow gas upward. When the second suction portion 72 is located at the second position P2, the third suction portion 72A and the fourth suction portion 72B are arranged at the same height position. When the second suction portion 72 is located at the second position P2, the contact portion 77 is higher than the second suction portion 72 (see FIG. 12).

When the second suction portion 72 is located at the third position P3, the second suction portion 72 can blow gas downward. However, in the present embodiment, the second suction portion 72 blows no gas when the second suction portion 72 is located at the third position P3. When the second suction portion 72 is located at the third position P3, the third suction portion 72A and the fourth suction portion 72B are arranged at the same height position.

Reference is made to FIG. 13. When the second suction portion 72 is located at the first position P1, the rotation axis A is located between the third suction portion 72A and the fourth suction portion 72B in plan view. When the second suction portion 72 is located at the first position P1, the third suction portion 72A and the fourth suction portion 72B are arranged at line symmetric positions with respect to the rotation axis A in plan view.

The second position P2 overlaps the first position P1 in plan view, which illustration is omitted. The second position P2 is located below the first position P1. Specifically, the second suction portion 72 at the second position P2 is located at a position equal to the second suction portion 72 at the first position P1 in plan view. The second suction portion 72 at the second position P2 is located below the second suction portion 72 at the first position P1. Accordingly, when the second suction portion 72 is located at the second position P2, the rotation axis A is located between the third suction portion 72A and the fourth suction portion 72B in plan view. When the second suction portion 72 is located at the second position P2, the third suction portion 72A and the fourth suction portion 72B are arranged in an axial symmetric manner with respect to the rotation axis A in plan view.

When the second suction portion 72 is located at the first position P1, the second suction portion 72 overlaps the substrate W supported by the supporting portion 25 in plan view. When the second suction portion 72 is located at the first position P1, the second suction portion 72 is located more radially inward of the substrate W supported by the supporting portion 25 than the supporting portion 25 in plan view. When the second suction portion 72 is located at the first position P1, the second suction portion 72 is located to be dispersed over the substrate W sucked by the second suction portion 72 in plan view. When the second suction portion 72 is located at the first position P1, the second suction portion 72 is located, for example, at a central portion of the substrate W supported by the supporting portion 25 in plan view. Likewise, when the second suction portion 72 is located at the second position P2, the second suction portion 72 overlaps the substrate W supported by the supporting portion 25 in plan view. When the second suction portion 72 is located at the second position P2, the second suction portion 72 is located more radially inward of the substrate W supported by the supporting portion 25 than the supporting portion 25 in plan view. When the second suction portion 72 is located at the second position P2, the second suction portion 72 is located to be dispersed over the substrate W sucked by the second suction portion 72 in plan view. When the second suction portion 72 is located at the second position P2, the second suction portion 72 is located, for example, at the central portion of the substrate W supported by the supporting portion 25 in plan view.

When the second suction portion 72 is located at the third position P3, the rotation axis A is located between the third suction portion 72A and the fourth suction portion 72B in plan view. When the second suction portion 72 is located at the third position P3, the third suction portion 72A and the fourth suction portion 72B are arranged at line symmetric positions with respect to the rotation axis A in plan view.

When the second suction portion 72 moves from the first position P1 to the third position P3, the first branch 74A and the second branch 74B each move far away from the rotation axis A in plan view. When the second suction portion 72 moves from the third position P3 to the first position P1, the first branch 74A and the second branch 74B each approach the rotation axis A in plan view.

When the second suction portion 72 moves between the first position P1 and the third position P3, the first branch 74A and the second branch 74B each translate in the horizontal direction orthogonal to the rotation axis A. The horizontal direction orthogonal to the rotation axis A is, for example, the transverse direction Y.

When the second suction portion 72 is located at the third position P3, the second suction portion 72 does not overlap the substrate W supported by the supporting portion 25 in plan view. When the second suction portion 72 is located at the third position P3, the second suction portion 72 does not overlap the supporting portion 25 in plan view. When the second suction portion 72 is located at the third position P3, the second suction portion 72 is located more radially outward of the substrate W supported by the supporting portion 25 than the supporting portion 25 in plan view. When the second suction portion 72 is located at the third position P3, the second suction portion 72 does not interfere with the transport mechanism 23.

When the second suction portion 72 is located at the third position P3, also the suction holder 74 does not overlap the substrate W supported by the supporting portion 25 in plan view. When the second suction portion 72 is located at the third position P3, also the suction holder 74 does not overlap the supporting portion 25 in plan view. When the second suction portion 72 is located at the third position P3, also the suction holder 74 is located more radially outward of the substrate W supported by the supporting portion 25 than the supporting portion 25 in plan view. When the second suction portion 72 is located at the third position P3, also the suction holder 74 does not interfere with the transport mechanism 23.

The following describes a relationship between the rotation axis A and the first position P1, the second position P2, the first support position PH and the second support position PL.

The first position P1 is higher than the first support position PH. The first position P1 is higher than the second support position PL. The second position P2 is located at the level substantially equal to that of the first support position PH. The second position P2 overlaps the first support position PH in side view. The second position P2 is higher than the second support position PL. The rotation axis A overlaps the first support position PH in side view. The rotation axis A is higher than the second support position PL. Specifically, the second suction portion 72 at the first position P1 is located at a position higher than the supporting portion 25 at the first support position PH. The second suction portion 72 at the first position P1 is located at a position higher than the supporting portion 25 at the second support position PL. The second suction portion 72 at the second position P2 is located at a position substantially equal in level to the supporting portion 25 at the first support position PH. The second suction portion 72 at the second position P2 overlaps the supporting portion 25 at the first support position PH in side view. The second suction portion 72 at the second position P2 is located at a position higher than the supporting portion 25 at the second support position PL. The rotation axis A overlaps the supporting portion 25 at the first support position PH in side view. The rotation axis A is located at a position higher than the supporting portion 25 at the second support position PL.

Figure 15:
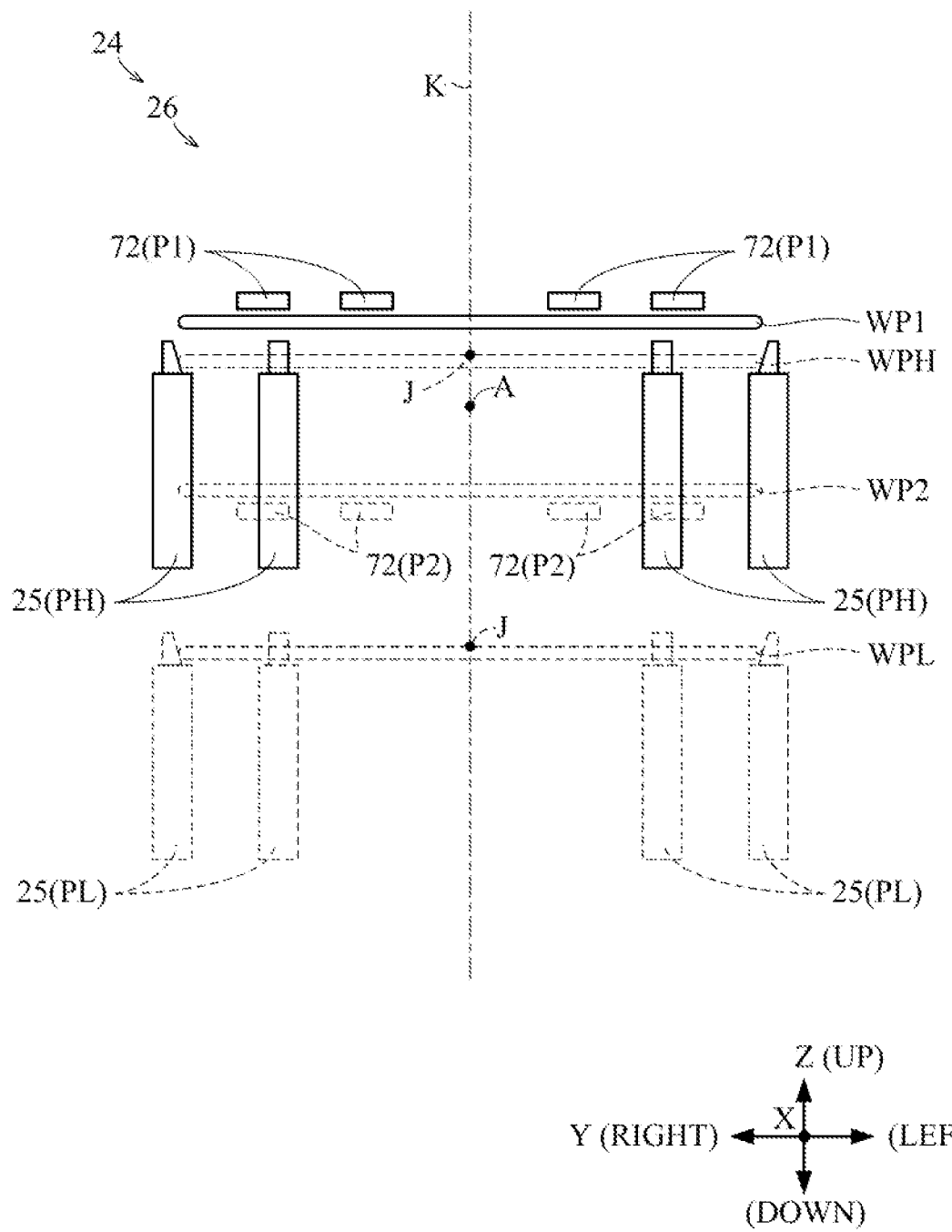
FIG. 15 is another partial front view of the inversion unit.

FIG. 15 is a partial front view of the inversion unit 24. FIG. 15 illustrates a substrate WP1 sucked by the second suction portion 72 at the first position P1. FIG. 15 illustrates a substrate WP2 sucked by the second suction portion 72 at the second position P2. FIG. 15 illustrates a substrate WPH supported by the supporting portion 25 at the first support position PH. FIG. 15 illustrates a substrate WPL supported by the supporting portion 25 at the second support position PL. Note that, in the present embodiment, the supporting portion 25 does not support the substrate W at the second support position PL.

When the second suction portion 72 is located at the first position P1, the second suction portion 72 is located above the substrate WP1. The second suction portion 72 sucks the substrate WP1 upward. The substrate WP1 is in a horizontal posture. The second suction portion 72 does not contact the substrate WP1. The contact portion 77 contacts the substrate WP1 (specifically, top face WT). The contact portion 77 is located above the substrate WP1.

When the second suction portion 72 is located at the second position P2, the second suction portion 72 is located below the substrate WP2. The second suction portion 72 sucks the substrate WP2 downward. The substrate WP2 is in a horizontal posture. The second suction portion 72 does not contact the substrate WP2. The contact portion 77 contacts the substrate WP2 (specifically, back face WB). The contact portion 77 is located below the substrate WP2.

When the second suction portion 72 at the second position P2 stops sucking the substrate WP2, the hand 71 (contact portion 77) supports the substrate W at the same position as the substrate WP2. When the second suction portion 72 does not suck the substrate W at the second position P2, the second suction portion 72 allows the substrate W, supported by the hand 71, to move upward with respect to the hand 71.

The height position of the substrate WP1 is higher than the height position of the substrate WP2. The height position of the substrate WPH is higher than the height position of the substrate WPL.

The height position of the substrate WP1 is higher than the height position of the substrate WPH. The height position of the substrate WPH is higher than the height position of the substrate WP2. The height position of the substrate WP2 is higher than the height position of the substrate WPL.

The first position P1 is higher than the substrate WPH. Specifically, when the second suction portion 72 is located at the first position P1, the second suction portion 72 is positioned higher than the substrate WPH.

More specifically, when the second suction portion 72 located at the first position P1, the second suction portion 72 is positioned slightly higher than the substrate WPH. The second suction portion 72 at the first position P1 is located in the vicinity of the top face WT of the substrate WPH. Accordingly, when the second suction portion 72 is located at the first position P1, the second suction portion 72 can easily float the substrate W from the position of the substrate WPH to the position of the substrate WP1.

The second position P2 is lower than the substrate WPH. The second position P2 is higher than the substrate WPL. Specifically, the second suction portion 72 at the second position P2 is positioned lower than the substrate WPH. The second suction portion 72 at the second position P2 is positioned higher than the substrate WPL.

The first support position PH is lower than the substrate WP1. The first support position PH overlaps the substrate WP2 in side view. The second support position PL is lower than the substrate WP2. Specifically, the supporting portion 25 at the first support position PH is positioned lower than the substrate WP1. The supporting portion 25 at the first support position PH overlaps the substrate WP2 in side view. The supporting portion 25 at the second support position PL is positioned lower than the substrate WP2.

The substrate WP1 is located at the same position as that of the substrate WP2 in plan view, which illustration is omitted. The substrate WPH is located at the same position as that of the substrate WPL in plan view. The substrates WP1 and WP2 are located at the same position as that of the substrates WPH and WPL in plan view. Consequently, the substrate WP1 is located above the substrate WPH. The substrate WPH is located above the substrate WP2. The substrate WP2 is located above the substrate WPL.

Reference is made to FIG. 8. The controller 29 controls the hand driving unit 45, the suction adjusting unit 49, and the receiver driving unit 58 of the transport mechanism 23. The controller 29 controls the lifting drive unit 67 of the inversion unit 24. The controller 29 obtains detection results of the substrate detector 69 of the inversion unit 24. The controller 29 controls the suction adjusting unit 76 and the hand driving unit 81 of the reversing mechanism 26. The controller 29 controls the rotation driving unit 82 and the movement driving unit 84 of the hand driving unit 81. The controller 29 is communicatively connected to these components.

Exemplary Operation of Substrate Treating Apparatus 1

The following describes exemplary operations of the transport mechanism 23 and the inversion unit 24 in detail. Specifically, exemplary operations in Steps S4 to S8 and Steps S10 to S14 illustrated in FIG. 9 is to be described in more detail.

Figure 16:
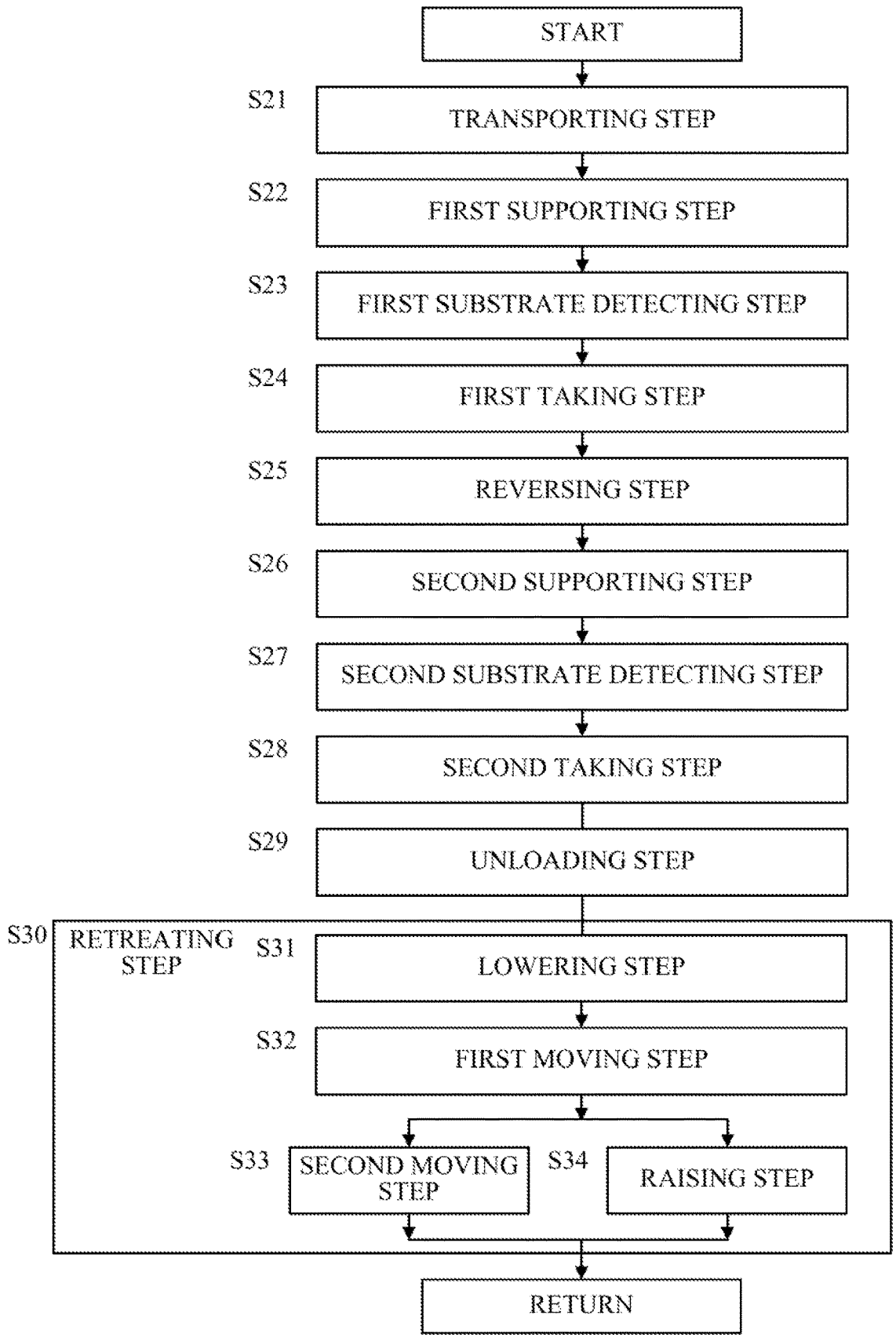
FIG. 16 is a flowchart showing procedures of an exemplary operation of reversing a substrate.

FIG. 16 is a flowchart showing procedures of an exemplary operation of reversing a substrate W. It is assumed in the following exemplary operation that the elements of the substrate treating apparatus 1 each operate under control by the controller 29.

<Step S21: Transporting Step>

The transport mechanism 23 transports a substrate W to the supporting portion 25.

FIGS. 17(a), 17(b), and 17(c) are each a plan view schematically illustrating an exemplary operation of a transporting step. In FIGS. 17(a), 17(b), and 17(c), illustration of the hand driving unit 45 and the lifting base 66 is omitted.

Reference is made to FIG. 17(a). The hand 41 supports the substrate W. The first suction portion 42 sucks the substrate W. The supporting portion 25 does not support a substrate W. Moreover, the hand 71 does not support a substrate W. Furthermore, the second suction portion 72 does not suck a substrate W. The second suction portion 72 is located at the third position P3.

Reference is made to FIG. 17(b). The hand driving unit 45 moves the hand 41 (first suction portion 42) to the supporting portion 25. Thereby, the hand 41 moves from outside of the housing 61 through the substrate transportation port 62 to inside of the housing 61. The first suction portion 42 moves to the supporting portion 25 while sucking the substrate W.

The first suction portion 42 and the substrate W reach a position above the supporting portion 25. In the transporting step, the second suction portion 72 is at rest at the third position P3. Accordingly, the second suction portion 72 does not interfere with the transport mechanism 23. Moreover, the suction holder 74 does not interfere with the transport mechanism 23. That is, the hand 71 does not interfere with the transport mechanism 23.

<Step S22: First Supporting Step>

Reference is made to FIG. 17(b). The transport mechanism 23 passes the substrate W to the supporting portion 25. The supporting portion 25 receives the substrate W from the transport mechanism 23. The supporting portion 25 supports the substrate W in a horizontal posture.

Reference is now made to FIG. 17(c). The first suction portion 42 moves apart from the position above the supporting portion 25 while not sucking the substrate W. Specifically, the hand 41 moves from inside of the housing 61 to outside of the housing 61. The supporting portion 25 supports a substrate W. The second suction portion 72 is located at the third position P3. Moreover, the second suction portion 72 does not suck a substrate W.

Also in the first supporting step, the second suction portion 72 is at rest at the third position P3. Accordingly, the second suction portion 72 does not interfere with the transport mechanism 23 also in the first supporting step. The suction holder 74 does not interfere with the transport mechanism 23 also in the first supporting step.

The following again describes the above transporting step and the first supporting step with reference to FIGS. 18(a) to 18(h). FIGS. 18(a) to 18(h) are each a side view schematically illustrating an exemplary operation of the transporting step and the first supporting step.

Figure 18A:
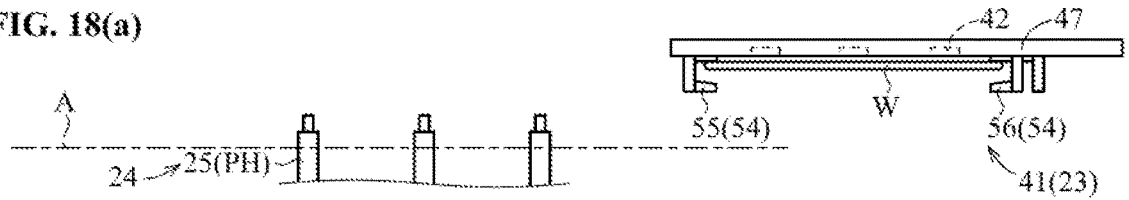
FIGS. 18(a) to 18(h) are each a side view schematically illustrating an exemplary operation of the transporting step and the first supporting step.

Reference is now made to FIG. 18(a). The hand 41 is located more rearward than the supporting portion 25. The first suction portion 42 is located above the substrate W. The first suction portion 42 causes gas to flow over the top face WT of the substrate W and sucks the substrate W upward. The substrate W is in a horizontal posture. The receiver 54 is in the drop-preventing position. The supporting portion 25 is located at the first support position PH.

Figure 18B:
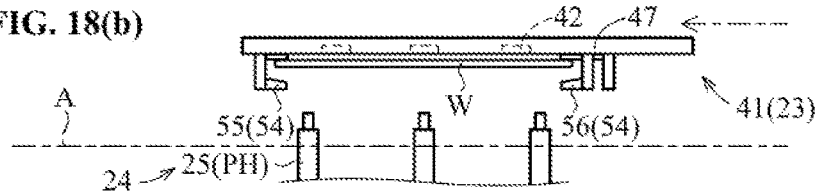

Reference is now made to FIG. 18(b). The hand driving unit 45 moves the hand 41 forward. The first suction portion 42 moves to the supporting portion 25 while sucking the substrate W. The first suction portion 42 and the substrate W sucked by the first suction portion 42 are located above the supporting portion 25. The receiver 44 is positioned higher than the supporting portion 25.

Figure 18C:
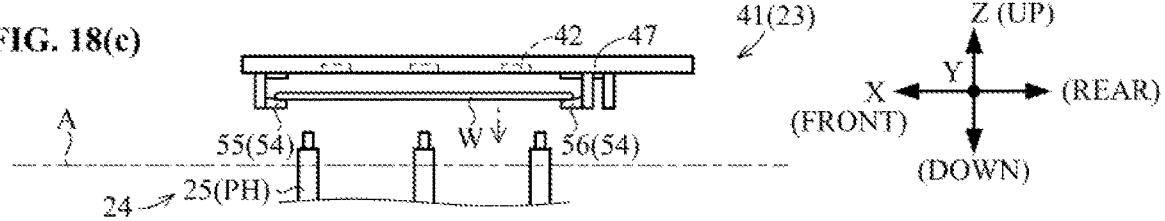

Reference is now made to FIG. 18(c). The suction adjusting unit 49 stops supplying gas to the first suction portion 42. The first suction portion 42 stops blow of gas. The first suction portion 42 stops sucking the substrate W. The substrate W falls downward. The substrate W moves downward with respect to the first suction portion 42. The receiver 54 receives the substrate W. The receiver 54 supports the substrate W in a horizontal posture. The substrate W supported by the receiver 54 is located above the supporting portion 25.

Figure 18D:
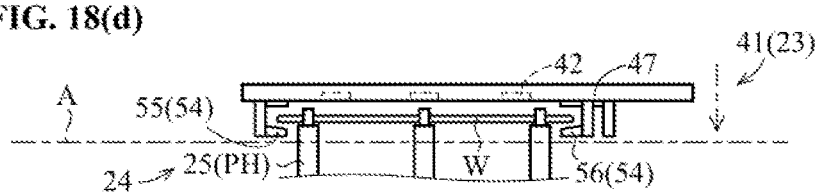

Reference is now made to FIG. 18(d). The hand driving unit 45 moves the hand 41 slightly downward. The receiver 54 moves downward while supporting the substrate W. The receiver 54 delivers the substrate W to the supporting portion 25. The supporting portion 25 receives the substrate W from the receiver 54 at the first support position PH. The receiver 54 moves to a position lower than the substrate W supported by the supporting portion 25. The receiver 54 separates from the substrate W.

The position adjusting unit 65 adjusts a position of the substrate W in the horizontal direction, which illustration is omitted. Specifically, the slope face 65a contacts the edge of the substrate W and guides the substrate W to a given position. Then, the supporting portion 25 supports the substrate W in a horizontal posture.

Figure 18E:
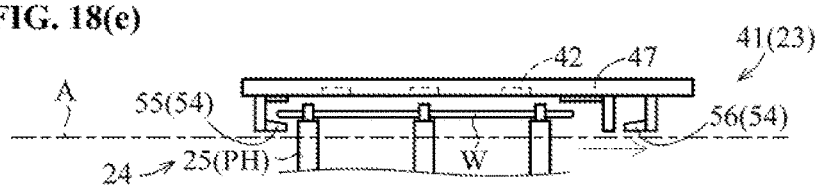

Reference is now made to FIG. 18(e). The receiver driving unit 58 moves the receiver 54 from the drop-preventing position to the retreating position. The second receiver 56 moves far away from the first receiver 55. The second receiver 56 moves rearward. As a result, the second receiver 56 is positioned more rearward than the substrate W supported by the supporting portion 25. The second receiver 56 does not overlap the substrate W supported by the supporting portion 25 in plan view.

Figure 18F:
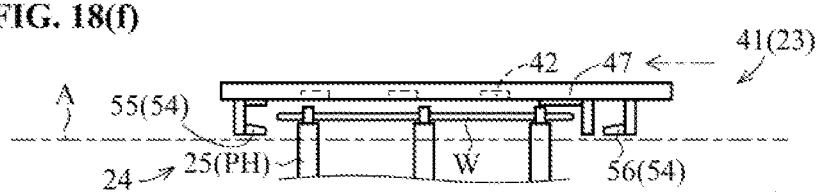

Reference is now made to FIG. 18(f). The hand driving unit 45 moves the hand 41 slightly forward. The first receiver 55 and the second receiver 56 move forward. As a result, the first receiver 55 is positioned more forward than the substrate W supported by the supporting portion 25. Neither the first receiver 55 nor the second receiver 56 overlaps the substrate W supported by the supporting portion 25 in plan view.

Figure 18G:
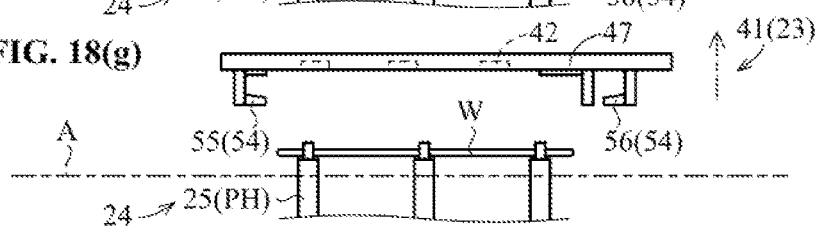

Reference is now made to FIG. 18(g). The hand driving unit 45 moves the hand 41 upward. The receiver 54 moves from a position lower than the substrate W supported by the supporting portion 25 to a position higher than the substrate W supported by the supporting portion 25. At this time, the first receiver 55 passes through a position in front of the substrate W supported by the supporting portion 25. The second receiver 56 passes through a position behind the substrate W supported by the supporting portion 25. The substrate W passes between the first receiver 55 and the second receiver 56, and moves away from the first suction portion 42.

Figure 18H:
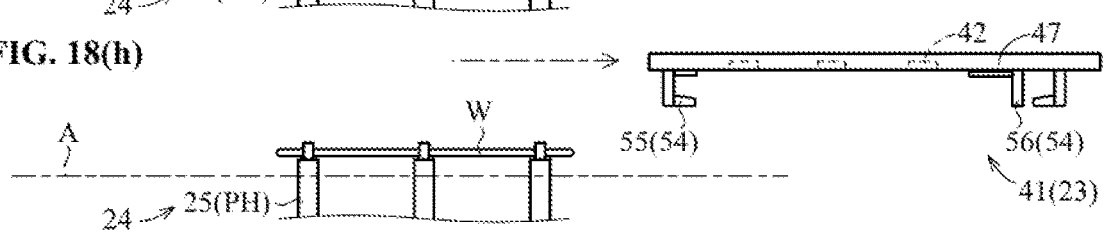

Reference is now made to FIG. 18(h). The hand driving unit 45 moves the hand 41 rearward. The first suction portion 42 moves apart from the position above the supporting portion 25 while not sucking the substrate W.

As described above, the supporting portion 25 is at rest at the first support position PH in the first supporting step. Also in the transporting step, the supporting portion 25 is at rest at the first support position PH.

<Step S23> First Substrate Detecting Step

The substrate detector 69 detects a substrate W. The substrate detector 69 outputs the detection results of the substrate detector 69 to the controller 29. The controller 29 determines whether or not the substrate W is placed at a predetermined position in accordance with the detection results of the substrate detector 69. If the controller 29 determines that the substrate W is placed at the predetermined position, the process proceeds to Step S24. If the controller 29 does not determine that the substrate W is placed at the predetermined position, the process does not proceed to Step S24. In this case, an abnormal process is executed. The abnormal process includes, for example, returning to Step S21. The abnormal process includes, for example, informing a user that an abnormality has occurred.

<Step S24: First Taking Step>

The supporting portion 25 delivers a substrate W to the reversing mechanism 26. The reversing mechanism 26 takes the substrate W from the supporting portion 25.

Figure 19A:
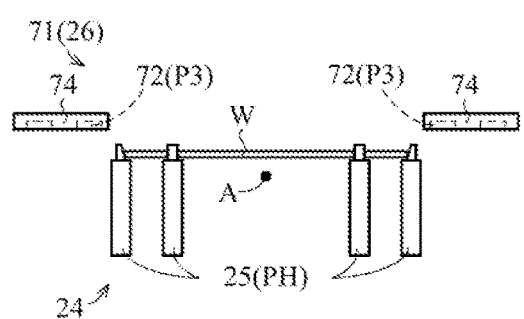
FIG. 19(a) is a front view schematically illustrating an exemplary operation of a first taking step.
Figure 19B:
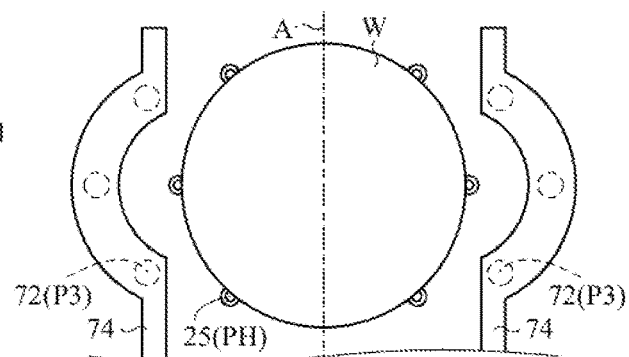
FIG. 19(b) is a plan view schematically illustrating the exemplary operation of the first taking step.
Figure 20A:
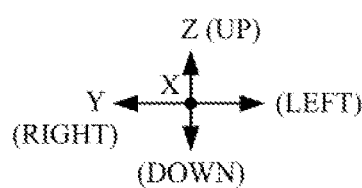
FIG. 20(a) is a front view schematically illustrating an exemplary operation of the first taking step.
Figure 20B:
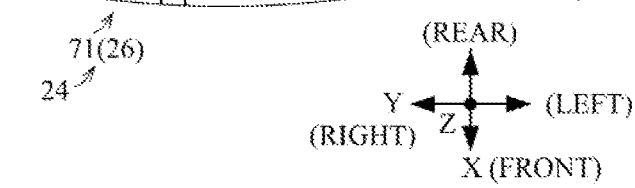
FIG. 20(b) is a plan view schematically illustrating the exemplary operation of the first taking step.
Figure 21A:
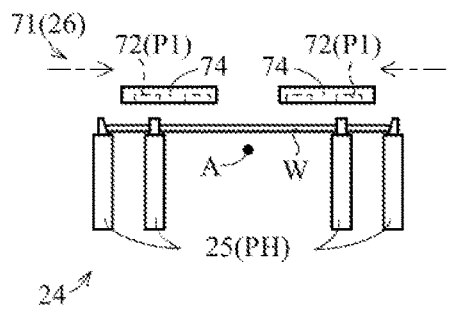
FIG. 21(a) is a front view schematically illustrating an exemplary operation of the first taking step.
Figure 21B:
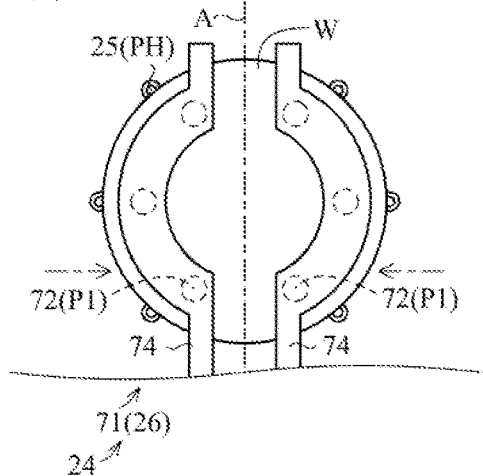
FIG. 21(b) is a plan view schematically illustrating the exemplary operation of the first taking step.

FIGS. 19(a) and 19(b), 20(a) and 20(b), and 21(a) and 21(b) are each schematically illustrating an exemplary operation of the first taking step. FIGS. 19(a), 20(a), and 21(a) are each a partial front view of the inversion unit 24. FIGS. 19(b), 20(b), and 21(b) are each a partial plan view of the inversion unit 24. In each of the above drawings, illustration of the hand driving unit 81 and the like is omitted.

Reference is now made to FIGS. 19(a) and 19(b). The second suction portion 72 is located at the third position P3. The second suction portion 72 does not suck a substrate W. The supporting portion 25 is located at the first support position PH. The supporting portion 25 supports the substrate W. The substrate W is in a horizontal posture.

Reference is now made to FIGS. 20(a) and 20(b). The movement driving unit 84 moves the second suction portion 72 from the third position P3 to the first position P1. When the second suction portion 72 is located at the first position P1, the second suction portion 72 is positioned above the substrate W supported by the supporting portion 25.

Reference is now made to FIGS. 21(a) and 21(b). The second suction portion 72 starts sucking the substrate W. Specifically, the suction adjusting unit 76 supplies gas to the second suction portion 72. The second suction portion 72 blows gas downward. The second suction portion 72 blow gas to the top face WT. The second suction portion 72 causes gas to flow over the top face WT of the substrate W and sucks the substrate W upward. The substrate W floats upward from the supporting portion 25. The substrate W separates from the supporting portion 25. The supporting portion 25 delivers the substrate W to the reversing mechanism 26 at the first support position PH. The reversing mechanism 26 receives the substrate W from the supporting portion 25. The reversing mechanism 26 supports the substrate W. The substrate W is in a horizontal posture.

The supporting portion 25 is at rest at the first support position PH in the first taking step.

<Step S25> Reversing Step

The reversing mechanism 26 inverts a substrate W.

Figure 22A:
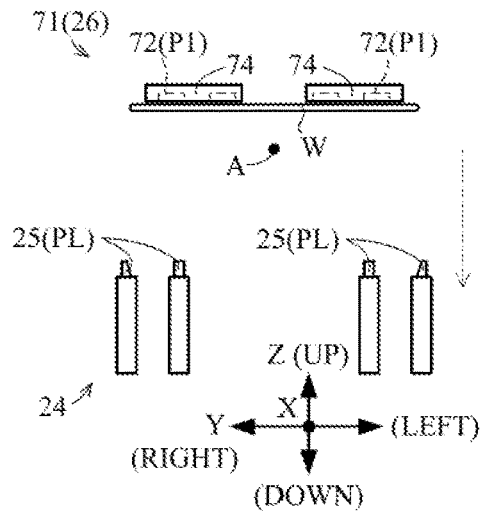
FIG. 22(a) is a front view schematically illustrating an exemplary operation of a reversing step.
Figure 22B:
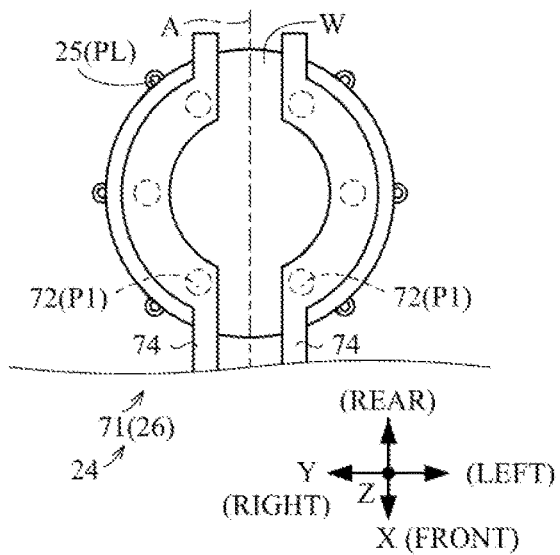
FIG. 22(b) is a plan view schematically illustrating the exemplary operation of the reversing step.
Figure 23A:
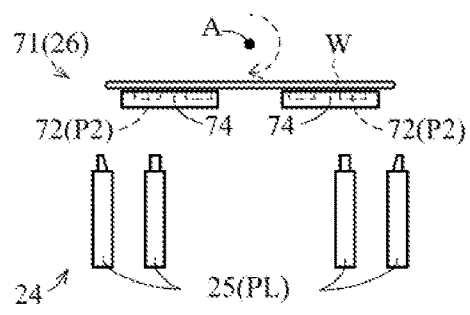
FIG. 23(a) is a front view schematically illustrating an exemplary operation of the reversing step and a second supporting step.
Figure 23B:
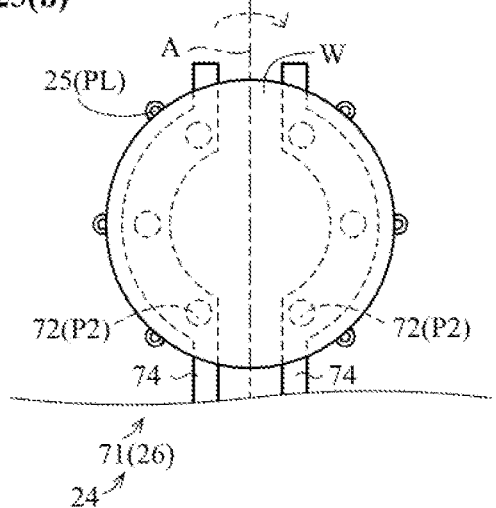
FIG. 23(b) is a plan view schematically illustrating the exemplary operation of the reversing step and the second supporting step.

FIGS. 22(a) and 22(b), and 23(a) and 23(b) are each schematically illustrating an exemplary operation of the reversing step. FIGS. 22(a) and 23(a) are each a partial front view of the inversion unit 24. FIGS. 22(b) and 23(b) are each a partial plan view of the inversion unit 24.

Reference is now made to FIGS. 22(a) and 22(b). The second suction portion 72 is located above the substrate W. The second suction portion 72 sucks the substrate W. The substrate W is in a horizontal posture. The lifting drive unit 67 moves the supporting portion 25 from the first support position PH to the second support position PL.

Reference is now made to FIGS. 23(a) and 23(b). The supporting portion 25 is located at the second support position PL. The rotation driving unit 82 rotates the second suction portion 72 around the rotation axis A. The second suction portion 72 half-rotates while sucking the substrate W. The second suction portion 72 rotates by 180 degrees while sucking the substrate W. The second suction portion 72 moves from the first position P1 to the second position P2 while sucking the substrate W. The substrate W sucked by the second suction portion 72 also rotates around the rotation axis A. The substrate W is reversed.

When the substrate W is reversed, the second suction portion 72 is moved from a position above the substrate W to a position below the substrate W. When the substrate W is reversed, the face of the substrate W sucked by the second suction portion 72 changes from the top face WT to the back face WB.

When the second suction portion 72 is located at the second position P2, the second suction portion 72 is located below the substrate W. The substrate W is in a horizontal posture.

<Step S26: Second Supporting Step>

The reversing mechanism 26 delivers the substrate W to the supporting portion 25. The supporting portion 25 receives the substrate W from the reversing mechanism 26. The supporting portion 25 supports the substrate W in a horizontal posture.

Reference is now made to FIGS. 23(a) and 23(b). The second suction portion 72 stays at the second position P2. The second suction portion 72 stops sucking the substrate W. Specifically, the suction adjusting unit 76 stops supplying gas to the second suction portion 72. The second suction portion 72 stops blow of gas. The substrate W is brought into a state of merely being placed on the hand 71 (contact portion 77). The substrate W is in a horizontal posture. The second suction portion 72 allows the substrate W to move upward.

Figure 24A:
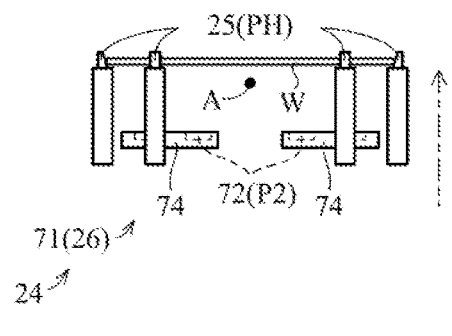
FIG. 24(a) is a front view schematically illustrating an exemplary operation of the second supporting step.
Figure 24B:
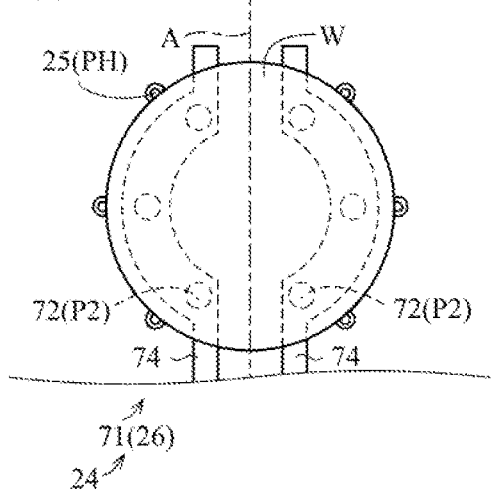
FIG. 24(b) is a plan view schematically illustrating the exemplary operation of the second supporting step.

FIGS. 24(a) and 24(b) each schematically illustrate an exemplary operation of the second supporting step. FIG. 24(a) is a partial front view of the inversion unit 24. FIG. 24(b) is a partial plan view of the inversion unit 24.

The second suction portion 72 is located at the second position P2. The second suction portion 72 is located below the substrate W. The second suction portion 72 does not suck the substrate W. The lifting drive unit 67 moves the supporting portion 25 from the second support position PL to the first support position PH. The supporting portion 25 contacts the substrate W on the hand 71. Moreover, the supporting portion 25 lifts the substrate W upward. The substrate W moves upward with respect to the reversing mechanism 26. The substrate W separates from the reversing mechanism 26. The reversing mechanism 26 passes the substrate W to the supporting portion 25.

The position adjusting unit 65 adjusts a position of the substrate W in the horizontal direction, which illustration is omitted. Specifically, the slope face 65a contacts the edge of the substrate W and guides the substrate W to a given position.

The supporting portion 25 supports the substrate W at the first support position PH. The substrate W is in a horizontal posture.

In the second supporting step, the second suction portion 72 is at rest at the second position P2. That is, the second suction portion 72 stays below the substrate W in the second supporting step. When the supporting portion 25 is located at the first support position PH, the supporting portion 25 surrounds the second suction portion 72 laterally.

<Step S27> Second Substrate Detecting Step

The substrate detector 69 detects a substrate W. The substrate detector 69 outputs the detection results of the substrate detector 69 to the controller 29. The controller 29 determines whether or not the substrate W is placed at a predetermined position in accordance with the detection results of the substrate detector 69. If the controller 29 determines that the substrate W is placed at the predetermined position, the process proceeds to Step S28. If the controller 29 does not determine that the substrate W is placed at the predetermined position, the process does not proceed to Step S28. In this case, an abnormal process is executed. The abnormal process includes, for example, informing a user that an abnormality has occurred.

<Step S28: Second Taking Step>

The supporting portion 25 delivers a substrate W to the transport mechanism 23. The transport mechanism 23 takes the substrate W from the supporting portion 25.

Figure 25A:
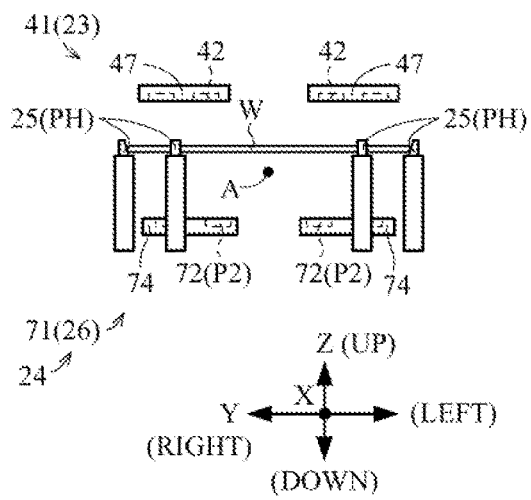
FIG. 25(a) is a front view schematically illustrating an exemplary operation of a second taking step.
Figure 25B:
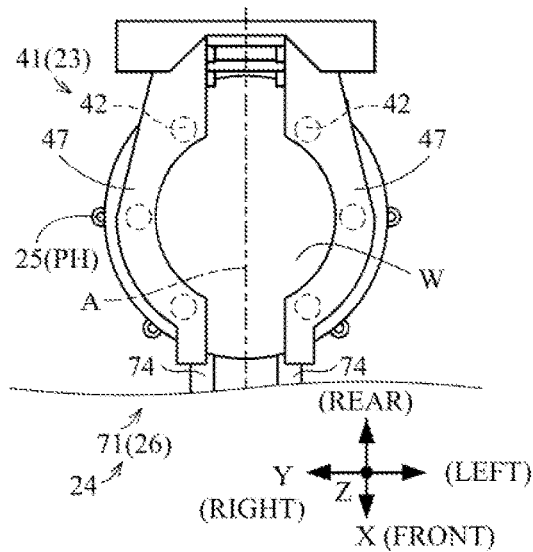
FIG. 25(b) is a plan view schematically illustrating the exemplary operation of the second taking step.
Figure 26A:
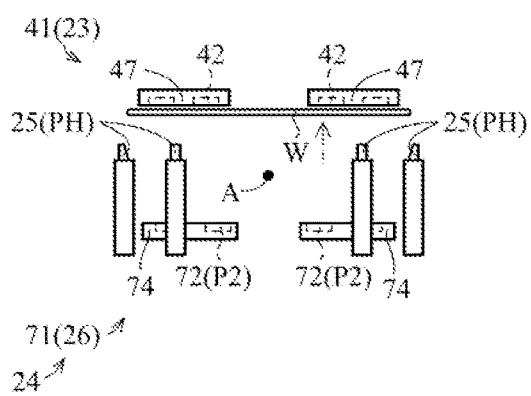
FIG. 26(a) is a front view schematically illustrating an exemplary operation of the second taking step.
Figure 26B:
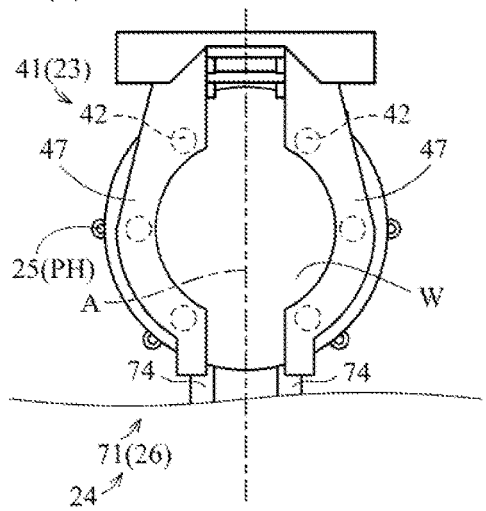
FIG. 26(b) is a plan view schematically illustrating the exemplary operation of the second taking step.

FIGS. 25(a), 25(b), 26(a), and 26(b) each schematically illustrate an exemplary operation of the second taking step. FIGS. 25(a) and 26(a) are each a partial front view of the inversion unit 24 and the transport mechanism 23. FIGS. 25(b) and 26(b) are each a partial plan view of the inversion unit 24 and the transport mechanism 23.

Reference is now made to FIGS. 25(a) and 25(b). The supporting portion 25 supports the substrate W at the first support position PH. The second suction portion 72 stays at the second position P2. The first suction portion 42 moves to a position above the supporting portion 25 while not sucking the substrate W. The first suction portion 42 is located above the substrate W supported by the supporting portion 25.

Reference is now made to FIGS. 26(a) and 26(b). The first suction portion 42 starts sucking the substrate W. The first suction portion 42 sucks the substrate W, supported by the supporting portion 25, upward. The substrate W floats upward from the supporting portion 25. The substrate W separates from the supporting portion 25. The supporting portion 25 passes the substrate W to the transport mechanism 23 at the first support position PH. The transport mechanism 23 supports the substrate W. The substrate W is in a horizontal posture.

The supporting portion 25 is at rest at the first support position PH in the second taking step. In the second taking step, the second suction portion 72 is at rest at the second position P2.

The second suction portion 72 is at rest at the second position P2 during a period from the second supporting step to the second taking step. The second suction portion 72 does not move from when the reversing mechanism 26 delivers the substrate W to the supporting portion 25 until when the supporting portion 25 delivers the substrate W to the transport mechanism 23. The supporting portion 25 surrounds the second suction portion 72 laterally from when the reversing mechanism 26 delivers the substrate W to the supporting portion 25 until when the supporting portion 25 delivers the substrate W to the transport mechanism 23.

<Step S29: Unloading Step>

The first suction portion 42 moves apart from the position above the supporting portion 25 while sucking the substrate W.

Figure 27A:
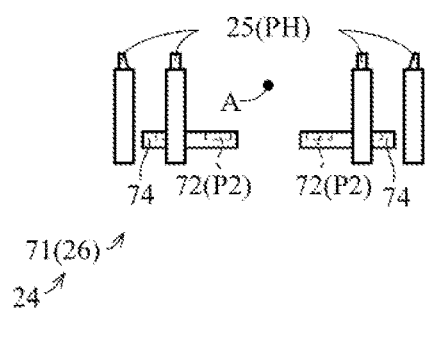
FIG. 27(a) is a front view schematically illustrating an exemplary operation of an unloading step.
Figure 27B:
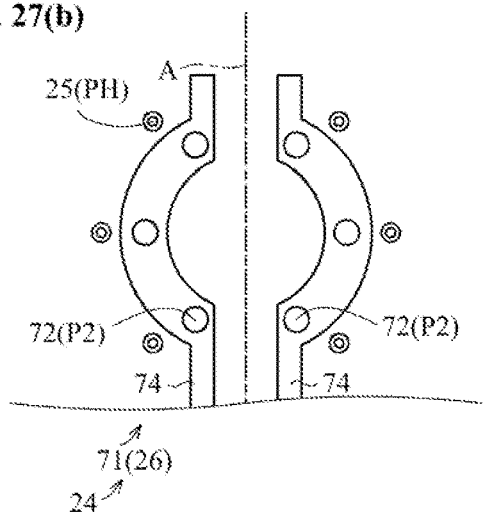
FIG. 27(b) is a plan view schematically illustrating the exemplary operation of the unloading step.

Reference is now made to FIGS. 26(a), 26(b), 27(a), and 27(b). FIGS. 27(a) and 27(b) each schematically illustrate an exemplary operation of the unloading step. FIG. 27(a) is a partial front view of the inversion unit 24. FIG. 27(b) is a partial plan view of the inversion unit 24. For example, the transport mechanism 23 unloads the substrate W from the inversion unit 24. Specifically, the first suction portion 42 and the substrate W move from inside of the housing 61 to outside of the housing 61. Moreover, the transport mechanism 23 transports the substrate W to the treating unit 28 or the substrate platform 27.

The following again describes the above second taking step and the unloading step with reference to FIGS. 28(a) to 28(h). FIGS. 28(a) to 28(h) are each a side view schematically illustrating an exemplary operation of the second taking step and the unloading step.

Figure 28A:
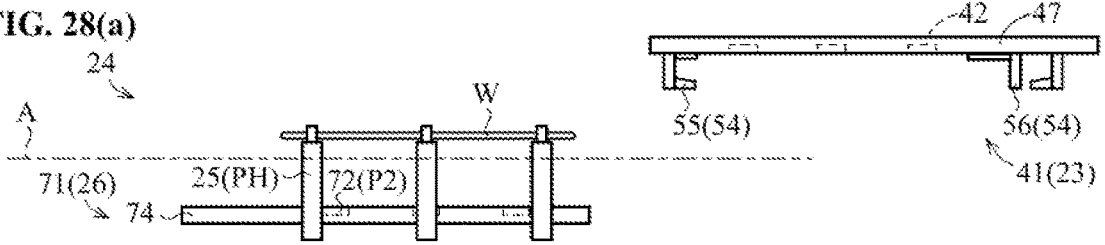
FIGS. 28(a) to 28(h) are each a side view schematically illustrating an exemplary operation of the second taking step and the unloading step.

Reference is now made to FIG. 28(a). The hand 41 is located more rearward than the supporting portion 25. The first suction portion 42 does not suck a substrate W. The receiver 44 is located at the retreating position. The supporting portion 25 is located at the first support position PH. The supporting portion 25 supports a substrate W. The substrate W is in a horizontal posture. The second suction portion 72 is located at the second position P2. Moreover, the second suction portion 72 does not suck a substrate W.

Figure 28B:
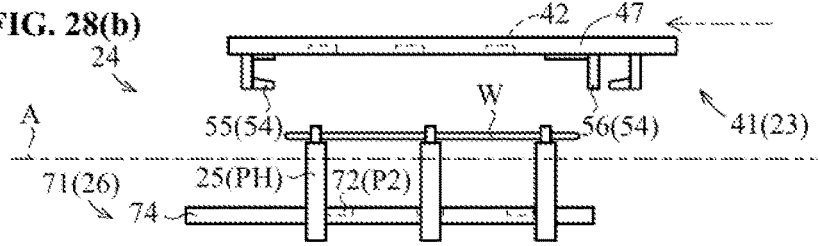

Reference is now made to FIG. 28(b). The first suction portion 42 moves to the supporting portion 25. The first suction portion 42 is positioned above the supporting portion 25. The first suction portion 42 is located above the substrate W supported by the supporting portion 25. The receiver 44 is positioned higher than the supporting portion 25. The receiver 54 does not overlap the substrate W supported by the supporting portion 25 in plan view. The first receiver 55 is positioned more forward than the substrate W supported by the supporting portion 25. The second receiver 56 is positioned more rearward than the substrate W supported by the supporting portion 25.

Figure 28C:
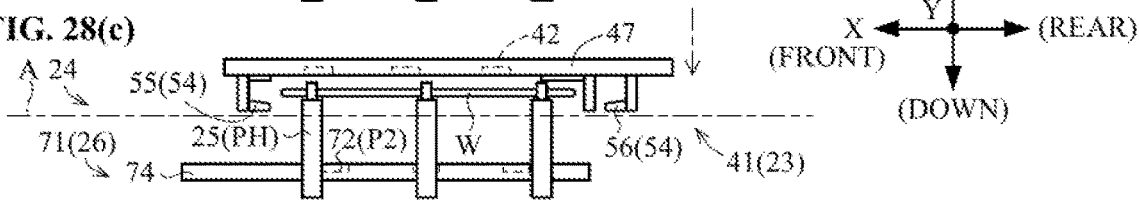

Reference is now made to FIG. 28(c). The hand 41 moves slightly downward. The receiver 54 moves from a position higher than the substrate W supported by the supporting portion 25 to a position lower than the substrate W supported by the supporting portion 25. The receiver 54 moves downward to a position lower than the upper end of the supporting portion 25. The substrate W supported by the supporting portion 25 passes between the first receiver 55 and the second receiver 56. The first suction portion 42 approaches the top face WT of the substrate W supported by the supporting portion 25.

Figure 28D:
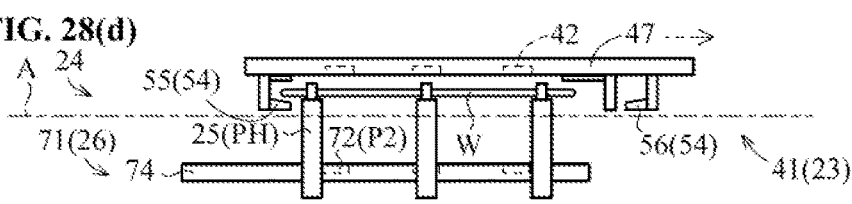

Reference is now made to FIG. 28(d). The hand 41 moves slightly rearward. The first receiver 55 and the second receiver 56 move rearward. As a result, the first receiver 55 is positioned below the substrate W supported by the supporting portion 25. The first receiver 55 overlaps the substrate W supported by the supporting portion 25 in plan view.

Figure 28E:
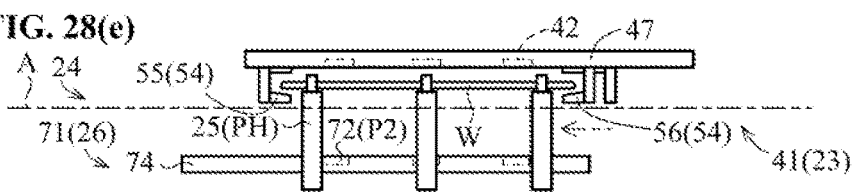

Reference is now made to FIG. 28(e). The receiver 54 moves to the drop-preventing position. Specifically, the second receiver 56 approaches the first receiver 55. The second receiver 56 moves forward. As a result, the second receiver 56 is positioned below the substrate W supported by the supporting portion 25 in plan view. Both the first receiver 55 and the second receiver 56 overlap the substrate W supported by the supporting portion 25 in plan view.

Figure 28F:
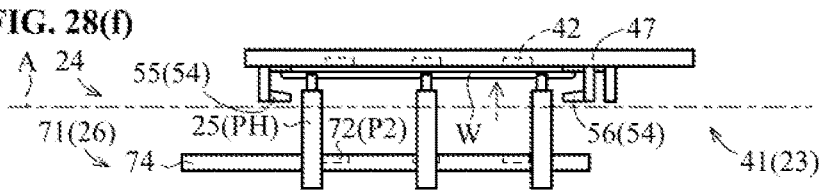

Reference is now made to FIG. 28(f). The first suction portion 42 is located above the substrate W supported by the supporting portion 25. The first suction portion 42 starts sucking the substrate W. Specifically, the first suction portion 42 blows gas to the top face WT. The first suction portion 42 causes gas to flow over the top face WT of the substrate W and sucks the substrate W upward. The substrate W floats upward from the supporting portion 25. The substrate W separates from the supporting portion 25. The supporting portion 25 delivers the substrate W to the transport mechanism 23 at the first support position PH. The transport mechanism 23 receives the substrate W from the supporting portion 25. The transport mechanism 23 supports the substrate W. The substrate W is in a horizontal posture.

Figure 28G:
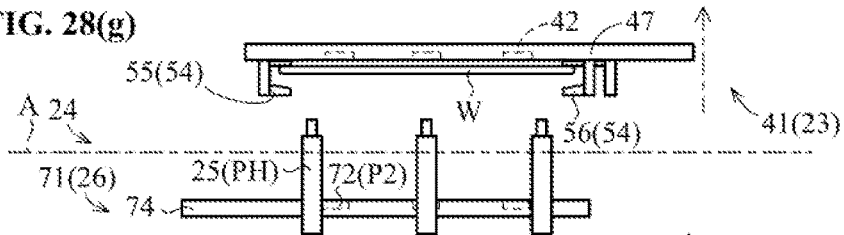

Reference is now made to FIG. 28(g). The hand 41 moves upward while the first suction portion 42 sucks the substrate W. The receiver 54 moves from a position lower than the upper end of the supporting portion 25 to a position higher than the upper end of the supporting portion 25.

Figure 28H:
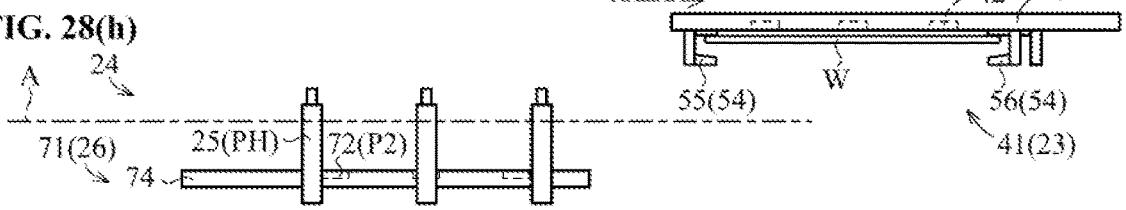

Reference is now made to FIG. 28(h). The hand 41 moves rearward. The first suction portion 42 moves apart from the position above the supporting portion 25 while sucking the substrate W.

As described above, the supporting portion 25 is at rest at the first support position PH in the second taking step. In the second taking step, the second suction portion 72 is at rest at the second position P2. Also in the unloading step, the supporting portion 25 is at rest at the first support position PH. Also in the unloading step, the second suction portion 72 is at rest at the second position P2.

<Step S30: Retreating Step>

The retreating step is performed after the second taking step. That is, the retreating step is performed after the supporting portion 25 delivers a substrate W to the transport mechanism 23. In the retreating step, the second suction portion 72 moves from the second position P2 to the third position P3. Specifically, the second suction portion 72 moves from the second position P2 to the first position P1. Subsequently, the second suction portion 72 moves from the first position P1 to the third position P3. The retreating step includes a lowering step, a first moving step, a second moving step, and a raising step. The first moving step is performed after the lowering step. The second moving step and the raising step are performed after the first moving step.

<Step S31: Lowering Step>

Figure 29A:
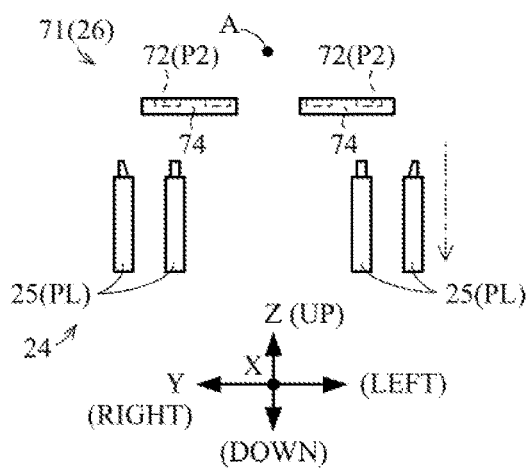
FIG. 29(a) is a front view schematically illustrating an exemplary operation of a lowering step.
Figure 29B:
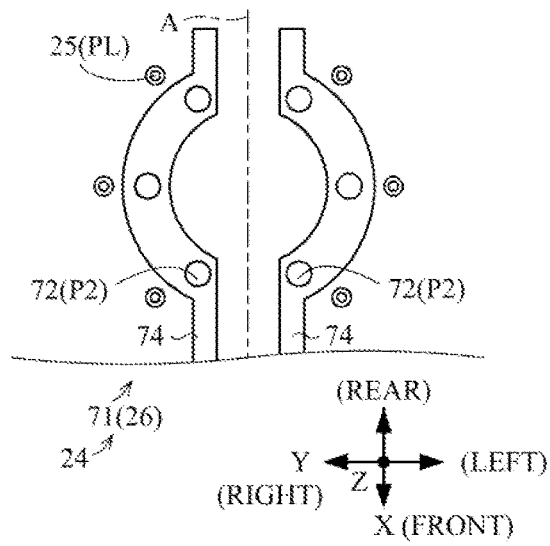
FIG. 29(b) is a plan view schematically illustrating the exemplary operation of the lowering step.

Reference is now made to FIGS. 29(a) and 29(b). FIG. 29(a) is a front view schematically illustrating an exemplary operation of the lowering step. FIG. 29(b) is a plan view schematically illustrating an exemplary operation of the lowering step. The second suction portion 72 is located at the second position P2. Moreover, the second suction portion 72 does not suck a substrate W. The supporting portion 25 does not support a substrate W. The supporting portion 25 moves from the first support position PH to the second support position PL.

<Step S32: First Moving Step>

Figure 30A:
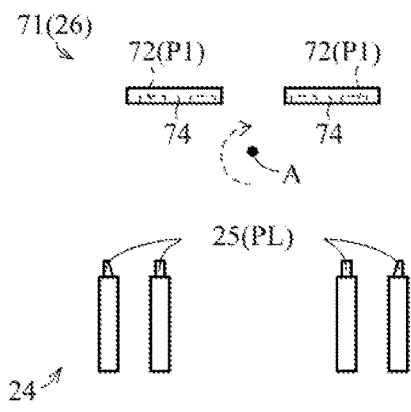
FIG. 30(a) is a front view schematically illustrating an exemplary operation of a first moving step.
Figure 30B:
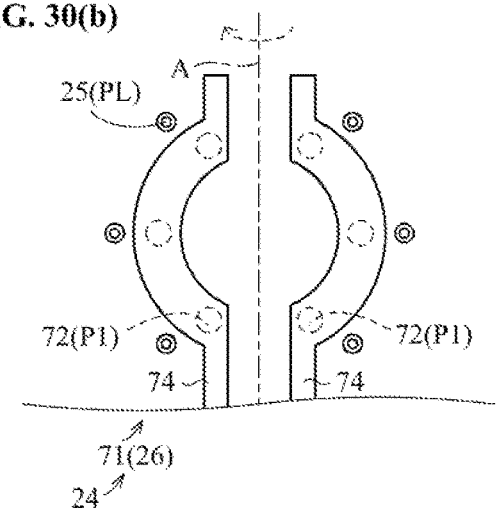
FIG. 30(b) is a plan view schematically illustrating the exemplary operation of the first moving step.

Reference is now made to FIGS. 30(a) and 30(b). FIG. 30(a) is a side view schematically illustrating an exemplary operation of the first moving step. FIG. 30(b) is a plan view schematically illustrating an exemplary operation of the first moving step. The supporting portion 25 is located at the second support position PL. The second suction portion 72 rotates around the rotation axis A. The second suction portion 72 moves from the second position P2 to the first position P1.

<Step S33: Second Moving Step>

Figure 31A:
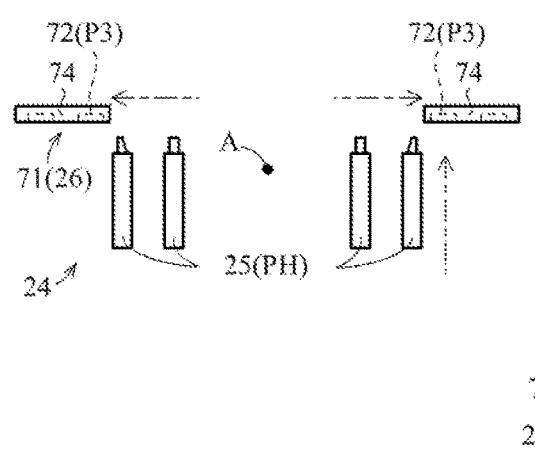
FIG. 31(a) is a front view schematically illustrating an exemplary operation of the second moving step and a raising step.
Figure 31B:
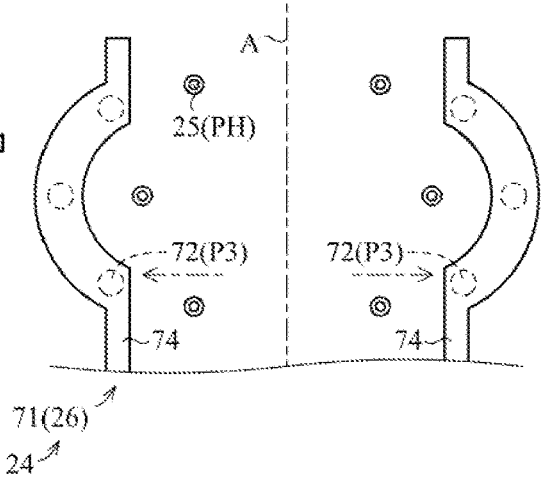
FIG. 31(b) is a plan view schematically illustrating the exemplary operation of the second moving step and the raising step.

Reference is made to FIGS. 31(a) and 31(b). FIG. 31(a) is a front view schematically illustrating an exemplary operation of the second moving step and the raising step. FIG. 31(b) is a plan view schematically illustrating an exemplary operation of the second moving step and the raising step. The second suction portion 72 moves from the first position P1 to the third position P3.

<Step S34: Raising Step>

Reference is made to FIGS. 31(a) and 31(b). The supporting portion 25 moves from the second support position PL to the first support position PH.

Here, a period of the raising step may fall on a period of the second moving step. For example, the raising step and the second moving step may be performed at the same time. Alternatively, a period of the raising step may not fall on a period of the second moving step. For example, the raising step may be performed after the second moving step. For example, the second moving step may be performed after the raising step.

After the retreating step, the procedure returns to step S21 and a transporting step is performed.

Effect of Embodiment

The substrate treating apparatus 1 includes the transport mechanism 23 configured to transport the substrates W. The transport mechanism 23 includes the first suction portion 42. The first suction portion 42 sucks the substrate W without contacting the substrate W. Accordingly, the transport mechanism 23 can support the substrate W suitably. For example, the transport mechanism 23 can support the substrate W suitably even if the substrate W is easy to bend. For example, the transport mechanism 23 can support the substrate W suitably even if the substrate W itself has relatively small rigidity.

The transport mechanism 23 includes the hand driving unit 45. The hand driving unit 45 moves the first suction portion 42. Accordingly, the transport mechanism 23 can suitably transport the substrate W sucked by the first suction portion 42.

The substrate treating apparatus 1 includes the reversing mechanism 26. The reversing mechanism 26 includes the second suction portion 72. The second suction portion 72 sucks the substrate W without contacting the substrate W. Accordingly, the reversing mechanism 26 can support the substrate W suitably. For example, the reversing mechanism 26 can support the substrate W suitably even if the substrate W is easy to bend. For example, the reversing mechanism 26 can support the substrate W suitably even if the substrate W itself has relatively small rigidity.

The reversing mechanism 26 includes the rotation driving unit 82. The rotation driving unit 82 rotates the second suction portion 72 around the rotation axis A. Accordingly, the reversing mechanism 26 can suitably reverse the substrate W sucked by the second suction portion 72.

The substrate treating apparatus 1 includes the supporting portion 25. The supporting portion 25 contacts and supports the substrate W. The transport mechanism 23 transports a substrate W to the supporting portion 25. The reversing mechanism 26 receives the substrate W from the supporting portion 25. As described above, the transport mechanism 23 does not directly deliver the substrate W to the reversing mechanism 26 when transporting the substrate W to the reversing mechanism 26. The transport mechanism 23 indirectly delivers the substrate W via the supporting portion 25 to the reversing mechanism 26 when transporting the substrate W to the reversing mechanism 26. Accordingly, the second suction portion 72 can suitably suck the substrate W supported by the supporting portion 25. Consequently, the reversing mechanism 26 can receive the substrate W from the supporting portion 25 suitably.

The supporting portion 25 supports the substrate W in a horizontal posture. Accordingly, the second suction portion 72 can more suitably suck the substrate W supported by the supporting portion 25. Consequently, the reversing mechanism 26 can receive the substrate W from the supporting portion 25 more suitably.

When the transport mechanism 23 transports a substrate W to the supporting portion 25, the first suction portion 42 is positioned above the substrate W. Accordingly, the transport mechanism 23 can deliver the substrate W to the supporting portion 25 suitably.

When the reversing mechanism 26 receives the substrate W from the supporting portion 25, the second suction portion 72 is located above the substrate W supported by the supporting portion 25 and sucks the substrate W upward while causing gas to flow along the top face WT of the substrate W. Consequently, the reversing mechanism 26 can receive the substrate W from the supporting portion 25 suitably.

As described above, the substrate treating apparatus 1 can reverse the substrate W suitably.

The supporting portion 25 includes the position adjusting unit 65. The position adjusting unit 65 adjusts a position of the substrate W in the horizontal direction. Accordingly, when the supporting portion 25 supports the substrate W, the substrate W is located at an appropriate position. Consequently, the second suction portion 72 can suitably suck the substrate W supported by the supporting portion 25. The reversing mechanism 26 can receive the substrate W from the supporting portion 25 suitably.

Since the supporting portion 25 includes the position adjusting unit 65, the first suction portion 42 can also suitably suck the substrate W supported by the supporting portion 25. Consequently, the transport mechanism 23 can receive the substrate W from the supporting portion 25 suitably.

As described above, the first suction portion 42 and the second suction portion 72 suck a substrate W without contacting the substrate W. Accordingly, it is particularly important for the first suction portion 42 and the second suction portion 72 that the substrate W be located at the appropriate position when the first suction portion 42 and the second suction portion 72 suck a substrate W.

The position adjusting unit 65 include the slope face 65a. The slope face 65a contacts the edge of the substrate W. The slope face 65a is inclined downward and radially inward of the substrate W supported by the supporting portion 25. Accordingly, the position adjusting unit 65 can guide the substrate W to a given position suitably.

When the reversing mechanism 26 reverses the substrate W, the second suction portion 72 is moved from a position above the substrate W to a position below the substrate W. Accordingly, the reversing mechanism 26 can reverse the substrate W suitably.

When the reversing mechanism 26 delivers the substrate W to the supporting portion 25, the second suction portion 72 is positioned below the substrate W and does not suck the substrate W. Accordingly, when the reversing mechanism 26 delivers the substrate W to the supporting portion 25, the reversing mechanism 26 allows the substrate W to move upward with respect to the reversing mechanism 26. Accordingly, the reversing mechanism 26 can deliver the substrate W to the supporting portion 25 suitably.

The second suction portion 72 is at rest from when the reversing mechanism 26 delivers the substrate W to the supporting portion 25 until when the supporting portion 25 delivers the substrate W to the transport mechanism 23. That is, the second suction portion 72 does not move from when the reversing mechanism 26 delivers the substrate W to the supporting portion 25 until when the supporting portion 25 delivers the substrate W to the transport mechanism 23. Accordingly, the supporting portion 25 can deliver the substrate W to the transport mechanism 23 rapidly after the reversing mechanism 26 delivers the substrate W to the supporting portion 25. That is, a period from when the reversing mechanism 26 delivers the substrate W to the supporting portion 25 until when the supporting portion 25 delivers the substrate W to the transport mechanism 23 can be shortened easily. This achieves suitably enhanced throughput of the substrate treating apparatus 1. For example, the number of substrates W capable of undergoing treatment per unit time by the substrate treating apparatus 1 can be increased suitably.

The rotation driving unit 82 moves the second suction portion 72 to the first position P1 by rotating the second suction portion 72 around the rotation axis A. When the second suction portion 72 is located at the first position P1, the second suction portion 72 blows gas downward. Accordingly, when the second suction portion 72 is located at the first position P1, the second suction portion 72 can suitably suck the substrate W, located below the second suction portion 72, upward.

The rotation driving unit 82 moves the second suction portion 72 to the second position P2 by rotating the second suction portion 72 around the rotation axis A. When the second suction portion 72 is located at the second position P2, the second suction portion 72 blows gas upward. Accordingly, when the second suction portion 72 is located at the second position P2, the second suction portion 72 can suitably suck the substrate W, located above the second suction portion 72, downward.

The rotation axis A is located at a position lower than the second suction portion 72 at the first position P1. Accordingly, the second suction portion 72 at the first position P1 is located at a position higher than the second suction portion 72 at the second position P2. Consequently, when the second suction portion 72 is located at the first position P1, the second suction portion 72 can be located above the substrate W easily. As a result, when the second suction portion 72 is located at the first position P1, the reversing mechanism 26 can suitably receive the substrate W from the supporting portion 25.

On the other hand, the second suction portion 72 at the second position P2 is located at a position lower than the second suction portion 72 at the first position P1. Consequently, when the second suction portion 72 is located at the second position P2, the second suction portion 72 can be located below the substrate W easily. As a result, when the second suction portion 72 is located at the second position P2, the reversing mechanism 26 can suitably deliver the substrate W to the supporting portion 25.

The second suction portion 72 is moved from the first position P1 to the second position P2, whereby the reversing mechanism 26 reverses the substrate W while lowering the height position of the substrate W. Consequently, when the second suction portion 72 is located at the second position P2, the reversing mechanism 26 can deliver the substrate W to the supporting portion 25 more easily.

When the reversing mechanism 26 delivers the substrate W to the supporting portion 25, the second suction portion 72 is located at the second position P2 and does not suck the substrate W. Accordingly, when the reversing mechanism 26 delivers the substrate W to the supporting portion 25, the reversing mechanism 26 allows the substrate W to move upward with respect to the reversing mechanism 26. Consequently, the reversing mechanism 26 can deliver the substrate W to the supporting portion 25 suitably.

The second suction portion 72 is kept at the second position P2 from when the reversing mechanism 26 delivers the substrate W to the supporting portion 25 until when the supporting portion 25 delivers the substrate W to the transport mechanism 23. Accordingly, the supporting portion 25 can deliver the substrate W to the transport mechanism 23 rapidly after the reversing mechanism 26 delivers the substrate W to the supporting portion 25. This achieves suitably enhanced throughput of the substrate treating apparatus 1.

When the second suction portion 72 is located at the first position P1, the second suction portion 72 is located more radially inward of the substrate W supported by the supporting portion 25 than the supporting portion 25 in plan view. Accordingly, the second suction portion 72 can apply an upward force to the central portion of the substrate W. As a result, the second suction portion 72 can suck the substrate W more suitably.

When the second suction portion 72 is located at the second position P2, the second suction portion 72 is located more radially inward of the substrate W supported by the supporting portion 25 than the supporting portion 25 in plan view. Accordingly, the second suction portion 72 can apply a downward force to the central portion of the substrate W. As a result, the second suction portion 72 can suck the substrate W more suitably.

The substrate treating apparatus 1 provided with the second suction portion 72 needs especially a long time for retreating the second suction portion 72. That is because, when the second suction portion 72 is located at the second position P2, the second suction portion 72 is located more radially inward of the substrate W supported by the supporting portion 25 than the supporting portion 25 in plan view. Accordingly, a movement distance between the second position P2 and the third position P3 is relatively long, for example. A movement time of the second suction portion 72 between the second position P2 and the third position P3 is relatively long, for example. If the second suction portion 72 retreats from the second position P2 before the supporting portion 25 delivers the substrate W to the transport mechanism 23, a timing should be delayed remarkably when the supporting portion 25 delivers the substrate W to the transport mechanism 23. As described above in the present embodiment, the second suction portion 72 is kept at the second position P2 from when the reversing mechanism 26 delivers the substrate W to the supporting portion 25 until when the supporting portion 25 delivers the substrate W to the transport mechanism 23. Accordingly, this can appropriately suppress delay in timing at which the supporting portion 25 delivers the substrate W to the transport mechanism 23. Such an effect is particularly large for the substrate treating apparatus 1 provided with the second suction portion 72.

Here in the present embodiment, the supporting portion 25 is located laterally of the second suction portion 72 from when the reversing mechanism 26 delivers the substrate W to the supporting portion 25 until when the supporting portion 25 delivers the substrate W to the transport mechanism 23. Accordingly, the second suction portion 72 is prohibited from retreating from the second position P2 from when the reversing mechanism 26 delivers the substrate W to the supporting portion 25 until when the supporting portion 25 delivers the substrate W to the transport mechanism 23. That is because the second suction portion 72 may interfere with the supporting portion 25. Moreover, the second suction portion 72 is located below the substrate W supported by the supporting portion 25 from when the reversing mechanism 26 delivers the substrate W to the supporting portion 25 until when the supporting portion 25 delivers the substrate W to the transport mechanism 23. Accordingly, the supporting portion 25 is prohibited from moving downward from the first support position P1 from when the reversing mechanism 26 delivers the substrate W to the supporting portion 25 until when the supporting portion 25 delivers the substrate W to the transport mechanism 23. That is because the substrate W supported by the supporting portion 25 may interfere with the second suction portion 72.

The substrate treating apparatus 1 includes the lifting drive unit 67. The lifting drive unit 67 moves the supporting portion 25 between the first support position PH and the second support position PL. The second support position PL is lower than the first support position PH. Accordingly, the supporting portion 25 can move upward and downward suitably.

When the second suction portion 72 is located at the first position P1, the second suction portion 72 is positioned higher than the substrate WPH. Consequently, when the second suction portion 72 is located at the first position P1, the second suction portion 72 can be located above the substrate WPH easily. As a result, when the second suction portion 72 is located at the first position P1, the reversing mechanism 26 can receive the substrate W from the supporting portion 25 easily.

The height position of the substrate WP2 is lower than the height position of the substrate WPH and higher than the height position of the substrate WPL. Accordingly, when the second suction portion 72 is located at the second position P2, the supporting portion 25 can suitably receive the substrate W from the reversing mechanism 26 by moving from the second support position PL to the first support position PH. That is, when the second suction portion 72 is located at the second position P2, the reversing mechanism 26 can suitably deliver the substrate W to the supporting portion 25.

When the transport mechanism 23 delivers the substrate W to the supporting portion 25, the supporting portion 25 is located at the first support position PH. When the reversing mechanism 26 receives the substrate W from the supporting portion 25, the supporting portion 25 is located at the first support position PH. When the reversing mechanism 26 reverses the substrate W, the supporting portion 25 is located at the second support position PL. When the reversing mechanism 26 delivers the substrate W to the supporting portion 25, the supporting portion 25 moves from the second support position PL to the first support position PH. In such a manner as above, the supporting portion 25 is only located at two positions (specifically, first support position PH and second support position PL). In other words, the lifting drive unit 67 does not necessarily move the supporting portion 25 to three or more positions. Specifically, the lifting drive unit 67 does not necessarily move the supporting portion 25 to a position except the first support position PH and the second support position PL. For example, the lifting drive unit 67 does not necessarily move the supporting portion 25 to a position higher than the first support position PH. For example, the lifting drive unit 67 does not necessarily move the supporting portion 25 to a position lower than the second support position PL. This achieves a simplified configuration of the lifting drive unit 67. For example, the lifting drive unit 67 can be realized without any electric motor, for example. In addition, operation of the supporting portion 25 can be simplified.

Moreover, when the transport mechanism 23 receives the substrate W from the supporting portion 25, the supporting portion 25 is located at the first support position PH. This achieves a more simplified configuration of the lifting drive unit 67. Operation of the supporting portion 25 can be much simplified.

The reversing mechanism 26 includes the movement driving unit 84. The movement driving unit 84 moves the second suction portion 72 from the first position P1 to the third position P3. Here, the third position P3 is a position of the second suction portion 72 where the second suction portion 72 does not interfere with the transport mechanism 23. When the transport mechanism 23 delivers the substrate W to the supporting portion 25, the second suction portion 72 is located at the third position P3. This can appropriately prevent interference of the second suction portion 72 with the transport mechanism 23 when the transport mechanism 23 delivers the substrate W to the supporting portion 25.

When the second suction portion 72 is located at the third position P3, the second suction portion 72 is located more radially outward of the substrate W supported by the supporting portion 25 than the supporting portion 25 in plan view. This can ensure that interference of the second suction portion 72 with the transport mechanism 23 is prevented when the second suction portion 72 is located at the third position P3. This can also ensure that interference of the second suction portion 72 with the supporting portion 25 is prevented when the second suction portion 72 is located at the third position P3.

The reversing mechanism 26 includes the first branch 74A and the second branch 74B. The first branch 74A is coupled to the movement driving unit 84. The second branch 74B is coupled to the movement driving unit 84. The second suction portion 72 includes a third suction portion 72A and a fourth suction portion 72B. The third suction portion 72A is held by the first branch 74A. The fourth suction portion 72B is held by the second branch 74B. The movement driving unit 84 widens and narrows a gap between the first branch 74A and the second branch 74B. The movement driving unit 84 increases the gap between the first branch 74A and the second branch 74B, thereby moving the second suction portion 72 from the first position P1 to the third position P3. In such a manner as above, the movement driving unit 84 changes relative positions of the third suction portion 72A and the fourth suction portion 72B. This can effectively retreat the third suction portion 72A and the fourth suction portion 72B individually. That is, this can appropriately suppress a moving amount of the second suction portion 72 when the second suction portion 72 is moved from the first position P1 to the third position P3. Accordingly, the movement driving unit 84 can move the second suction portion 72 from the first position P1 to the third position P3 easily. Moreover, this can effectively decrease a movable area of the second suction portion 72 when the second suction portion 72 is moved from the first position P1 to the third position P3. This allows appropriate suppression in upsizing of the reversing mechanism 26.

When the second suction portion 72 is located at the first position P1, the rotation axis A is located so as to pass between the first branch 74A and the second branch 74B in plan view. Also, when the second suction portion 72 is located at the third position P3, the rotation axis A is located so as to pass between the first branch 74A and the second branch 74B in plan view. When the second suction portion 72 are moved from the first position P1 to the third position P3, the first branch 74A and the second branch 74B each move away from the rotation axis A in plan view. When the second suction portion 72 moves from the third position P3 to the first position P1, the first branch 74A and the second branch 74B each approach the rotation axis A in plan view. In such a manner as above, the movement driving unit 84 moves the third suction portion 72A and the fourth suction portion 72B individually. Specifically, the movement driving unit 84 moves the third suction portion 72A and the fourth suction portion 72B in a direction opposite to each other. For example, when the second suction portion 72 moves from the first position P1 to the third position P3, the movement driving unit 84 moves the third suction portion 72A rightward and the fourth suction portion 72B leftward. For example, when the second suction portion 72 moves from the third position P3 to the first position P1, the movement driving unit 84 moves the third suction portion 72A leftward and the fourth suction portion 72B rightward. This can suppress a moving amount of the second suction portion 72 more appropriately when the second suction portion 72 is moved between the first position P1 and the third position P3. Accordingly, the movement driving unit 84 can move the second suction portion 72 between the first position P1 and the third position P3 more easily. Moreover, this can more effectively decrease a movable area of the second suction portion 72 when the second suction portion 72 is moved from the first position P1 to the third position P3. This allows more appropriate suppression in upsizing of the reversing mechanism 26.

The distance between the first branch 74A and the second branch 74B when the second suction portion 72 rotates around the rotation axis A is smaller than the distance between the first branch 74A and the second branch 74B when the second suction portion 72 is located at the third position P3. This can effectively decrease movable areas of the second suction portion 72 and the suction holder 74 when the second suction portion 72 rotates around the rotation axis A. This allows appropriate suppression in upsizing of the reversing mechanism 26.

The substrate reversing method for reversing a substrate includes the transporting step (Step S21). In the transporting step, the transport mechanism 23 transports the substrate to the supporting portion 25. In the transporting step, the first suction portion 42 is located above the substrate W. In the transporting step, the first suction portion 42 sucks the substrate W upward by causing gas to flow over the top face WT of the substrate W. Consequently, the transport mechanism 23 can support the substrate W appropriately in the transporting step.

In the transporting step, the first suction portion 42 moves to the supporting portion 25 while sucking the substrate W. Consequently, the transport mechanism 23 can transport the substrate W appropriately to the supporting portion 25 in the transporting step.

The substrate reversing method includes the first supporting step (Step S22). The first supporting step is performed after the transporting step. In the first supporting step, the supporting portion 25 receives the substrate W from the transport mechanism 23. As described above, the first suction portion 42 is located above the substrate W in the transporting step. Accordingly, in the first supporting step, the supporting portion 25 can receive the substrate from the transport mechanism 23 appropriately.

The substrate reversing method includes the first taking step (Step S24). The first taking step is performed after the first supporting step. In the first taking step, the reversing mechanism 26 takes the substrate W from the supporting portion 25. In the first taking step, the second suction portion 72 is located at the first position P1. That is, the second suction portion 72 is positioned above the substrate W supported by the supporting portion 25. In the first taking step, the second suction portion 72 sucks the substrate W upward by causing gas to flow over the top face WT of the substrate W. Accordingly, in the first taking step, the reversing mechanism 26 can take the substrate W from the supporting portion 25 suitably.

In the first supporting step, the supporting portion 25 supports the substrate W in a horizontal posture. Accordingly, the second suction portion 72 can suitably suck the substrate W supported by the supporting portion 25 in the first taking step. Consequently, in the first taking step, the reversing mechanism 26 can take the substrate W from the supporting portion 25 suitably.

As described above, the substrate reversing method includes the first supporting step, and thus the transport mechanism 23 delivers the substrate W to the supporting portion 25 and the reversing mechanism 26 takes the substrate W from the supporting portion 25. In this manner, the reversing mechanism 26 indirectly receives the substrate W from the transport mechanism 23 via the supporting portion 25. The reversing mechanism 26 does not directly receive the substrate W from the transport mechanism 23. Consequently, the second suction portion 72 can suck the substrate W, supported by the supporting portion 25, more suitably. Consequently, in the first taking step, the reversing mechanism 26 can take the substrate W from the supporting portion 25 more suitably.

The substrate reversing method includes the reversing step (Step S25). The reversing step is performed after the first taking step. In the reversing step, the reversing mechanism 26 reverses the substrate W. In the reversing step, the second suction portion 72 half-rotates around the rotation axis A while sucking the substrate W. In the reversing step, the second suction portion 72 moves from the first position P1 to the second position P2 while the second suction portion 72 sucks the substrate W. Accordingly, the substrate W sucked by the second suction portion 72 can be reversed appropriately in the reversing step.

The substrate reversing method includes the second supporting step (Step S26). The second supporting step is performed after the reversing step. In the second supporting step, the supporting portion 25 receives the substrate W from the reversing mechanism 26. The supporting portion 25 supports the substrate W in a horizontal posture. Here in the second supporting step, the second suction portion 72 is located at the second position P2. That is, the second suction portion 72 is located below the substrate W in the second supporting step. Accordingly, in the second supporting step, the supporting portion 25 can receive the substrate W from the reversing mechanism 26 appropriately.

As described above, the substrate reversing method can reverse a substrate W suitably.

In the first supporting step, the position of the substrate W in the horizontal direction is adjusted. Accordingly, the substrate W supported by the supporting portion 25 is located at a suitable position in the first supporting step. Accordingly, the second suction portion 72 can suitably suck the substrate W supported by the supporting portion 25 in the first taking step.

The substrate reversing method includes the first substrate detecting step. In the first substrate detecting step, the substrate W supported by the supporting portion 25 is detected. The first substrate detecting step is performed after the first supporting step. Accordingly, the first substrate detecting step can check whether or not the first supporting step is completed suitably. Moreover, the first substrate detecting step is performed before the first taking step. Accordingly, before the first taking step, the first substrate detecting step can check whether or not the first taking step can be appropriately performed. As a result, the first substrate detecting step can appropriately determine whether or not the first taking step starts.

The supporting portion 25 is at rest at the first support position PH in the first supporting step. The supporting portion 25 is at rest at the first support position PH in the first taking step. In the reversing step, the supporting portion 25 moves from the first support position PH to the second support position PL. In the second supporting step, the supporting portion 25 moves from the second support position PL to the first support position PH. In such a manner as above, the supporting portion 25 is at rest only at two positions (specifically, first support position PH and second support position PL). In other words, the supporting portion 25 is not necessarily at rest at three or more positions. Specifically, the supporting portion 25 is not necessarily at rest at a position except the first support position PH and the second support position PL. This achieves simplified operation of the supporting portion 25.

When the second suction portion 72 is located at the first position P1, the second suction portion 72 is positioned higher than the substrate WPH. Accordingly, in the first taking step, the second suction portion 72 can suck the substrate WPH suitably.

The height position of the substrate WP1 is higher than the height position of the substrate WPH. Accordingly, in the first taking step, the reversing mechanism 26 can take the substrate W from the supporting portion 25 appropriately. The supporting portion 25 can deliver the substrate W to the reversing mechanism 26 appropriately at the first support position PH in the first taking step.

The height position of the rotation axis A is lower than the height position of the second suction portion 72 at the first position P1. Accordingly, the height position of the second suction portion 72 at the second position P2 is lower than the height position of the second suction portion 72 at the first position P1. That is, the height position of the second suction portion 72 is lowered as the second suction portion 72 is moved from the first position P1 to the second position P2. Here, the height position of the substrate WP2 is lower than the height position of the substrate WPH and higher than the height position of the substrate WPL. Accordingly, the reversing mechanism 26 can deliver the substrate W to the supporting portion 25 appropriately in the second supporting step. In the second supporting step, the supporting portion 25 is moved from the second support position PL to the first support position PH, thereby achieving appropriate receipt of the substrate W from the reversing mechanism 26.

The substrate reversing method includes the second taking step. The second taking step is performed after the second supporting step. In the second taking step, the transport mechanism 23 takes the substrate W from the supporting portion 25. The second suction portion 72 is at rest at the second position P2 from the second supporting step to the second taking step. Accordingly, the second taking step can start immediately after the second supporting step. This results in suitably enhanced throughput of the substrate treating apparatus 1.

In the second taking step, the first suction portion 42 is located above the substrate W supported by the supporting portion 25. The first suction portion 42 sucks the substrate W upward while causing gas to flow over the top face WT of the substrate W. Accordingly, in the second taking step, the transport mechanism 23 can take the substrate W from the supporting portion 25 suitably.

As describes above, in the second supporting step, the supporting portion 25 supports the substrate W in a horizontal posture. Accordingly, the first suction portion 42 can suitably suck the substrate W supported by the supporting portion 25 in the second taking step.

As described above, the substrate reversing method includes the second supporting step, and thus the reversing mechanism 26 delivers the substrate W to the supporting portion 25 and the transport mechanism 23 takes the substrate W from the supporting portion 25. In this manner, the transport mechanism 23 indirectly receives the substrate W from the reversing mechanism 26 via the supporting portion 25. The transport mechanism 23 does not directly receive the substrate W from the reversing mechanism 26. Consequently, the first suction portion 42 can suck the substrate W, supported by the supporting portion 25, more suitably.

In the second supporting step, the position of the substrate W in the horizontal direction is adjusted. Accordingly, the substrate W supported by the supporting portion 25 is located at a suitable position in the second supporting step. Accordingly, the first suction portion 42 can suitably suck the substrate W supported by the supporting portion 25 in the second taking step.

The substrate reversing method includes the second substrate detecting step. In the second substrate detecting step, the substrate W supported by the supporting portion 25 is detected. The second substrate detecting step is performed after the second supporting step. Accordingly, the second substrate detecting step can check whether or not the second supporting step is completed suitably. Moreover, the second substrate detecting step is performed before the second taking step. Accordingly, before the second taking step, the second substrate detecting step can check whether or not the second taking step can be performed appropriately. As a result, the second substrate detecting step can appropriately determine whether or not the second taking step starts.

The reversing step includes the retreating step. The retreating step is performed after the second taking step. Accordingly, an early timing of performing the second taking step can be achieved easily. There is no possibility that the second taking step is delayed due to the retreating step.

In the retreating step, the second suction portion 72 moves from the second position P2 to the third position P3. The third position P3 does not interfere with the transport mechanism 23. In the first supporting step, the second suction portion 72 is located at the third position. This can prevent interference of the second suction portion 72 with the transport mechanism 23 appropriately in the first supporting step.

The retreating step includes the lowering step, the first moving step, the second moving step, and the raising step. In the lowering step, the supporting portion 25 moves from the first support position PH to the second support position PL. The first moving step is performed after the retreating step. In the first moving step, the second suction portion 72 rotates around the rotation axis A, and moves from the second position P2 to the first position P1. The second moving step is performed after the first moving step. In the second moving step, the second suction portion 72 moves from the first position P1 to the third position P3. The raising step is performed after the first moving step. In the raising step, the supporting portion 25 moves from the second support position PL to the first support position PH. Accordingly, in the retreating step, the second suction portion 72 can move from the second position P2 to the third position P3 appropriately.

This invention is not limited to the foregoing examples, but may be modified as follows.

In the embodiment described above, the first branch 74A and the second branch 74B each translate in the horizontal direction orthogonal to the rotation axis A. However, the present invention is not limited to this. For example, the first branch 74A and the second branch 74B may each move pivotally. Specifically, the first branch 74A may move pivotally about a proximal end thereof on a horizontal plane. Likewise, the second branch 74B may move pivotally about a proximal end thereof on a horizontal plane. Here, the proximal end of the first branch 74A is, for example, a part of the first branch 74A connected to the hand driving unit 81. The proximal end of the second branch 74B is, for example, a part of the second branch 74B connected to the hand driving unit 81.

In the embodiment described above, the third position P3 is located at the same height position as the first position P1. However, the present invention is not limited to this. The third position P3 may be positioned higher than the first position P1.

In the embodiment described above, the suction holder 74 is connected to the movement driving unit 84 and is not connected to the rotation base 83. However, the present invention is not limited to this. The suction holder 74 may be connected to the movement driving unit 84 and the rotation base 83. For example, the suction holder 74 may be supported by the rotation base 83 so as to slide with respect to the rotation base 83. For example, the suction holder 74 may be supported by the rotation base 83 so as to swing with respect to the rotation base 83.

In the embodiment described above, the position adjusting unit 65 contacts the edge of the substrate W. However, the present invention is not limited to this. For example, the shaft 64 may contact the back face WB of the substrate W. For example, the position adjusting unit 65 may contact at least either the edge of the substrate W or the back face WB of the substrate W. For example, the position adjusting unit 65 may contact both the edge of the substrate W and the back face WB of the substrate W.

In the embodiment described above, the supporting portion 25 includes the support pins 63. However, the present invention is not limited to this. For example, the supporting portion 25 may include a shelf. Here, the shelf of the supporting portion 25 extends in horizontal direction (e.g., front-back direction X) to contact the substrate W. For example, the shelf of the supporting portion 25 may have the same shape as that of the shelf 32 of the substrate platform 27.

In the embodiment described above, the number of inversion units 24 included in the substrate treating apparatus 1 is two. However, the present invention is not limited to this. The number of inversion units 24 included in the substrate treating apparatus 1 may be one. The number of inversion units 24 included in the substrate treating apparatus 1 may be three or more.

In the operational example in FIG. 9, the number of treating units 28 to which the substrates W each are transported is, for example, one. However, the present invention is not limited to this. The number of treating units 28 to which the substrates W each are transported may be two or more. For example, the substrates W may be transported to two or more treating units 28 in Step S9. For example, the substrates W may be transported to two or more treating units 28 after the substrates W are unloaded from the inversion units 24a and before the substrates W are loaded to the inversion units 24b. For example, the substrates W may be transported to two or more treating units 28 after the Step S14 and before the Step 15. For example, the substrates W may be transported to one or more treating units 28 after the substrates W are unloaded from the inversion units 24b and before the substrates W are loaded to the substrate platform 27b.

In the embodiment described above, the substrate holder 36 of the treating unit 28 may be a Bernoulli chuck, or a Bernoulli gripper, for example. The substrate holder 36 may hold the substrate W by sucking the substrate W, for example. For example, the substrate holder 36 may have a suction portion, not shown. Here, the suction portion of the substrate holder 36 may have a configuration substantially equal to the first suction portion 42 or the second suction portion 72 described above. The suction portion of the substrate holder 36 may be located below the substrate W supported by the substrate holder 36. The suction portion of the substrate holder 36 may cause gas to flow over the back face WB of the substrate W supported by the substrate holder 36 and may suck the substrate W downward.

Alternatively, the substrate holder 36 may be a mechanical chuck or a mechanical gripper. For example, the substrate holder 36 may have an edge contacting portion, not shown. Here, the edge contacting portion of the substrate holder 36 may contact the edge of the substrate W. When the substrate holder 36 and the substrate W rotate, the edge contact portion of the substrate holder 36 may hold the substrate W in such a manner that the substrate W does not slip with respect to the edge contact portion.

The embodiment and the modifications described above may be variable appropriately by replacing or combining the unit of the present embodiments with other thereof.

REFERENCE SIGNS LIST

1 . . . substrate treating apparatus
23 . . . transport mechanism
24, 24a, 24b . . . inversion unit
25, 25a, 25b . . . supporting portion
26, 26a, 26b . . . reversing mechanism
29 . . . controller
41 . . . hand
42 . . . first suction portion
45 . . . hand driving unit (transport driving unit)
54 . . . receiver
65 . . . position adjusting unit
65a . . . slope face
67 . . . lifting drive unit
69 . . . substrate detector
71 . . . hand
72 . . . second suction portion
72A . . . third suction portion
72B . . . fourth suction portion
74 . . . suction holder
74A . . . first branch
74B . . . second branch
81 . . . hand driving unit
82 . . . rotation driving unit
83 . . . rotation base
84 . . . movement driving unit
A, Aa, Ab . . . rotation axis
J . . . center of substrate
K . . . central axis
P1 . . . first position
P2 . . . second position
P3 . . . third position
PH . . . first support position
PL . . . second support position
W . . . substrate
W1 . . . first face
W2 . . . second face
WT . . . top face
WB . . . back face
WP1 . . . substrate sucked by second suction portion at first position
WP2 . . . substrate sucked by second suction portion at second position
WPH . . . substrate supported by supporting portion at first support position
WPL . . . substrate supported by supporting portion at second support position
X . . . front-back direction
Y . . . transverse direction
Z . . . vertical direction

The invention claimed is:

1. A substrate treating apparatus, comprising:
a supporting portion configured to contact a substrate to support the substrate in a horizontal posture;
a transport mechanism configured to transport the substrate to the supporting portion; and
a reversing mechanism configured to receive the substrate from the supporting portion, to reverse the substrate, and to deliver the substrate to the supporting portion,
the transport mechanism including:
a first suction portion configured to suck the substrate without contacting the substrate; and
a transport driving unit including a first hand configured to engage and move the first suction portion,
the reversing mechanism including:
a second hand including a second suction portion configured to suck the substrate without contacting the substrate; and
a hand driving unit including a rotation driving unit configured to rotate the second hand with the second suction portion around a horizontal rotation axis, wherein
when the transport mechanism transports a substrate to the supporting portion, the first suction portion is located above the substrate and sucks the substrate upward while causing gas to flow along a top face of the substrate and the transport driving unit moves the first suction portion to the supporting portion,
when the reversing mechanism receives the substrate from the supporting portion, the second suction portion is located above the substrate supported by the supporting portion and sucks the substrate upward while causing gas to flow along a top face of the substrate;
the rotation driving unit moves the second suction portion between a first position where the second suction portion blows gas downward and a second position where the second suction portion blows gas upward by rotating the second suction portion around the rotation axis; and
the second suction portion is located more radially inward of the substrate, supported by the supporting portion, than the supporting portion in plan view when the second suction portion is located at the second position.

2. The substrate treating apparatus according to claim 1, wherein
the supporting portion includes a position adjusting unit configured to adjust a position of the substrate in a horizontal direction.

3. The substrate treating apparatus according to claim 2, wherein
the position adjusting unit has a slope face that is inclined downward and radially inward of the substrate supported by the supporting portion and contacts the edge of the substrate.

4. The substrate treating apparatus according to claim 1, wherein
the rotation axis is located at a position lower than the second suction portion at the first position, and
the second suction portion at the first position is located higher than the second suction portion at the second position.

5. A substrate treating apparatus, comprising:
a supporting portion configured to contact a substrate to support the substrate in a horizontal posture;
a transport mechanism configured to transport the substrate to the supporting portion; and a reversing mechanism configured to receive the substrate from the supporting portion, to reverse the substrate, and to deliver the substrate to the supporting portion,
the transport mechanism including:
a first suction portion configured to suck the substrate without contacting the substrate; and
a transport driving unit including a first hand configured to engage and move the first suction portion,
the reversing mechanism including:
a second hand including a second suction portion configured to suck the substrate without contacting the substrate; and
a hand driving unit including a rotation driving unit configured to rotate the second hand with the second suction portion around a horizontal rotation axis, wherein
when the transport mechanism transports a substrate to the supporting portion, the first suction portion is located above the substrate and sucks the substrate upward while causing gas to flow along a top face of the substrate and the transport driving unit moves the first suction portion to the supporting portion,
when the reversing mechanism receives the substrate from the supporting portion, the second suction portion is located above the substrate supported by the supporting portion and sucks the substrate upward while causing gas to flow along a top face of the substrate;
the rotation driving unit moves the second suction portion between a first position where the second suction portion blows gas downward and a second position where the second suction portion blows gas upward by rotating the second suction portion around the rotation axis;
the reversing mechanism includes:
a movement driving unit configured to move the second suction portion from the first position to a third position where no interference is made with the transport mechanism, and
the second suction portion is located at the third position when the transport mechanism delivers the substrate to the supporting portion; and
the second suction portion is positioned more radially outward of the substrate, supported by the supporting portion, than the supporting portion in plan view when the second suction portion is located at the third position.

6. A substrate treating apparatus, comprising:
a supporting portion configured to contact a substrate to support the substrate in a horizontal posture;
a transport mechanism configured to transport the substrate to the supporting portion; and
a reversing mechanism configured to receive the substrate from the supporting portion, to reverse the substrate, and to deliver the substrate to the supporting portion,
the transport mechanism including:
a first suction portion configured to suck the substrate without contacting the substrate; and
a transport driving unit including a first hand configured to engage and move the first suction portion,
the reversing mechanism including:
a second hand including a second suction portion configured to suck the substrate without contacting the substrate; and
a hand driving unit including a rotation driving unit configured to rotate the second hand with the second suction portion around a horizontal rotation axis, wherein
when the transport mechanism transports a substrate to the supporting portion, the first suction portion is located above the substrate and sucks the substrate upward while causing gas to flow along a top face of the substrate and the transport driving unit moves the first suction portion to the supporting portion,
when the reversing mechanism receives the substrate from the supporting portion, the second suction portion is located above the substrate supported by the supporting portion and sucks the substrate upward while causing gas to flow along a top face of the substrate;
the rotation driving unit moves the second suction portion between a first position where the second suction portion blows gas downward and a second position where the second suction portion blows gas upward by rotating the second suction portion around the rotation axis;
the reversing mechanism includes:
a movement driving unit configured to move the second suction portion from the first position to a third position where no interference is made with the transport mechanism, and
the second suction portion is located at the third position when the transport mechanism delivers the substrate to the supporting portion;
the reversing mechanism includes:
a first branch connected to the movement driving unit; and
a second branch connected to the movement driving unit,
the second suction portion includes:
a third suction portion held by the first branch; and
a fourth suction portion held by the second branch,
the movement driving unit widens and narrows a gap between the first branch and the second branch, and
the movement driving unit moves the second suction portion from the first position to the third position by widening the gap between the first branch and the second branch.

7. The substrate treating apparatus according to claim 6, wherein
the rotation axis is located so as to pass between the first branch and the second branch in plan view when the second suction portion is located at the first position,
the first branch and the second branch are each moved away from the rotation axis in plan view when the second suction portion is moved from the first position to the third position, and
the first branch and the second branch each approach the rotation axis in plan view when the second suction portion is moved from the third position to the first position.

8. A substrate treating apparatus, comprising:
a supporting portion configured to contact a substrate to support the substrate in a horizontal posture;
a transport mechanism configured to transport the substrate to the supporting portion; and
a reversing mechanism configured to receive the substrate from the supporting portion, to reverse the substrate, and to deliver the substrate to the supporting portion,
the transport mechanism including:
a first suction portion configured to suck the substrate without contacting the substrate; and
a transport driving unit including a first hand configured to engage and move the first suction portion,
the reversing mechanism including:
a second hand including a second suction portion configured to suck the substrate without contacting the substrate; and a hand driving until including a rotation driving unit configured to rotate the second hand with the second suction portion around a horizontal rotation axis, wherein when the transport mechanism transports a substrate to the supporting portion, the first suction portion is located above the substrate and sucks the substrate upward while causing gas to flow along a top face of the substrate and the transport driving unit moves the first suction portion to the supporting portion, when the reversing mechanism receives the substrate from the supporting portion, the second suction portion is located above the substrate supported by the supporting portion and sucks the substrate upward while causing gas to flow along a top face of the substrate;

when the reversing mechanism reverses the substrate, the second suction portion is moved from a position above the substrate to a position below the substrate, when the reversing mechanism delivers the substrate to the supporting portion, the second suction portion is positioned below the substrate and does not suck the substrate, and the second suction portion is at rest from when the reversing mechanism delivers the substrate to the supporting portion until when the supporting portion delivers the substrate to the transport mechanism.

9. A substrate treating apparatus, comprising:

a supporting portion configured to contact a substrate to support the substrate in a horizontal posture;

a transport mechanism configured to transport the substrate to the supporting portion; and a reversing mechanism configured to receive the substrate from the supporting portion, to reverse the substrate, and to deliver the substrate to the supporting portion, the transport mechanism including:

a first suction portion configured to suck the substrate without contacting the substrate; and a transport driving unit including a first hand configured to engage and move the first suction portion, the reversing mechanism including:

a second hand including a second suction portion configured to suck the substrate without contacting the substrate; and a hand driving unit including a rotation driving unit configured to rotate the second hand with the second suction portion around a horizontal rotation axis, wherein when the transport mechanism transports a substrate to the supporting portion, the first suction portion is located above the substrate and sucks the substrate upward while causing gas to flow along a top face of the substrate and the transport driving unit moves the first suction portion to the supporting portion, when the reversing mechanism receives the substrate from the supporting portion, the second suction portion is located above the substrate supported by the supporting portion and sucks the substrate upward while causing gas to flow along a top face of the substrate;

the rotation driving unit moves the second suction portion between a first position where the second suction portion blows gas downward and a second position where the second suction portion blows gas upward by rotating the second suction portion around the rotation axis;

the second suction portion is located at the second position and does not suck the substrate when the reversing mechanism delivers the substrate to the supporting portion, and the second suction portion is kept at the second position from when the reversing mechanism delivers the substrate to the supporting portion until when the supporting portion delivers the substrate to the transport mechanism.

\* \* \* \* \*